(12) United States Patent
Echigo et al.

(10) Patent No.: US 7,871,751 B2
(45) Date of Patent: Jan. 18, 2011

(54) RESIST COMPOSITION

(75) Inventors: Masatoshi Echigo, Kanagawa (JP); Dai Oguro, Kanagawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 803 days.

(21) Appl. No.: 11/578,587

(22) PCT Filed: Apr. 14, 2005

(86) PCT No.: PCT/JP2005/007226

§ 371 (c)(1),
(2), (4) Date: Sep. 6, 2007

(87) PCT Pub. No.: WO2005/101127

PCT Pub. Date: Oct. 27, 2005

(65) Prior Publication Data

US 2008/0153031 A1     Jun. 26, 2008

(30) Foreign Application Priority Data

Apr. 15, 2004 (JP) ............................. 2004-120542

(51) Int. Cl.
*G03F 7/038* (2006.01)
(52) U.S. Cl. .................................... 430/270.1; 430/325
(58) Field of Classification Search .................. None
See application file for complete search history.

(56) References Cited

U.S. PATENT DOCUMENTS

| 5,529,885 | A | 6/1996 | Ochiai et al. |
| 6,045,968 | A | 4/2000 | Ushirogouchi et al. |
| 2004/0191672 | A1 | 9/2004 | Oguro et al. |
| 2007/0059632 | A1* | 3/2007 | Oguro et al. ............ 430/270.1 |

FOREIGN PATENT DOCUMENTS

| EP | 0 497 342 | 8/1992 |
| JP | 09-230593 | 9/1997 |
| JP | 2005-075767 | 3/2005 |
| JP | 2005-089387 | 4/2005 |

OTHER PUBLICATIONS

Supplementary European Search Report dated Jan. 28, 2009, for Application No. EP 05 73 0470.
International Search Report, mailed Jul. 26, 2005, for Application No. PCT/JP2005/007226.

* cited by examiner

*Primary Examiner*—Sin J. Lee
(74) *Attorney, Agent, or Firm*—Antonelli, Terry, Stout & Kraus, LLP.

(57) ABSTRACT

A radiation-sensitive composition containing a resist compound A, an acid generator B, and an acid crosslinking agent C. The resist compound A is (a) a polyphenol compound which is produced by the condensation of a $C_{5\text{-}45}$ aromatic ketone or aromatic aldehyde with a $C_{6\text{-}15}$ compound having from 1 to 3 phenolic hydroxyl groups, and, (b) its molecular weight is form 300 to 5000. The radiation-sensitive composition is solvent-soluble and exhibits a high sensitivity, high resolution, and high heat resistance.

34 Claims, No Drawings

RESIST COMPOSITION

TECHNICAL FIELD

The present invention relates to a radiation-sensitive resist composition useful as an acid-amplified, non-polymeric resist material, which comprises a compound having a specific chemical structure, an acid generator and an acid crosslinking agent. The resist composition of the present invention is used as a radiation-sensitive material that is sensitive to various radiations such as ultraviolet rays, far ultraviolet rays, electron beams, extreme ultraviolet rays (EUV) and X-rays for forming masks, etc. in the production of electronics parts such as LSI and VLSI.

BACKGROUND ART

Conventionally known resist materials are generally polymeric materials capable of forming amorphous thin film. For example, a solution of poly(methyl methacrylate) is applied on a substrate to form a thin resist film, which is then irradiated with ultraviolet rays, far ultraviolet rays, electron beams, extreme ultraviolet rays (EUV), X-rays, etc., to form line patterns having a width of about 0.1 μm.

The polymeric resist compounds generally have a molecular weight as large as about 10,000 to 100,000 and a broad molecular weight distribution. Therefore, in a lithographic fine process using the polymeric resist compounds, the surface of the fine patterns is roughened, thereby making it difficult to control the dimension of patterns and reducing the product yield. Thus, the conventional lithographic techniques using the known polymeric resist materials have limitations in fine processing. To produce finer patterns, there have been proposed various low-molecular resist materials.

Known non-polymeric resist materials include, for example, (1) positive- or negative-type resists derived from fullerene, (2) positive- or negative-type resists derived from calixarene, (3) positive-type resists derived from starburst-type compounds, (4) positive-type resists derived from dendrimer, (5) positive-type resists derived from dendrimers/calixarene, (6) positive-type resists derived from highly branched starburst-type compound, (7) positive-type resists derived from ester linkage-containing starburst-type compound mainly constituted by a trimesic acid structure, (8) negative-type resists derived from cyclic polyphenol compound, and (9) negative-type resists derived from polyphenol compound.

The resist materials (1) are good in the etching resistance but not practical in the coating properties and sensitivity (Patent Documents 1 to 5). The resist materials (2) are excellent in the etching resistance, but fail to form satisfactory patterns because of a poor solubility in a developing solution (Patent Documents 6 to 8). The resist materials (3) have a low heat resistance and therefore tend to cause the distortion of patterned images during the heat treatment after exposure to light (Patent Documents 9 to 11). The resist materials (4) are less practicable because a complicated production process is required and the distortion of patterned images due to their low heat resistance occurs during the heat treatment after exposure to light (Non-Patent Document 1). The resist materials (5) are less practicable because a complicated production process is required and the raw materials are expensive (Patent Documents 12 and 13). The resist materials (6) are less practicable because a complicated production process is required and the raw materials are expensive. The resist materials (7) are less practicable because the distortion of patterned images due to their low heat resistance is likely to occur during the heat treatment after exposure to light and the adhesion to substrates is poor (Patent Document 14). The resist materials (8) and (9) are insufficient in the amorphous properties and etching resistance, and therefore, the improvement is still demanded (Patent Documents 15 to 17).

[Patent Document 1] JP 7-134413A
[Patent Document 2] JP 9-211862A
[Patent Document 3] JP 10-282649A
[Patent Document 4] JP 11-143074A
[Patent Document 5] JP 11-258796A
[Patent Document 6] JP 11-72916A
[Patent Document 7] JP 11-322656A
[Patent Document 8] JP 9-236919A
[Patent Document 9] JP 2000-305270A
[Patent Document 10] JP 2002-99088A
[Patent Document 11] JP 2002-99089A
[Patent Document 12] JP 2002-49152A
[Patent Document 13] JP 2003-183227A
[Patent Document 14] JP 2002-328466A
[Patent Document 15] JP 11-163863A
[Patent Document 16] JP 2003-207893A
[Patent Document 17] JP 2004-334106A
[Non-Patent Document 1] "Proceedings of SPIE", vol. 3999 (2000), pp. 1202-1206

DISCLOSURE OF THE INVENTION

An object of the present invention is to provide a radiation-sensitive composition that is sensitive not only to ultraviolet rays such as i-rays and g-rays but also to radiation such as visible lights, excimer lasers from KrF, etc., electron beams, extreme ultraviolet rays (EUV), X-rays and ion beams. Another object of the present invention is to provide a simple method of producing a non-polymeric, radiation-sensitive resist composition that exhibits a high sensitivity, a high resolution, a high heat resistance and a good solubility in solvent.

As the result of extensive study, the inventors have found that the above objects are effectively achieved by a composition containing a compound having a chemical structure satisfying specific requirements, an acid generator capable of directly or indirectly generating an acid by the irradiation with a radiation, and an acid crosslinking agent forming a crosslink by the action of an acid.

Thus, the present invention relates to a radiation-sensitive composition containing a resist compound A, an acid generator B, and an acid crosslinking agent C, wherein:

the resist compound A is a polyphenol compound produced by the condensation of a $C_{5-45}$ aromatic ketone or $C_{5-45}$ aromatic aldehyde with a $C_{6-15}$ compound having from 1 to 3 phenolic hydroxyl groups, and has a molecular weight of from 300 to 5000; and the acid generator B directly or indirectly generates an acid upon the irradiation with a radiation selected from the group consisting of visible lights, ultraviolet rays, excimer lasers, electron beams, extreme ultraviolet rays (EUV), X-rays and ion beams.

The present invention will be described below in detail.

The radiation-sensitive composition of the present invention contains a resist compound A, an acid generator B, and an acid crosslinking agent C. The resist compound A satisfies the following requirements a and b simultaneously.

Requirement a: the resist compound A is a polyphenol compound which is produced by the condensation of a $C_{5-4}$ aromatic ketone or $C_{5-45}$ aromatic aldehyde (hereinafter referred to as "aromatic carbonyl compound A1") with a $C_{6-15}$ compound having from 1 to 3 phenolic hydroxyl groups (herein after referred to as "phenolic compound A2").

The polyphenol compound has in its molecule a tertiary or quaternary carbon atom to which two phenol compounds and one or more aromatic rings are bonded. With such chemical structure, the resist composition has a long-lasting, stable amorphous nature and is excellent in the film-forming properties, light transmission properties, solvent solubility, and etching resistance which are required for the resist materials for forming patterns.

Requirement b: the molecular weight of the resist compound A is from 300 to 5000.

The molecular weight is from 300 to 5000, preferably from 300 to 2000, more preferably from 300 to 1000, and particularly preferably from 300 to 699. Within the above range, the resist composition has good film-forming properties and an improved resolution and alkali developability.

The resist compound A satisfying the requirements a and b preferably has a conjugated structure which is formed by at least two benzene rings and/or a nonbonding electron pair of hetero atom.

With such conjugated structure, the resist compound A can improve the film-forming properties, enhance the etching resistance, reduce the outgas amount upon the irradiation with radiations, and increase the sensitivity by its sensitizing effect. The sensitizing effect is attributable to a partial absorption of the energy of radiations such as electron beams and extreme ultraviolet rays (EUV) by the conjugated structure and an efficient transfer of the absorbed energy to an acid generator.

Examples of the conjugated structures include biphenyl structure, naphthalene structure, fluorene structure, phenylfluorene structure, diphenylfluorene structure, anthracene structure, phenanthrene structure, pyrene structure, benzopyrene structure, acenaphthene structure, acenaphthylene structure, 1-ketoacenaphthene structure, 9-keto-9,10-dihydrophenanthrene structure, benzophenone structure, xanthene structure, thioxanthene structure, flavone structure, isoflavone structure, indane structure, indene structure, indacene structure, phenalene structure, biphenylene structure, coronene structure, chrysene structure, trinaphthylene structure, hexaphene structure, hexacene structure, rubicene structure, fluoranthene structure, acephenanthrylene structure, perylene structure, picene structure, pentaphene structure, heptaphene structure, heptacene structure, pyranthrene structure, phenacene structure, naphthacene structure, pentacene structure, aceanthrene structure, acephenanthrene structure, azulene structure, triphenylene structure, p-terphenyl structure, m-terphenyl structure, 1,3,5-triphenylbenzene structure, 1,2,3-triphenylbenzene structure, 1,2,4-triphenylbenzene structure, phenylnaphthalene structure, binaphthalene structure, and ovalene structure, with at least one structure selected from the group consisting of biphenyl structure, naphthalene structure, fluorene structure, phenylfluorene structure, diphenylfluorene structure, pyrene structure, acenaphthene structure, 1-ketoacenaphthene structure, benzophenone structure, xanthene structure, and thioxanthene structure, p-terphenyl structure, and m-terphenyl structure being particularly preferred, because they can be introduced into the resist compound A using starting compounds of relatively low costs.

In view of easiness of production, the resist compound A is preferably a polyphenol compound produced by the condensation of an aromatic carbonyl compound A1 which has a conjugated structure with a phenolic compound A2 which has no conjugated structure.

The conjugated structure formed by at least two benzene rings and/or a nonbonding electron pair of hetero atom is more preferably a fused ring. With such fused-ring conjugated structure, the resist compound A can more efficiently improve the film-forming properties, enhance the etching resistance, reduce the outgas amount upon the irradiation with radiations, and increase the sensitivity by its sensitizing effect.

The resist compound A preferably satisfies F<3.0, more preferably F<2.5, still more preferably F<2.3, and particularly preferably 1.8<F<2.2, wherein F is (total number of atoms)/(total number of carbon atoms−total number of oxygen atoms). By satisfying such requirement, the resist composition has a high dry-etching resistance.

The resist compound A dissolves in a solvent, which shows the highest dissolving power to the resist compound A, at 23° C. in a concentration of preferably 1% by weight or more, more preferably 3% by weight or more, still more preferably 5% by weight or more, and particularly preferably 10% by weight or more. Such solvent is selected from propylene glycol monomethyl ether acetate, propylene glycol monomethyl ether, 2-heptanone, anisole, butyl acetate, ethyl propionate, and ethyl lactate. By satisfying the above requirement, a safety solvent can be used in the production process of semiconductors.

The resist compound A is produced by the acid-catalyzed condensation of the aromatic carbonyl compound A1 with the phenolic compound A2. The acid-catalyzed condensation is carried out in a known manner. For example, the aromatic carbonyl compound A1 and the phenolic compound A2 are allowed to react in the presence of thioacetic acid or β-mercaptopropionic acid, and in the further presence of an acid catalyst such as hydrochloric acid and sulfuric acid (JP 2001-206862A). The condensation proceeds advantageously, for example, by maintaining a mixture of 16 mol of the phenolic compound A2 per one mole of the aromatic carbonyl compound A1 at 70 to 120° C. for 20 min to 20 h in the presence of a proper amount of thioacetic acid or β-mercaptopropionic acid, and in the further presence of the acid catalyst.

Examples of the aromatic carbonyl compound A1 include aromatic ketones such as acetophenone, benzophenone, α-acetonaphthone, β-acetonaphthone, 9-fluorenone, 3-phenyl-9-fluorenone, 1,3-diphenyl-9-fluorenone, acenaphthenone, naphthoquinone, anthraquinone, acenaphthenequinone, phenanthrenequinone, benzoylbiphenyl, benzoylnaphthalene, acylbiphenyl, acylanthracene, acylphenanthrene, acylpyrene, acylbenzopyrene, acylacenaphthylene, acylnaphthacene, acylpentacene, acyltriphenylene, acylfuran, acylpyrrole, acylovalene, indanone, tetralone, acridone, flavone, isoflavone, diacetylbenzene, diacetylnaphthalene, diacetylbiphenyl, dibenzoylbenzene, dibenzoylnaphthalene, dibenzoylbiphenyl, difluorenone, dibenzoylbiphenyl, diacylbiphenyl, diacylanthracene, diacylphenanthrene, diacylpyrene, diacylbenzopyrene, diacylacenaphthylene, diacylnaphthacene, diacylpentacene, diacyltriphenylene, diacylfuran, diacylpyrrole, diacylovalene, and flavanone; and aromatic aldehydes such as benzaldehyde, tolylaldehyde, anisaldehyde, 1-naphthoaldehyde, 2-naphthoaldehyde, anthraaldehyde, biphenylaldehyde, formymluorene, formylphenanthrene, formylpyrene, formylbenzopyrene, formylacenaphthylene, formylnaphthacene, formylpentacene, formyltriphenylene, formylovalene, diformylbenzene, diformylbiphenyl, diformylnaphthalene, diformylterphenyl, diformyltriphenylene, tolyldialdehyde, anisdialdehyde, anthradialdehyde, diformyflluorene, diformylphenanthrene, diformylpyrene, diformylbenzopyrene, diformylacenaphthylene, diformylnaphthacene, diformylpentacene, and diformylovalene. Of the above aromatic ketones, preferred are α-acetonaphthone, β-acetonaphthone, 9-fluorenone, acetylanthracene, acetylpyrene, acenaphthenone, acenaphthenequinone, anthraquinone, 1-naphthoaldehyde, and 4-biphenylaldehyde, because of their easy availability, low costs, relatively high reactivity and easiness of production. Of the above aromatic aldehydes, preferred are formylbiphenyl, formylphenanthrene, formylpyrene, formyltriphenylene, 3-phenyl-9-fluorenone, 1,3-diphenyl-9-fluorenone, phenanthrenequinone, difluorenone, diformylbiphenyl, diformylnaphthalene, and diformylterphenyl, because good sensitivity and resolution are obtained.

Examples of the phenolic compound A2 include phenol, $C_{1-6}$ alkylphenol (for example, cresols such as o-cresol, m-cresol and p-cresol), dialkylphenol (for example, 2,3-dimethylphenol, 2,5-dimethylphenol, 2,6-dimethylphenol, and 2,6-di-tert-butylphenol), trialkylphenol, alkoxyphenol (for example, anisoles such as o-methoxyphenol), arylphenol (for example, phenylphenols such as o-phenylphenol and m-phenylphenol), cycloalkylphenol (for example, 2-cyclohexylphenol), halophenols (for example, chlorophenol, dichlorophenol, chlorocresol, bromophenol, and dibromophenol), and polyhydric phenols (for example, catechol, alkylcatechol, chlorocatechol, resorcinol, alkylresorcinol, hydroquinone, alkylhydroquinone, chlororesorcinol, chlorohydroquinone, pyrogallol, allylpyrogallol, phloroglucinol, 1,2,4-trihydroxyphenol, and preceding compound having substituted their OH groups for SH groups). These compounds may be used alone or in combination of two or more. The purity thereof is, but not limited to, generally 95% by weight or more and preferably 99% by weight or more.

Of the above phenolic compound A2, preferred are phenol, $C_{1-6}$ alkylphenol, preferably 2-$C_{1-6}$ alkylphenol (such as o-cresol), arylphenol (such as o-phenylphenol), cycloalkylphenol (such as 2-cycloalkylphenol), catechol, resorcinol, and pyrogallol because of their easy availability. The phenolic compound A2 having a bulky group and/or an electron-donating group at the o-position of the phenolic hydroxyl group reduces the crystallinity of the resist compound A to improve the film-forming properties. Examples of the bulky group and/or electron-donating group include methyl, tert-butyl, cyclohexyl, phenyl, methoxy, isopropoxy, and phenoxy.

The resist compound A is a so-called geminal bisphenol, i.e., a compound having at least one geminally substituted carbon atom on which two phenol compounds are bonded. The geminally substituted carbon atom corresponds to the carbonyl carbon of the aromatic carbonyl compound A1. When the aromatic carbonyl compound A1 has two or more carbonyl groups, the resulting resist compound A has two or more geminally substituted carbon atoms.

Preferably, the resist compound A is represented by the following formula 1:

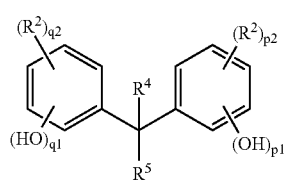

(1)

wherein:

$R^2$ groups may be the same or different and are each independently a group selected from the group consisting of halogen atom, alkyl group, cycloalkyl group, aryl group, aralkyl group, alkoxy group, alkyenyl group, acyl group, alkoxycarbonyloxy group, alkylcarbonyloxy group, arylcarbonyloxy group, cyano group and nitro group;

$R^4$ is a hydrogen atom or $C_{1-6}$ alkyl group, $R^5$ is a $C_{10-18}$ monovalent group having a biphenyl structure, terphenyl structure, naphthalene structure, phenanthrene structure, or pyrene structure; or $R^4$ together with $R^5$ forms a $C_{10-18}$ bivalent group having a fluorene structure, phenylfluorene structure, diphenylfluorene structure, acenaphthene structure, 1-ketoacenaphthene structure, 9-keto-9,10-dihydrophenanthrene structure, or benzophenone structure; and each of p1 and q1 is an integer of from 0 to 3, and each of p2 and q2 is an integer of from 0 to 4, satisfying $1 \leq p1+p2 \leq 5$, $1 \leq q1+q2 \leq 5$, and $1 \leq p1+q1 \leq 6$.

In the group $R^2$, the halogen atom includes chlorine atom, bromine atom and iodine atom; the alkyl group include $C_{1-4}$ alkyl groups such as methyl group, ethyl group, propyl group, n-propyl group, n-butyl group, isobutyl group, sec-butyl group, and tert-butyl group; the cycloalkyl group includes cyclohexyl group, norbornyl group, and adamantyl group; the aryl group includes phenyl group, tolyl group, xylyl group, and naphthyl group; the aralkyl group includes benzyl group; the alkoxy group includes $C_{1-4}$ alkoxy groups such as methoxy group, ethoxy group, hydroxyethoxy group, propoxy group, hydroxypropoxy group, isopropoxy group, n-butoxy group, isobutoxy group, sec-butoxy group, and tert-butoxy group; the alkyenyl group includes $C_{2-4}$ alkyenyl groups such as vinyl group, propenyl group, aryl group, and butenyl group; the acyl group includes $C_{1-5}$ aliphatic acyl groups such as formyl group, acetyl group, propionyl group, butyryl group, valeryl group, isovaleryl group, and pivaloyl group, and further includes aromatic acyl groups such as benzoyl group and toluoyl group; the alkoxycarbonyloxy group includes $C_{2-5}$ alkoxycarbonyloxy groups such as methoxycarbonyloxy group, ethoxycarbonyloxy group, propoxycarbonyloxy group, isopropoxycarbonyloxy group, n-butoxycarbonyloxy group, isobutoxycarbonyloxy group, sec-butoxycarbonyloxy group, and tert-butoxycarbonyloxy group; the alkylcarbonyloxy group includes acetoxy group, propionyloxy group, butyryloxy group, isobutyryloxy group, valeryloxy group, isovaleryloxy group, and pivaloyloxy group; and the arylcarbon yloxy group includes benzoyloxy group.

$R^2$ is preferably in the ortho position of the phenolic hydroxyl group. The ortho-positioned $R^2$ reduces the crystallinity of the resist compound to improve the film-forming properties. $R^2$ is preferably a bulky group and/or an electron-donating group. Examples of such group include alkyl groups such as methyl group, ethyl group, isopropyl group, and t-butyl group; cycloalkyl groups such as cyclohexyl group, norbornyl group, and adamantyl group; aryl groups such as phenyl group; aralkyl groups such as benzyl group; and alkoxy groups such as methoxy group, ethoxy group, isopropoxy group, and phenoxy group, with methyl group, ethyl group, isopropyl group, tert-butyl group, phenyl group, cyclohexyl group, norbornyl group, and adamantyl group being preferred and methyl group being more preferred.

In the formula 1, each of p1 and q1 is preferably 1, because the sensitivity and resolution are improved.

In the formula 1, two carbon atoms each being in opposition of respective two benzene rings with respect to —$CR^4R^5$— may be bonded to each other via an oxygen atom or a sulfur atom to from a xanthene structure or a thioxanthene structure represented by the following formula 2:

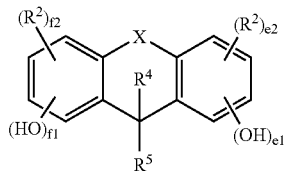

(2)

wherein:

R², R⁴ and R⁵ are the same as defined above;

each of e1 and f1 is an integer of from 0 to 2, and each of e2 and f2 is an integer of from 0 to 3, satisfying $1 \leq e1+e2 \leq 4$, $1 \leq f1+f2 \leq 4$, and $1 \leq e1+f1 \leq 2$;

X is an oxygen atom or a sulfur atom; and two or more R² groups may be the same or different.

With such structure, the sensitivity is improved in some cases.

In the formula 2, each of f1 and e1 is preferably 1, because the sensitivity and resolution are improved.

The xanthene structure or thioxanthene structure of the formula 2 can be introduced by using a compound having two or three phenolic hydroxyl groups or thiophenolic mercapto groups as the resist compound A2, preferably a polyfunctional (thio)phenol compound. Preferred polyfunctional (thio)phenol compounds are (thio)catechol, (thio)resorcinol, and (thio)pyrogallol because of their easy availability.

The compounds of the formula 2, although having a low molecular weight, are excellent in the film-forming properties, heat resistance and dry etching resistance, and small in outgas amount. Therefore, the resist compositions containing such compounds as the major resist component exhibit a high resolution, a high sensitivity and a small line-edge roughness.

In the formulas 1 and 2, R⁵ is preferably a group represented by the following formula:

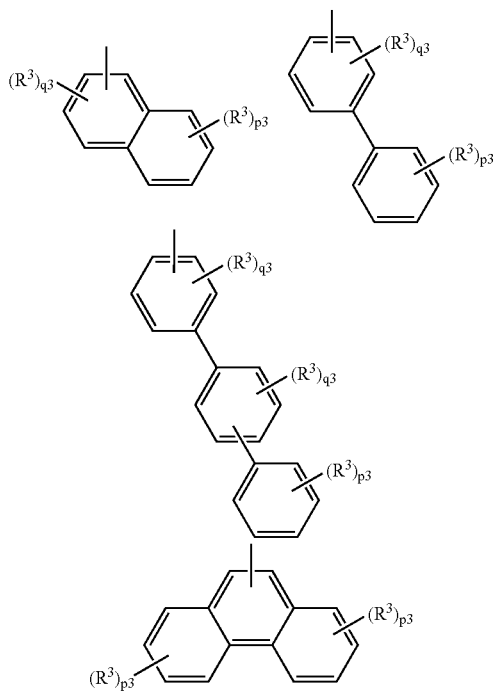

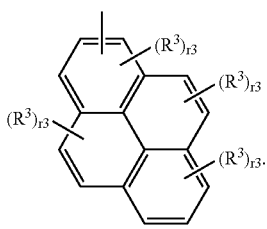

-continued

In the above formulas, R³ is a $C_{1-6}$ linear or branched alkyl group or a $C_{3-12}$ cycloalkyl group. The alkyl group may be methyl group, ethyl group, n-propyl group, isopropyl group, n-butyl group, isobutyl group, sec-butyl group, tert-butyl group, pentyl group, or hexyl group. The cycloalkyl group may be cyclohexyl group.

The subscript p3 is an integer of from 0 to 4, and q3 is an integer of from 0 to 3, satisfying $0 \leq p3+q3 \leq 7$. The subscript r3 is an integer of from 0 to 2. Two or more R³, p3, q3, or r3 may be the same or different.

R⁵ having the above structure can be introduced by using, for example, α-acetonaphthone, β-acetonaphthone, 1-naphthoaldehyde, 2-naphthoaldehyde, biphenylaldehyde, formylphenanthrene, or formylpyrene as the aromatic carbonyl compound A1.

In the formulas 1 and 2, the divalent group which is formed by R⁴ and R⁵ bonded to each other is preferably represented by the following formulas:

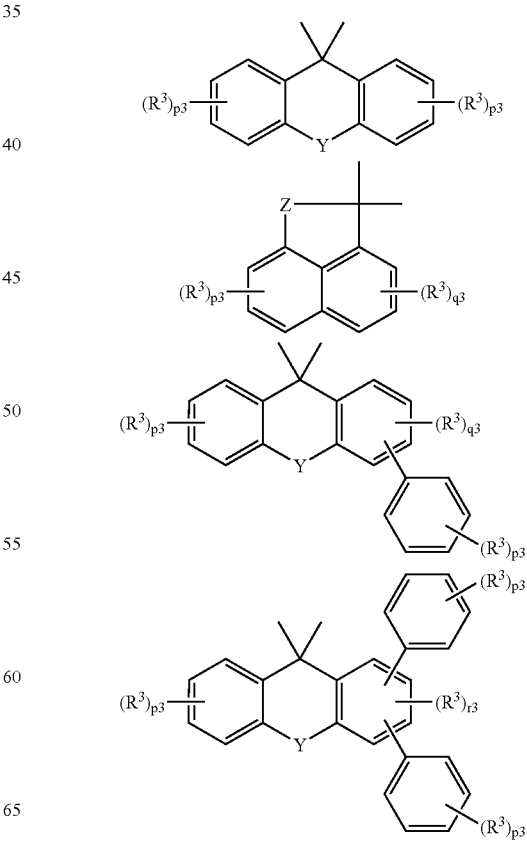

-continued

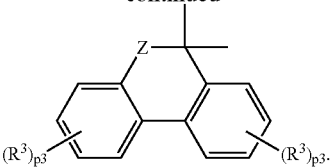

In the above formulas, $R^3$, p3, q3, and r3 are the same as defined above, Y is a single bond or carbonyl group, Z is a methylene group or carbonyl group. Two or more $R^3$, p3 or q3 may be the same or different.

The above divalent group can be introduced by using, for example, 9-fluorenone, 3-phenyl-9-fluorenone, 1,3-diphenyl-9-fluorenone, acenaphthenone, acenaphthenequinone or phenanthrenequinone as the aromatic carbonyl compound A1.

The resist compound A is preferably a compound represented by the following formula 3:

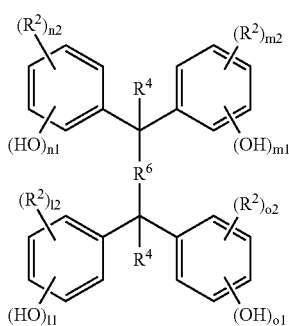

(3)

which is produced by using an aromatic diketone or aromatic dialdehyde as the aromatic carbonyl compound A1. The compound of the formula 3 is particularly preferred because the heat resistance, sensitivity and resolution are further improved.

In the formula 3, $R^2$ and $R^4$ are the same as defined above;

$R^6$ is a $C_{10-18}$ divalent group having a biphenyl structure, terphenyl structure, naphthalene structure, phenanthrene structure, or pyrene structure, or $R^6$ together with two $R^4$ groups forms a $C_{10-18}$ tetravalent group having a fluorene structure, phenylfluorene structure, diphenylfluorene structure, acenaphthene structure, 1-ketoacenaphthene structure, 9-keto-9,10-dihydrophenanthrene, or benzophenone structure;

each of m1, n1, o1, and l1 is an integer of from 0 to 3, and each of m2, n2, o2, and l2 is an integer of from 0 to 4, satisfying $1 \leq m1+m2 \leq 5$, $1 \leq n1+n2 \leq 5$, $1 \leq o1+o2 \leq 5$, $1 \leq l1+l2 \leq 5$, $1 \leq m1+n1+o1+l1 \leq 6$; and two or more $R^2$ may be the same or different.

In view of enhancing the sensitivity and resolution, each of l1, m1, n1, and o1 in the formula 3 is preferably 1.

Examples of the aromatic diketone and aromatic dialdehyde include difluorenone, diformylbiphenyl, diformylnaphthalene, diformylterphenyl, and diformyltriphenylene.

In the formula 3, two carbon atoms each being in o-position of respective two benzene rings with respect to —$CR^4R^5$— may be bonded to each other via an oxygen atom or a sulfur atom to from the xanthene structure or thioxanthene structure represented by the following formula 4:

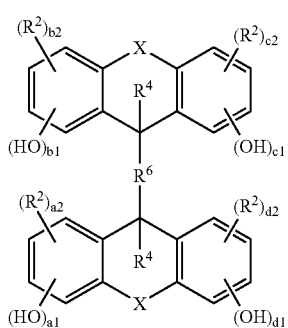

(4)

wherein, $R^2$, $R^4$, $R^6$, and X are the same as defined above;

each of a1, b1, c1, and d1 is an integer of from 0 to 2, and each of a2, b2, c2, and d2 is an integer of from 0 to 3, satisfying $1 \leq a1+a2 \leq 4$, $1 \leq b1+b2 \leq 4$, $1 \leq c1+c2 \leq 4$, $1 \leq d1+d2 \leq 4$, $1 \leq a1+b1+c1+d1 \leq 4$; and two or more $R^2$ or $R^4$ may be the same or different.

In the formula 4, each of a1, b1, c1, and d1 is preferably 1 in view of enhancing the sensitivity and resolution.

In the formulas 3 and 4, $R^6$ is preferably the divalent group represented by the following formulas:

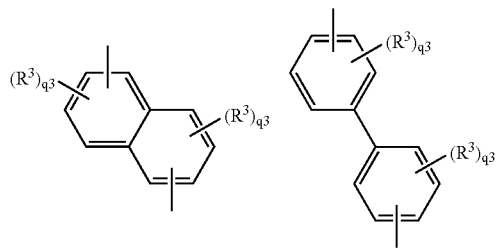

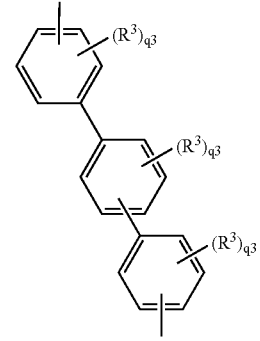

wherein $R^3$ and q3 are as defined above, and two or more $R^3$ or q3 may be the same or different.

$R^6$ can be introduced by using, for example, diformylbiphenyl, diformylnaphthalene, diformylterphenyl, or diformyltriphenylene as the aromatic carbonyl compound A1.

In the formulas 3 and 4, the tetravalent group which is formed by $R^6$ together with two $R^4$ is represented, for example, by the following formula:

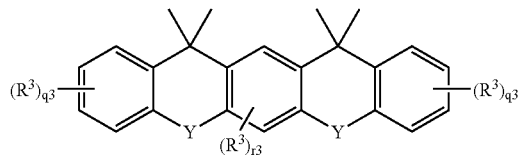

wherein $R^3$, Y, q3 and r3 are the same as defined above, and two or more $R^3$ or q3 may be the same or different.

The above structure can be introduced by using, for example, difluorenone as the aromatic carbonyl compound A1.

The resist compound A is preferably at least one compound which is selected from the group consisting of the compounds represented by the following formulas 5 to 33:

(5)

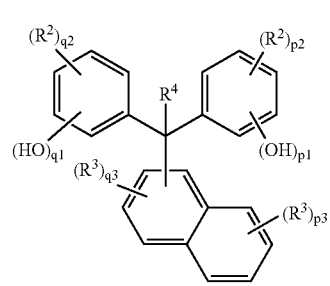

(6)

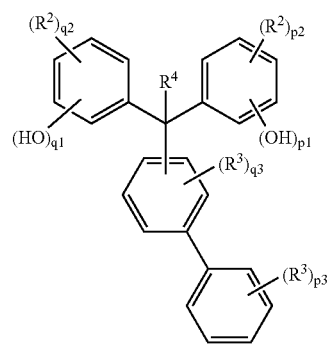

(7)

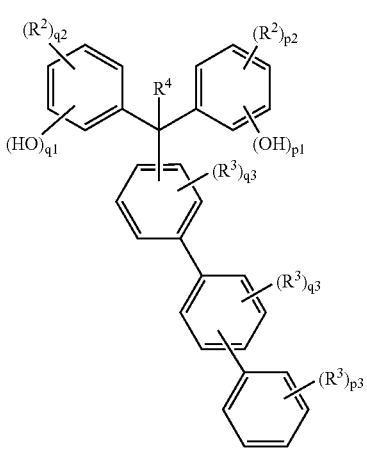

(8)

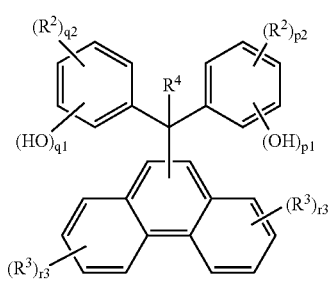

(9)

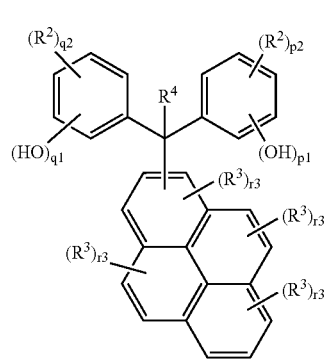

(10)

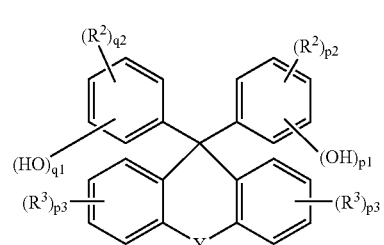

(11)

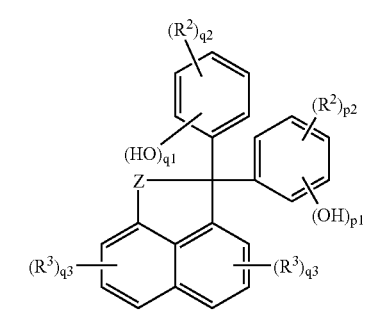

(12)

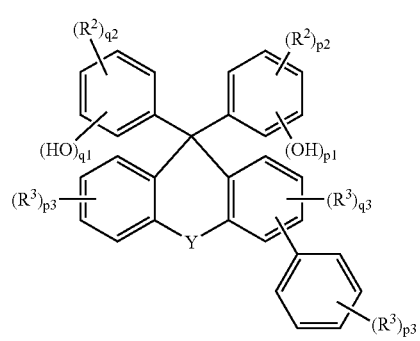

-continued (13)(14)(15)(16)(17)(18)(19)(20)(21)(22)

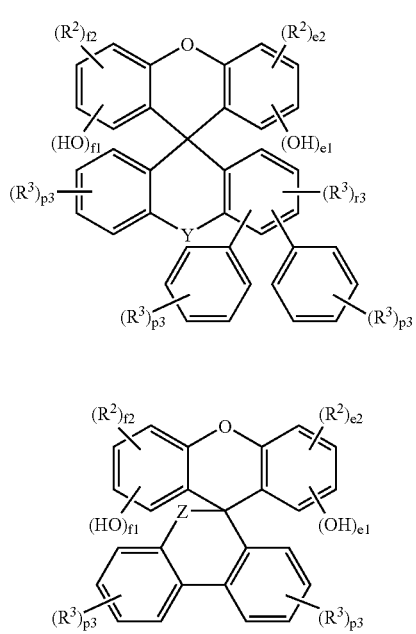
(23)
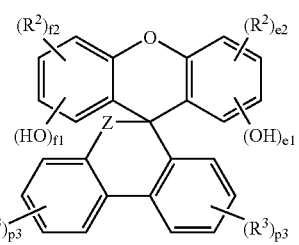
(24)
(25)
(26)
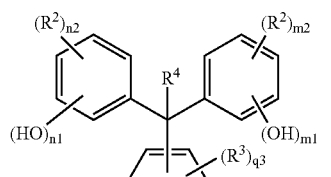
(27)
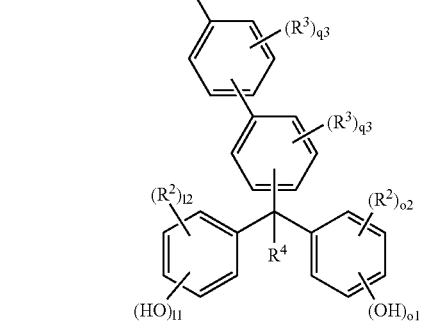
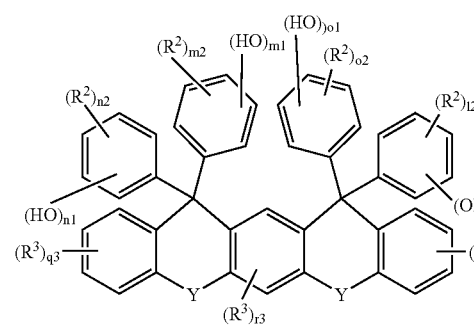
(28)
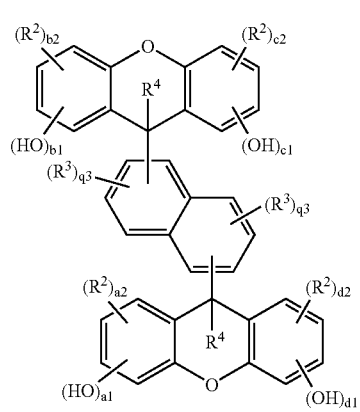
(30)

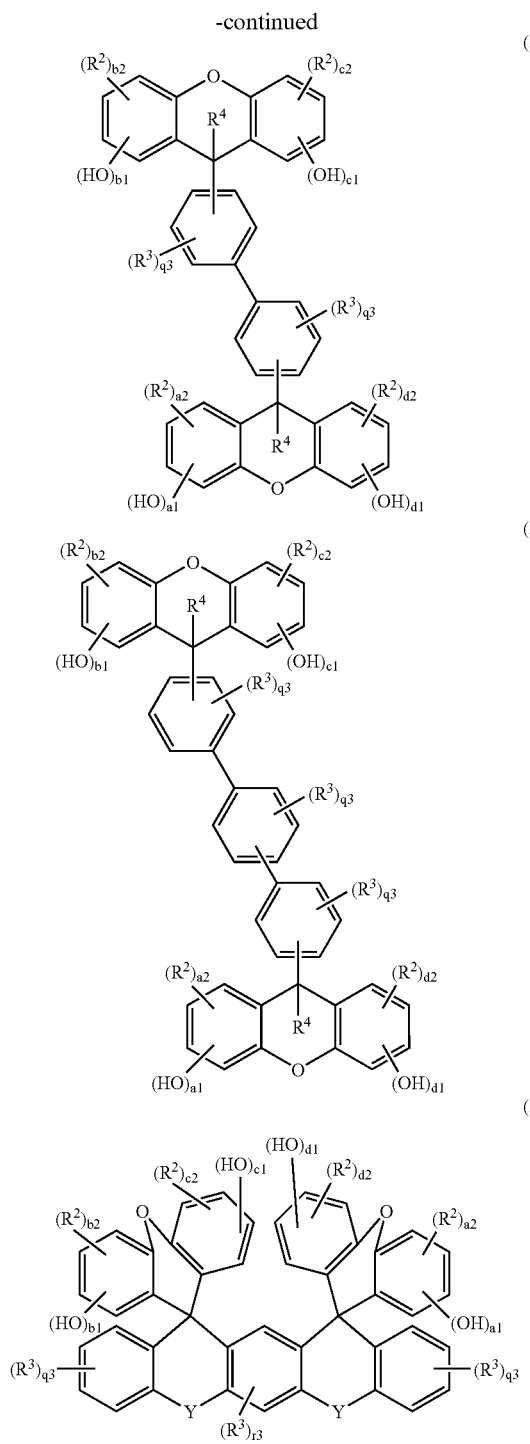

In the formulas 5 to 33, $R^2$ to $R^4$, X, Y, Z, p1 to p3, q1 to q3, p1+p2, q1+q2, p1+q1, e1 to e2, f1 to f2, e1+e2, f1+f2, e1+f1, p3, q3, p3+q3, m1, n1, o1, l1, m2, n2, o2, l2, m1+m2, n1+n2, o1+o2, l1+l2, m1+n1+o1+l1, a1, b1, c1, d1, a2, b2, c2, d2, a1+a2, b1+b2, c1+c2, d1+d2, a1+b1+c1+d1, and r3 are the same as defined above.

Of the resist compound A recited above, the compounds of formulas 5, 8, 9, 11, 12, 13, and 25 are particularly preferred. The fused ring in the compound improves the sensitivity and resolution.

The resist compound A may be introduced with a crosslinkable group which causes a crosslinking reaction upon the irradiation with visible lights, ultraviolet rays, excimer lasers, electron beams, extreme ultraviolet rays (EUV), X-rays, and ion beams or by the action of the reaction induced by such irradiation. Such introduction is effected, for example, by the reaction between the resist compound A with an agent for introducing the crosslinkable group in the presence of a basic catalyst. Examples of the crosslinkable group include carbon-carbon multiple bonds, epoxy groups, azide groups, halogenated phenyl groups, and chloromethyl group. Examples of the agent for introducing the crosslinkable group include acids, acid halides, acid anhydrides, carboxylic acid derivatives such as dicarbonate, and alkyl halides, each having the crosslinkable group. A resist composition containing the resist compound A having the crosslinkable group is also useful as the non-polymeric, radiation-sensitive composition which is solvent-soluble and has a high resolution and heat resistance.

The radiation-sensitive composition of the present invention contains at lease one resist compound A described above. If contains one resist compound, a high sensitivity and resolution are obtained, and the film-forming properties and adhesion to substrate are improved if two or more resist compounds are contained.

The radiation-sensitive composition is preferably composed of from 1 to 80% by weight of the solid component and from 20 to 99% by weight of the solvent, more preferably from 1 to 50% by weight of the solid component and from 50 to 99% by weight of the solvent; still more preferably from 2 to 40% by weight of the solid component and from 60 to 98% by weight of the solvent, and particularly preferably from 2 to 10% by weight of the solid component and from 90 to 98% by weight of the solvent. The amount of the resist compound A is preferably from 3 to 96.9% by weight, more preferably from 60 to 96.9% by weight, still more preferably from 65 to 96.9% by weight, and particularly preferably from 81 to 96.9% by weight, each based on the total weight of the solid component. Within the above range, the resolution is high and the line-edge roughness is small.

The resist composition of the present invention contains at least one acid generator B capable of directly or indirectly generating an acid by the irradiation with a radiation such as visible lights, ultraviolet rays, excimer lasers, electron beams, extreme ultraviolet rays (EUV), X-rays and ion beams.

The resist compound A is of an acid-amplified type and the resist compound A and the acid crosslinking agent are crosslinked intermolecularly or intramolecularly by the action of the coexisting acid, to make the resist compound A alkali-insoluble. The resist compound A in the acid-free area remains alkali-soluble. Therefore, the resist compound acts as an alkali-developable negative-type resist. The method of generating the acid is not particularly restricted. For example, the acid may be generated at the area irradiated with a radiation such as ultraviolet rays and high-energy rays in the presence of the acid generator.

More specifically, in the present invention, any method may be used as long as the acid is suitably generated within the system. The use of excimer lasers in place of ultraviolet rays such as g-rays and i-rays enables a finer processing. If high-energy rays such as electron beams, extreme ultraviolet rays (EUV), X-rays and ion beams are used, the resist composition can be still more finely processed.

The acid generator B is preferably at least one compound selected from the group consisting of the compounds represented by the following formulae 35 to 42.

In the formula 35:

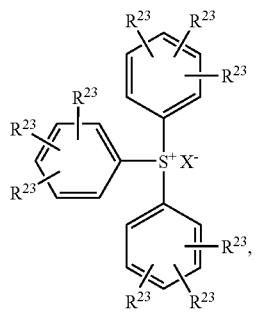

(35)

$R^{23}$ groups may be the same or different and each independently a hydrogen atom, $C_{1-12}$ linear alkyl group, $C_{3-12}$ branched alkyl group, $C_{3-12}$ cyclic alkyl group, $C_{1-12}$ linear alkoxy group, $C_{3-12}$ branched alkoxy group, $C_{3-12}$ cyclic alkoxy group, hydroxyl group, or halogen atom, $X^-$ is a halide ion or a sulfonate ion having a $C_{1-12}$ alkyl group, $C_{6-12}$ aryl group, $C_{1-12}$ halogenated alkyl group, or $C_{6-12}$ halogenated aryl group.

The compound represented by the formula 35 is preferably at least one compound selected from the group consisting of triphenylsulfonium trifluoromethanesulfonate, triphenylsulfonium nonafluoro-n-butanesulfonate, triphenylsulfonium perfluoro-n-octanesulfonate, diphenyl-4-methylphenylsulfonium trifluoromethanesulfonate, diphenyl-2,4,6-trimethylphenylsulfonium trifluoromethanesulfonate, diphenyl-4-tert-butoxyphenylsulfonium trifluoromethanesulfonate, diphenyl-4-tert-butoxyphenylsulfonium nonafluoro-n-butanesulfonate, diphenyl-4-hydroxyphenylsulfonium trifluoromethanesulfonate, bis(4-fluorophenyl)-4-hydroxyphenylsulfonium trifluoromethane sulfonate, diphenyl-4-hydroxyphenylsulfonium nonafluoro-n-butanesulfonate, bis(4-hydroxyphenyl)phenylsulfonium trifluoromethanesulfonate, tris(4-methoxyphenyl)sulfonium trifluoromethanesulfonate, tris(4-fluorophenyl)sulfonium trifluoromethanesulfonate, triphenylsulfonium p-toluenesulfonate, triphenylsulfonium benzenesulfonate, diphenyl-2,4,6-trimethylphenyl-p-toluenesulfonate, diphenyl-2,4,6-trimethylphenylsulfonium-2-trifluoromethylbenzenesulfonate, diphenyl-2,4,6-trimethylphenylsulfonium-4-trifluoromethylbenzenesulfonate, diphenyl-2,4,6-trimethylphenylsulfonium-2,4-difluorobenzenesulfonate, diphenyl-2,4,6-trimethylphenylsulfonium hexafluorobenzenesulfonate, diphenylnaphthylsulfonium trifluoromethanesulfonate, diphenyl-4-hydroxyphenylsulfonium p-toluenesulfonate, triphenylsulfonium 10-camphorsulfonate, and diphenyl-4-hydroxyphenylsulfonium 10-camphorsulfonate.

In the formula 36:

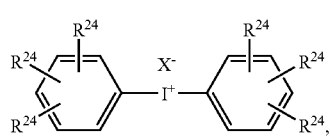

(36)

$X^-$ and $R^{24}$ are the same as $X^-$ and $R^{23}$ in the formula 35.

The compound represented by the formula 36 is preferably at least one compound selected from the group consisting of bis(4-tert-butylphenyl)iodonium trifluoromethanesulfonate, bis(4-tert-butylphenyl)iodonium nonafluoro-n-butanesulfonate, bis(4-tert-butylphenyl)iodonium perfluoro-n-octanesulfonate, bis(4-tert-butylphenyl)iodonium p-toluenesulfonate, bis(4-tert-butylphenyl)iodonium benzenesulfonate, bis(4-tert-butylphenyl)iodonium 2-trifluoromethylbenzenesulfonate, bis(4-tert-butylphenyl)iodonium 4-trifluoromethylbenzenesulfonate, bis(4-tert-butylphenyl)iodonium 2,4-difluorobenzenesulfonate, bis(4-tert-butylphenyl)iodonium hexafluorobenzenesulfonate, bis(4-tert-butylphenyl)iodonium 10-camphorsulfonate, diphenyliodoniuim trifluoromethanesulfonate, diphenyliodonium nonafluoro-n-butanesulfonate, diphenyliodonium perfluoro-n-octanesulfonate, diphenyliodonium p-toluenesulfonate, diphenyliodonium benzenesulfonate, diphenyliodonium 10-camphorsulfonate, diphenyliodonium 2-trifluoromethylbenzenesulfonate, diphenyliodonium 4-trifluoromethylbenzenesulfonate, diphenyliodonium 2,4-dlifluorobenzenesulfonate, diphenyliodonium hexafluorobenzenesulfonate, bis(4-trifluoromethylphenyl)iodonium trifluoromethanesulfonate, bis(4-trifluoromethylphenyl)iodonium nonafluoro-n-butanesulfonate, bis(4-trifluoromethylphenyl)iodonium perfluoro-n-octanesulfonate, bis(4-trifluoromethylphenyl)iodonium p-toluenesulfonate, bis(4-trifluoromethylphenyl)iodonium benzenesulfonate, and bis(4-trifluoromethylphenyl)iodonium 10-camphorsulfonate.

In the formula 37:

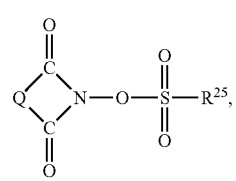

(37)

Q is a $C_{1-12}$ alkylene group, $C_{6-12}$ arylene group, or $C_{1-12}$ alkyleneoxy group (—R'—O—, wherein R' is a $C_{1-12}$ alkylene group), $R^{25}$ is a $C_{1-12}$ alkyl group, $C_{1-12}$ aryl group, $C_{1-12}$ halogenated alkyl group, or $C_{1-12}$ halogenated aryl group.

The compound represented by the formula 37 is preferably at least one compound selected from the group consisting of N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboximide, N-(10-camphorsulfonyloxy)naphthylimide, N-(n-octanesulfonyloxy)bicyclo[2.2.1]hept-5-ene-2,3-dicarboximide, N-(n-octanesulfonyloxy)naphthylimide, N-(p-toluenesulfonyloxy)bicyclo[2.2.1]hept-5-ene-2,3-dicarboximide, N-(p-toluenesulfonyloxy)naphthylimide, N-(2-trifluoromethylbenzenesulfonyloxy)bicyclo[2.2.1]hept-5-ene-2,3-dicarboximide, N-(2-trifluoromethylbenzenesulfonyloxy)naphthylimide, N-(4-trifluoromethylbenzenesulfonyloxy)bicyclo[2.2.1]hept-5-ene-2,3-dicarboximide, N-(4-trifluoromethylbenzenesulfonyloxy)naphthylimide, N-(perfluorobenzenesulfonyloxy)bicyclo[2.2.1]hept-5-ene-2,3-dicarboximide, N-(perfluorobenzenesulfonyloxy)naphthylimide, N-(1-naphthalenesulfonyloxy)bicyclo[2.2.1]hept-5-ene-2,3-dicarboximide, N-(1- naphthalenesulfonyloxy)naphthylimide, N-(nonafluoro-n-butanesulfonyloxy)bicyclo[2.2.1]hept-5-ene-2,3-dicarboximide, N-(nonafluoro-n-butanesulfonyloxy)naphthylimide, N-(perfluoro-n-octanesulfonyloxy)bicyclo[2.2.1]hept-5-ene-2,3-dicarboximide, and N-(perfluoro-n-octanesulfonyloxy)naphthylimide.

In the formula 38:

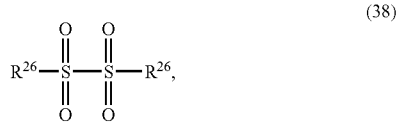

(38)

$R^{2G}$ groups may be the same or different and each independently a $C_{1-12}$ linear alkyl group, $C_{3-12}$ branched alkyl group, $C_{3-12}$ cyclic alkyl group, $C_{6-12}$ aryl group, $C_{3-12}$ heteroaryl group, or $C_{7-12}$ aralkyl group, each group being optionally substituted with a $C_{1-12}$ alkyl group, hydroxyl group, halogen, or $C_{1-12}$ haloalkyl group.

The compound represented by the formula 38 is preferably at least one compound selected from the group consisting of diphenyl disulfone, di(4-methylphenyl) disulfone, dinaphthyl disulfone, di(4-tert-butylphenyl) disulfone, di(4-hydroxyphenyl) disulfone, di(3-hydroxynaphthyl) disulfone, di(4-fluorophenyl) disulfone, di(2-fluorophenyl) disulfone, and di(4-trifluoromethylphenyl) disulfone.

In the formula 39:

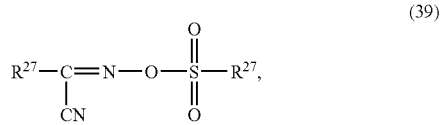

(39)

$R^{27}$ groups may be the same or different and each independently a $C_{1-12}$ linear alkyl group, $C_{3-12}$ branched alkyl group, $C_{3-12}$ cyclic alkyl group, $C_{6-12}$ aryl group, $C_{3-12}$ heteroaryl group, or $C_{7-12}$ aralkyl group, each group being optionally substituted with a $C_{1-12}$ alkyl group, halogen, or $C_{1-12}$ alkoxyl group.

The compound represented by the formula 39 is preferably at least one compound selected from the group consisting of α-(methylsulfonyloxyimino)phenylacetonitrile, α-(methylsulfonyloxyimino)-4-methoxyphenylacetonitrile, α-(trifluoromethylsulfonyloxyimino)phenylacetonitrile, α-(trifluoromethylsulfonyloxyimino)-4-methoxyphenylacetonitrile, α-(ethylsulfonyloxyimino)-4-methoxyphenylacetonitrile, α-(propylsulfonyloxyimino)-4-methylphenylacetonitrile, and α-(methylsulfonyloxyimino)-4-bromophenylacetonitrile.

In the formula 40:

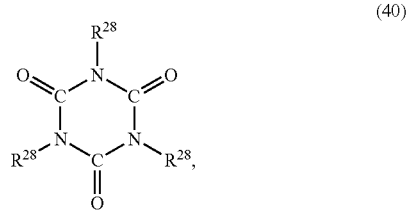

(40)

$R^{28}$ groups may be the same or different and each independently a halogenated alkyl group having one or more chlorine atoms and one or more bromine atoms. The carbon number of the halogenated alkyl group is preferably from 1 to 5.

The compound of the formula 40 is preferably at least one compound selected from the group consisting of monochloroisocyanuric acid, monobromoisocyanuric acid, dichloroisocyanuric acid, dibromoisocyanuric acid, trichloroisocyanuric acid, and trobromoisocyanuric acid.

In the formulas 41 and 42:

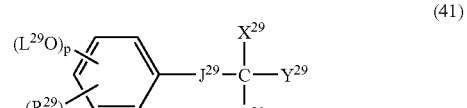

(41)

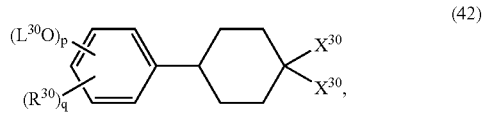

(42)

$R^{29}$ and $R^{30}$ are each independently a $C_{1-3}$ alkyl group such as methyl group, ethyl group, n-propyl group, and isopropyl group; a $C_{3-12}$ cycloalkyl group such as cyclopentyl group and cyclohexyl group; a $C_{1-3}$ alkoxyl group such as methoxy group, ethoxy group, and propoxy group; or an aryl group such as phenyl group, tolyl group, and naphthyl group, preferably a CG-10 aryl group. $L^{29}$ and $L^{30}$ are each independently an organic group having a 1,2-naphthoquinonediazide group. Preferred examples of the organic group having a 1,2-naphthoquinonediazide group include 1,2-quinonediazidesulfonyl group such as 1,2-naphthoquinonediazide-4-sulfonyl group, 1,2-naphthoquinonediazide-5-sulfonyl group, and 1,2-naphthoquinonediazide-6-sulfonyl group, with 1,2-naphthoquinonediazide-4-sulfonyl group and 1,2-naphthoquinonediazide-5-sulfonyl group being particularly preferred. Subscript p is an integer of from 1 to 3, and q is an integer of from 0 to 4, satisfying $1 \leq p+q \leq 5$. $J^{29}$ is a single bond, $C_{2-4}$ polymethylene group, $C_{3-10}$ cycloalkylene group, $C_{6-10}$ phenylene group, a group represented by the following formula 43:

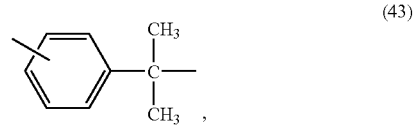

(43)

—$R^a$—C(=O)—$R^b$—, —$R^a$—C(=O)—O—$R^b$—, —$R^a$—C(O)—NH—$R^b$—, or —$R^c$—O—$R^d$—, wherein $R^a$ and $R^b$ may be the same or different and each independently a single bond or $C_{1-3}$ alkylene group, and the total number of $R^a$ and $R^b$ is form 0 to 3; and $R^c$ and $R^d$ may be the same or different and each independently a single bond or a $C_{1-4}$ alkylene group, and the total number of $R^c$ and $R^d$ is from 0 to 4. $Y^{29}$ is a hydrogen atom, $C_{1-3}$ alkyl group, or $C_{6-10}$ aryl group, and $X^{29}$ and $X^{30}$ are each a group represented by the following formula 44:

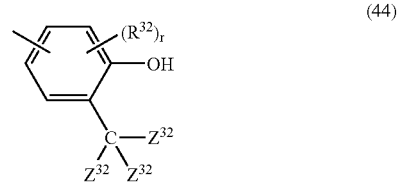

(44)

wherein $Z^{32}$ groups are each independently a $C_{1-3}$ alkyl group, $C_{3-10}$ cycloalkyl group, or $C_{6-10}$ aryl group, $R^{32}$ is a $C_{1-3}$ alkyl group, $C_{3-10}$ cycloalkyl group, or $C_{1-3}$ alkoxyl group, and r is an integer of from 0 to 3.

Examples of other acid generators include bissulfonyldiazomethanes such as bis(p-toluenesulfonyl)diazomethane, bis(2,4-dimethylphenylsulfonyl)diazomethane, bis(tert-butylsulfonyl)diazomethane, bis(n-butylsulfonyl)diazomethane, bis(isobutylsulfonyl)diazomethane, bis(isopropylsulfonyl)diazomethane, bis(n-propylsulfonyl)diazomethane and bis(cyclohexylsulfonyl)diazomethane; and halogen-containing triazine derivatives such as 2-(4-methoxyphenyl)-4,6-(bis-trichloromethyl)-1,3,5-triazine, 2-(4-methoxynaphthyl)-4,6-(bistrichloromethyl)-1,3,5-triazine, tris(2,3-dibromopropyl)-1,3,5-triazine, and tris(2,3-dibromopropyl)isocyanurate.

The acid generator B may be used singly or in combination of two or more. The amount of the acid generator B in the resist composition of the present invention is preferably from 0.1 to 30 parts by weight, more preferably from 0.5 to 20 parts by weight and still more preferably from 1 to 15 parts by weight based on 100 parts by weight of the resist compound A. Within the above range, the sensitivity and resolution are good and the resist patterns are in good shapes cross-sectionally.

The resist composition of the present invention further contains at least one acid crosslinking agent C. The acid crosslinking agent C is a compound capable of intramolecularly or intermolecularly crosslinking the resist compound A in the presence of the acid generated from the acid generator B. Examples of such crosslinking agent C include compounds having at least one group (crosslinkable group) which is crosslinkable with the resist compound A Examples of the crosslinkable group include (i) hydroxyalkyl groups or groups derived therefrom such as hydroxy (C1-C6 alkyl) group, C1-$C_6$ alkoxy(C1-C6 alkyl) group, and acetoxy(C1-C6 alkyl) group; (ii) carbonyl groups or groups derived therefrom such as formyl group and carboxy(C1-C6 alkyl) group; (i) groups having a nitrogen-containing group such as dimethylaminomethyl group, diethylaminomethyl group, dimethylolaminomethyl group, diethylolaminomethyl group, and morpholinomethyl group; (iv) glycidyl group-containing groups such as glycidyl ether group, glycidyl ester group, and glycidylamino group; (v) groups such as benzyloxymethyl group and benzoyloxymethyl group which are derived from aromatic groups such as C1-C6 aryloxy(C1-C6 alkyl) group and C1-C6 aralkyloxy(C1-C6 alkyl) group; and (vi) groups having a polymerizable multiple bond such as vinyl group and isopropenyl group, with hydroxyalkyl groups and alkoxyalkyl groups being preferred, and alkoxymethyl groups being particularly preferred.

Examples of the acid crosslinking agent C having the crosslinkable group include (i) methylol group-containing compounds such as methylol group-containing melamine compounds, methylol group-containing benzoguanamine compounds, methylol group-containing urea compounds, methylol group-containing glycoluril compounds, and methylol group-containing phenol compounds; (ii) alkoxyalkyl group-containing compounds such as alkoxyalkyl group-containing melamine compounds, alkoxyalkyl group-containing benzoguanamine compounds, alkoxyalkyl group-containing urea compounds, alkoxyalkyl group-containing glycoluril compounds, and alkoxyalkyl group-containing phenol compounds; (iii) carboxymethyl group-containing compounds such as carboxymethyl group-containing melamine compounds, carboxymethyl group-containing benzoguanamine compounds, carboxymethyl group-containing urea compounds, carboxymethyl group-containing glycoluril compounds, and carboxymethyl group-containing phenol compounds; and (iv) epoxy compounds such as bisphenol A-based epoxy compounds, bisphenol F-based epoxy compounds, bisphenol S-based epoxy compounds, novolak resin-based epoxy compounds, resol resin-based epoxy compounds, and poly(hydroxystyrene)-based epoxy compounds.

Other examples of the acid crosslinking agent C include compounds having a phenolic hydroxyl group and alkali-soluble resins which are provided with the crosslinking ability by the introduction of the crosslinkable group described above into their acid functional groups. The degree of introduction of the crosslinkable group is generally from 5 to 100 mol %, preferably from 10 to 60 mol %, and still more preferably from 15 to 40 mol %, each based on the total of the acid functional groups in the compounds having a phenolic hydroxyl group and the alkali-soluble resins. Within the above range, the crosslinking reaction proceeds sufficiently to preferably reduce the film residue and prevent the patters from being swelled and made serpentine.

In the resist composition of the present invention, the acid crosslinking agent C is preferably an alkoxyalkylated urea compound or its resin, or an alkoxyalkylated glycoluril compound or its resin. Particularly preferred acid crosslinking agent C (acid crosslinking agent C1) are the compounds represented by the following formulas 45 to 47 and the alkoxymethylated melamine compounds.

In the formulas 45 to 47:

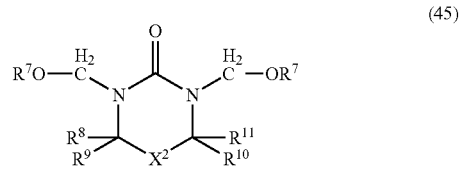

(45)

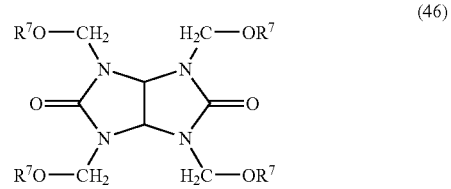

(46)

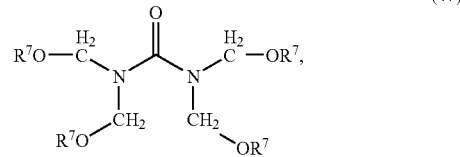

(47)

$R^7$ is a hydrogen atom, $C_{1-6}$ alkyl group, or $C_{2-6}$ acyl group. The $C_{1-6}$ alkyl group is preferably $C_{1-3}$ alkyl group such as methyl group, ethyl group, and propyl group. The $C_{2-6}$ acyl group is preferably a $C_{2-4}$ acyl group such as acetyl group and propionyl group. $R^8$ to $R^{11}$ in the formula 45 are each a hydrogen atom, hydroxyl group, $C_{1-6}$ alkyl group, or $C_{1-6}$ alkoxyl group. The $C_{1-6}$ alkyl group is preferably a $C_{1-3}$ alkyl group such as methyl group, ethyl group, and propyl group. The $C_{1-6}$ alkoxyl group is preferably a $C_{1-3}$ alkoxyl group such as methoxy group, ethoxy group, and propoxy group. $X^2$ is a single bond, methylene group, or oxygen atom, with single bond and methylene group being preferred. $R^7$ to $R^{11}$ and $X^2$ may be substituted, for example, by an alkyl group such as methyl group and ethyl group, an alkoxy group such as methoxy group and ethoxy group, hydroxyl group, halogen atom, etc. Two or more $R^7$ and $R^8$ to $R^{11}$ are respectively the same or different.

Specific examples of the compounds of the formula 45 include the following compounds.

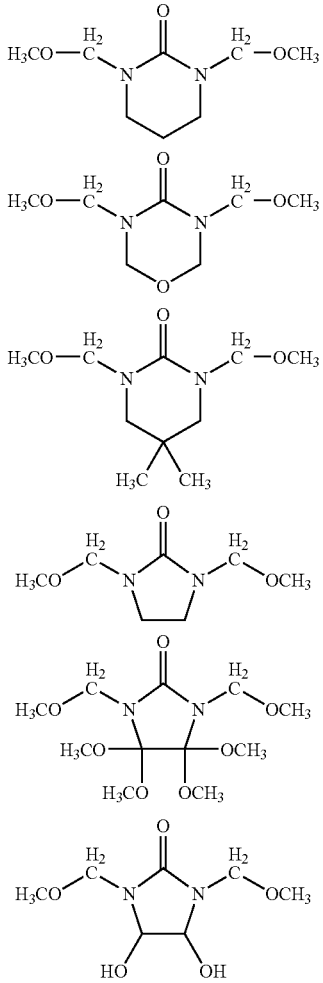

Specific examples of the compounds of the formula 46 include N,N,N,N-tetra(methoxymethyl)glycoluril, N,N,N, N-tetra(ethoxymethyl)glycoluril, N,N,N,N-tetra(n-propoxymethyl)glycoluril, N,N,N,N-tetra(isopropoxymethyl) glycoluril, N,N,N,N-tetra(n-butoxymethyl)glycoluril, and N,N,N,N-tetra(t-butoxymethyl)glycoluril, with N,N,N,N-tetra(methoxymethyl)glycoluril being preferred.

Specific examples of the compounds of the formula 47 include the following compounds.

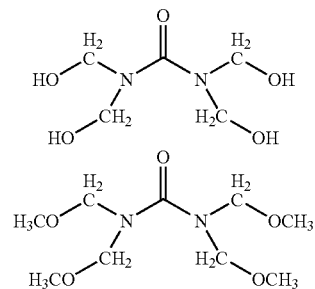

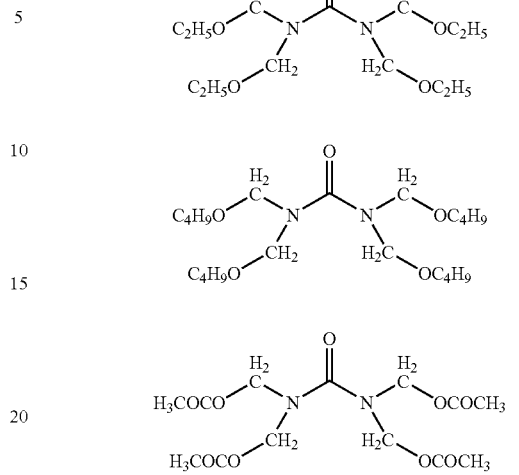

Examples of the alkoxymethylated melamine compound include N,N,N,N,N,N-hexa(methoxymethyl)melamine, N,N,N,N,N,N-hexa(ethoxymethyl)melamine, N,N,N,N,N, N-hexa(n-propoxymethyl)melamine, N,N,N,N,N,N-hexa (isopropoxymethyl)melamine, N,N,N,N,N,N-hexa(n-butoxymethyl)melamine, and N,N,N,N,N,N-hexa(t-butoxymethyl)melamine, with N,N,N,N,N,N-hexa (methoxymethyl)melamine being particularly preferred.

The acid crosslinking agent C1 is produced, for example, by introducing methylol group into a urea compound or glycoluril compound by a condensation reaction with formalin, etherifying the resultant compound with an lower alcohol such as methyl alcohol, ethyl alcohol, propyl alcohol, and butyl alcohol, and then recovering the compound or its resin precipitated by cooling the reaction product solution. The acid crosslinking agent C1 is also commercially available under tradenames such as "Cymel" (manufactured by Mitsui Cyanamid Co., Ltd.) and "Nikalac" (manufactured by Sanwa Chemical Co., Ltd.).

Other preferred acid crosslinking agent C (acid crosslinking agent C2) are phenol derivatives having in the molecule from 1 to 6 benzene rings and two or more hydroxyalkyl groups and/or alkoxyalkyl groups, wherein the hydroxyalkyl groups and/or alkoxyalkyl groups are bonded to one or more of the benzene rings. More preferred are phenol derivatives with a molecular weight of 1500 or less having in the molecule from 1 to 6 benzene rings and two or more hydroxyalkyl groups and/or alkoxyalkyl groups, wherein the hydroxyalkyl groups and/or alkoxyalkyl groups are bonded to one or more of the benzene rings.

The hydroxyalkyl group to be bonded to the benzene ring is preferably a $C_{1-6}$ group such as hydroxymethyl group, 2-hydroxyethyl group, and 2-hydroxy-1-propyl group. The alkoxyalkyl group to be bonded to the benzene ring is preferably a $C_{2-6}$ group such as methoxymethyl group, ethoxymethyl group, n-propoxymethyl group, isopropoxymethyl group, n-butoxymethyl group, isobutoxymethyl group, sec-butoxymethyl group, t-butoxymethyl group, 2-methoxyethyl group, and 2-methoxy-1-propyl group.

Particularly referred phenol derivatives are following compounds.
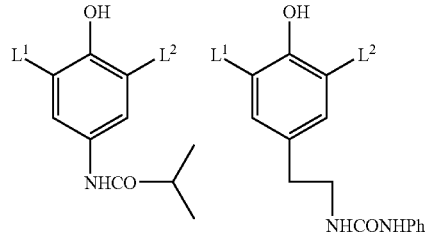
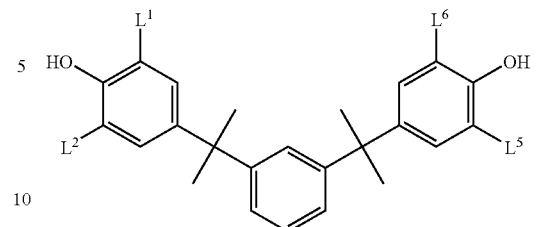
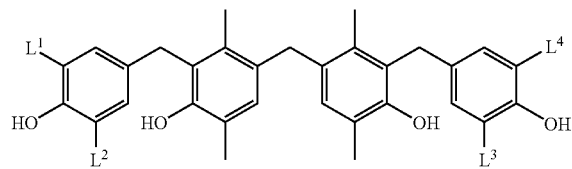
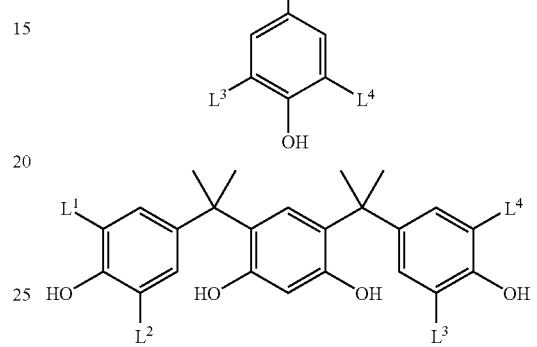
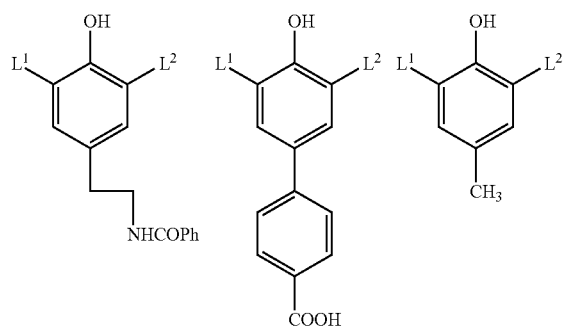
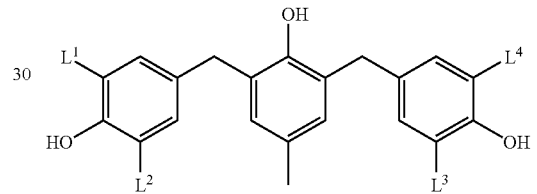
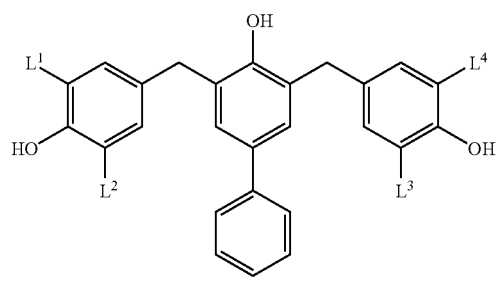
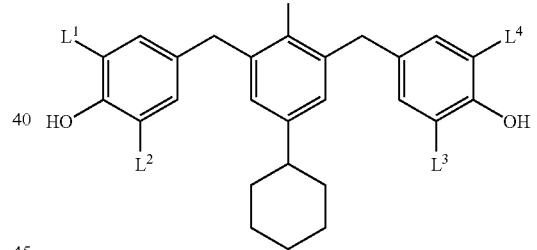
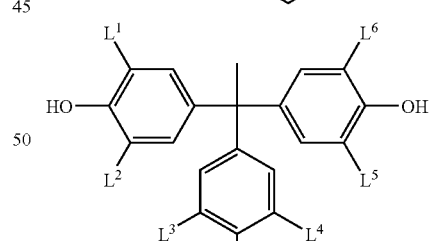
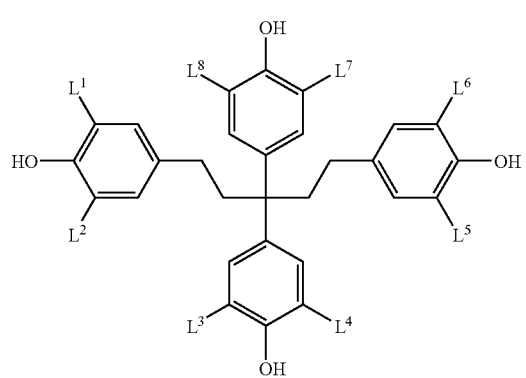
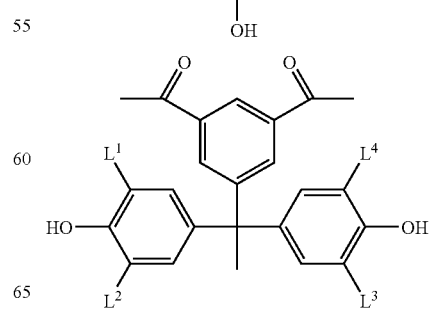

-continued
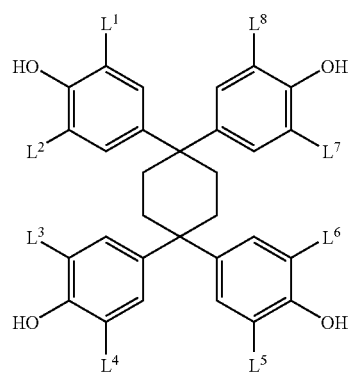
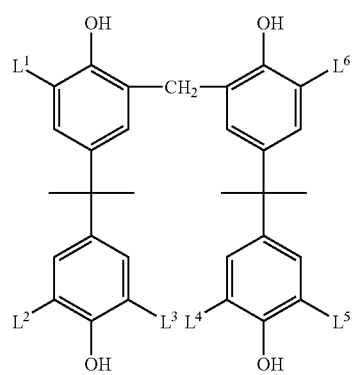
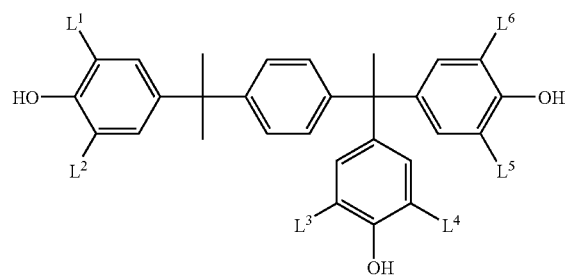
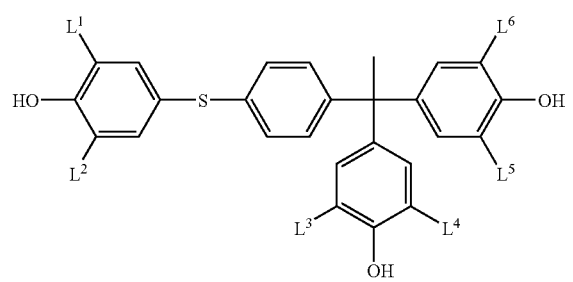
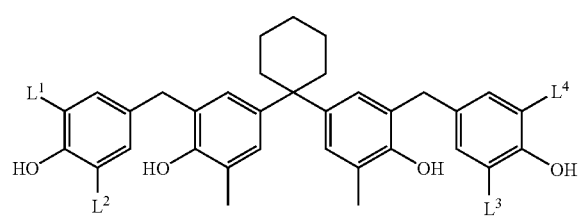
-continued
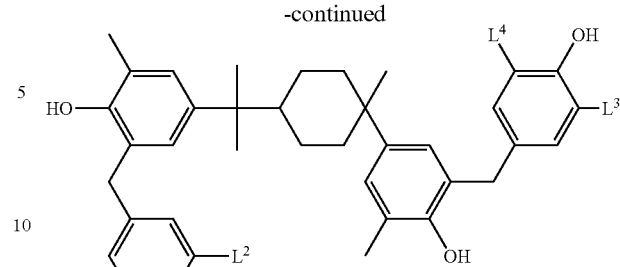
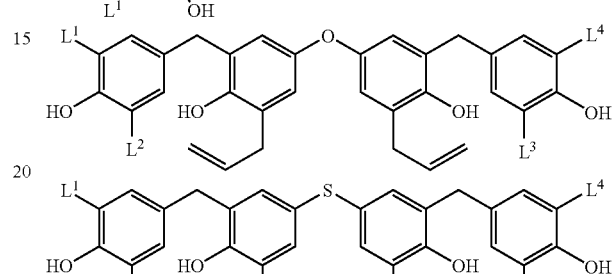
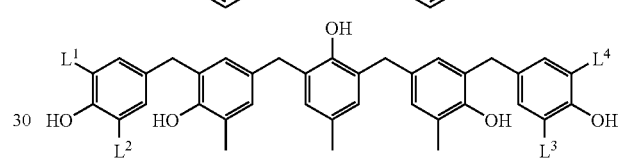
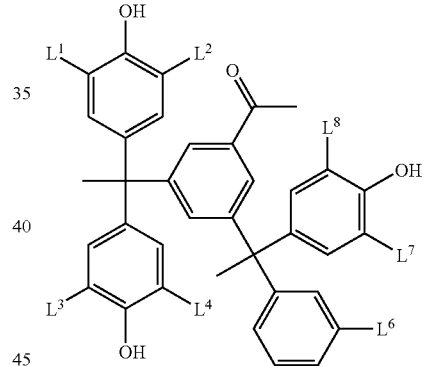
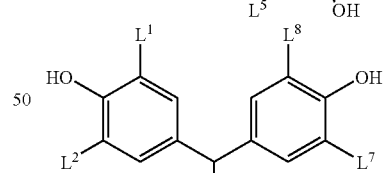
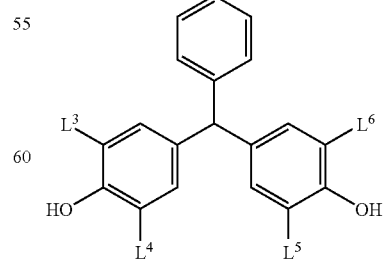
In the above formulas, $L^1$ to $L^8$ are the same or different and each independently a hydroxymethyl group, methoxymethyl group or ethoxymethyl group. The phenol derivative having a hydroxymethyl group is produced by the reaction of a corresponding phenol compound having no hydroxymethyl group (compound of the above formula in which $L^1$ to $L^8$ are each a hydrogen atom) with formaldehyde in the presence of a basic catalyst. The reaction is preferably performed at 60° C. or lower to prevent the product from being made resinous or gelated. For example, the reaction is produced by a method described in JP 6-282067A or JP 7-64285A.

The phenol derivative having an alkoxymethyl group is produced by the reaction of a corresponding phenol derivative having a hydroxymethyl group and an alcohol in the presence of an acid catalyst. The reaction is preferably performed at 100° C. or lower to prevent the product from being made resinous or gelated. For example, the reaction is produced by a method described in EP 632003A1.

The phenol derivative having the hydroxymethyl groups and/or alkoxymethyl groups produced in the above manner is excellent in the storage stability, and the phenol derivative having the alkoxymethyl groups is particularly preferred in view of the storage stability. The acid crosslinking agent C2 may be used alone or in combination of two or more.

Still other preferred acid crosslinking agent C (acid crosslinking agent C3) are compounds having at least one α-hydroxyisopropyl group. The structure of such compounds is not specifically limited as far as the compounds have the α-hydroxyisopropyl group. The hydrogen atoms in the hydroxyl groups of the α-hydroxyisopropyl groups may be replaced by at least one acid-dissociating group such as R—COO— and R—SO$_2$— wherein R is a group selected from the group consisting of $C_{1-12}$ linear hydrocarbon group, $C_{3-12}$ cyclic hydrocarbon group, $C_{1-12}$ alkoxy group, $C_{3-12}$-branched alkyl group, and $C_{6-12}$ aromatic hydrocarbon group. Examples of the compound having the α-hydroxyisopropyl group may be at least one compound selected from substituted or non-substituted aromatic compounds, diphenyl compounds, naphthalene compounds, and furan compounds, each having at least one α-hydroxyisopropyl group. Specific examples thereof are the compound of the following formula 48 (benzene compound 48), the compound of the formula 49 (diphenyl compound 49), the compound of the formula 50 (naphthalene compound 50), and the compound of the formula 51 (furan compound 51).

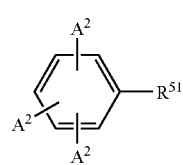
(48)

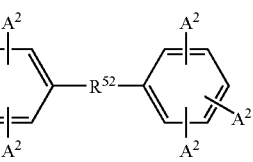
(49)

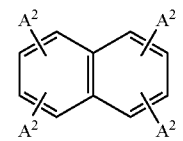
(50)

-continued

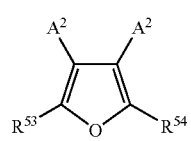
(51)

Each $A^2$ in the formulas 48 to 51 is independently an α-hydroxyisopropyl group or hydrogen atom, and at least one $A^2$ is the α-hydroxyisopropyl group. In the formula 48, $R^{51}$ is a hydrogen atom, hydroxyl group, $C_{2-6}$ linear or branched alkylcarbonyl group, or $C_{2-6}$ linear or branched alkoxycarbonyl group. In the formula 49, $R^{52}$ is a single bond, $C_{1-5}$ linear or branched alkylene group, —O—, —CO—, or —COO—. In the formula 51, $R^{53}$ and $R^{54}$ are each independently a hydrogen atom or $C_{1-6}$ linear or branched alkyl group.

Examples of the benzene compound 48 include α-hydroxyisopropylbenzenes such as α-hydroxyisopropylbenzene, 1,3-bis(α-hydroxyisopropyl)benzene, 1,4-bis(α-hydroxyisopropyl)benzene, 1,2,4-tris(α-hydroxyisopropyl)benzene, and 1,3,5-tris(α-hydroxyisopropyl)benzene; α-hydroxyisopropylphenols such as 3-α-hydroxyisopropylphenol, 4-α-hydroxyisopropylphenol, 3,5-bis(α-hydroxyisopropyl)phenol, and 2,4,6-tris(α-hydroxyisopropyl)phenol; α-hydroxyisopropylphenyl alkyl ketones such as 3-α-hydroxyisopropylphenyl methyl ketone, 4-α-hydroxyisopropylphenyl methyl ketone, 4-α-hydroxyisopropylphenyl ethyl ketone, 4-α-hydroxyisopropylphenyl n-propyl ketone, 4-α-hydroxyisopropylphenyl isopropyl ketone, 4-α-hydroxyisopropylphenyl n-butyl ketone, 4-α-hydroxyisopropylphenyl t-butyl ketone, 4-α-hydroxyisopropylphenyl n-pentyl ketone, 3,5-bis(α-hydroxyisopropyl)phenyl methyl ketone, 3,5-bis(α-hydroxyisopropyl)phenyl ethyl ketone, and 2,4,6-tris(α-hydroxyisopropyl)phenyl methyl ketone; and alkyl 4-α-hydroxyisopropylbenzoates such as methyl 3-α-hydroxyisopropylbenzoate, methyl 4-α-hydroxyisopropylbenzoate, ethyl 4-α-hydroxyisopropylbenzoate, n-propyl 4-α-hydroxyisopropylbenzoate, isopropyl 4-α-hydroxyisopropylbenzoate, n-butyl 4-α-hydroxyisopropylbenzoate, t-butyl 4-α-hydroxyisopropylbenzoate, n-pentyl 4-α-hydroxyisopropylbenzoate, methyl 3,5-bis(α-hydroxyisopropyl)benzoate, ethyl 3,5-bis(α-hydroxyisopropyl)benzoate, and methyl 2,4,6-tris(α-hydroxyisopropyl)benzoate.

Examples of the diphenyl compound 49 include α-hydroxyisopropylbiphenyls such as 3-α-hydroxyisopropylbiphenyl, 4-α-hydroxyisopropylbiphenyl, 3,5-bis(α-hydroxyisopropyl)biphenyl, 3,3'-bis(α-hydroxyisopropyl)biphenyl, 3,4'-bis(α-hydroxyisopropyl)biphenyl, 4,4'-bis(α-hydroxyisopropyl)biphenyl, 2,4,6-tris(α-hydroxyisopropyl)biphenyl, 3,3',5-tris(α-hydroxyisopropyl)biphenyl, 3,4,5-tris(α-hydroxyisopropyl)biphenyl, 2,3',4,6-tetrakis(α-hydroxyisopropyl)biphenyl, 2,4,4',6-tetrakis(α-hydroxyisopropyl)biphenyl, 3,3',5,5'-tetrakis(α-hydroxyisopropyl)biphenyl, 2,3',4,5',6-pentakis(α-hydroxyisopropyl)biphenyl, and 2,2',4,4',6,6'-hexakis(α-hydroxyisopropyl)biphenyl; α-hydroxyisopropyldiphenylalkanes such as 3-α-hydroxyisopropyldiphenylmethane, 4-α-hydroxyisopropyldiphenylmethane, 1-(4-α-hydroxyisopropylphenyl)-2-phenylethane, 1-(4-α-hydroxyisopropylphenyl)-2-phenylpropane, 2-(4-α- hydroxyisopropylphenyl)-2-phenylpropane, 1-(4-α-hydroxyisopropylphenyl)-3-phenylpropane, 1-(4-α-hydroxyisopropylphenyl)-4-phenylbutane, 1-(4-α-hydroxyisopropylphenyl)-5-phenylpentane, 3,5-bis(α-hydroxyisopropyl)diphenylmethane, 3,3'-bis(α-hydroxyisopropyl)diphenylmethane, 3,4'-bis(α-hydroxyisopropyl)diphenylmethane, 4,4'-bis(α-hydroxyisopropyl)diphenylmethane, 1,2-bis(4-α-hydroxyisopropylphenyl)ethane, 1,2-bis(4-α-hydroxypropylphenyl)propane, 2,2-bis(4-α-hydroxypropylphenyl)propane, 1,3-bis(4-α-hydroxypropylphenyl)propane, 2,4,6-tris(α-hydroxyisopropyl)diphenylmethane, 3,3',5-tris(α-hydroxyisopropyl)diphenylmethane, 3,4',5-tris(α-hydroxyisopropyl)diphenylmethane, 2,3',4,6-tetrakis(α-hydroxyisopropyl)diphenylmethane, 2,4,4',6-tetrakis(α-hydroxyisopropyl)diphenylmethane, 3,3',5,5'-tetrakis(α-hydroxyisopropyl)diphenylmethane, 2,3',4,5',6-pentakis(α-hydroxyisopropyl)diphenylmethane, and 2,2',4,4',6,6'-hexakis(α-hydroxyisopropyl)diphenylmethane; α-hydroxyisopropyldiphenyl ethers such as 3-α-hydroxyisopropyldiphenyl ether, 4-α-hydroxyisopropyldiphenyl ether, 3,5-bis(α-hydroxyisopropyl) diphenyl ether, 3,3'-bis(α-hydroxyisopropyl) diphenyl ether, 3,4'-bis(α-hydroxyisopropyl)diphenyl ether, 4,4'-bis(α-hydroxyisopropyl)diphenyl ether, 2,4,6-tris(α-hydroxyisopropyl)diphenyl ether, 3,3',5-tris(α-hydroxyisopropyl)diphenyl ether, 3,4',5-tris(α-hydroxyisopropyl)diphenyl ether, 2,3',4,6-tetrakis(α-hydroxyisopropyl)diphenyl ether, 2,4,4',6-tetrakis(α-hydroxyisopropyl)diphenyl ether, 3,3',5,5'-tetrakis(α-hydroxyisopropyl)diphenyl ether, 2,3',4,5',6-pentakis(α-hydroxyisopropyl)diphenyl ether, and 2,2',4,4',6,6'-hexakis(α-hydroxyisopropyl)diphenyl ether; α-hydroxyisopropyldiphenyl ketones such as 3-α-hydroxyisopropyldiphenyl ketone, 4-α-hydroxyisopropyldiphenyl ketone, 3,5-bis(α-hydroxyisopropyl)diphenyl ketone, 3,3'-bis(α-hydroxyisopropyl)diphenyl ketone, 3,4'-bis(α-hydroxyisopropyl)diphenyl ketone, 4,4'-bis(α-hydroxyisopropyl)diphenyl ketone, 2,4,6-tris(α-hydroxyisopropyl)diphenyl ketone, 3,3',5-tris(α-hydroxyisopropyl)diphenyl ketone, 3,4',5-tris(α-hydroxyisopropyl)diphenyl ketone, 2,3',4,6-tetrakis(α-hydroxyisopropyl)diphenyl ketone, 2,4,4',6-tetrakis(α-hydroxyisopropyl)diphenyl ketone, 3,3',5,5'-tetrakis(α-hydroxyisopropyl)diphenyl ketone, 2,3',4,6'-pentakis(α-hydroxyisopropyl)diphenyl ketone, and 2,2',4,4',6,6'-hexakis(α-hydroxyisopropyl)diphenyl ketone; and phenyl α-hydroxyisopropylbenzoates such as phenyl 3-α-hydroxyisopropylbenzoate, phenyl 4-α-hydroxyisopropylbenzoate, 3-α-hydroxyisopropylphenyl benzoate, 4-α-hydroxyisopropylphenyl benzoate, phenyl 3,5-bis(α-hydroxyisopropyl)benzoate, 3-α-hydroxyisopropylphenyl 3-α-hydroxyisopropylbenzoate, 4-α-hydroxyisopropylphenyl 3-α-hydroxyisopropylbenzoate, 3-α-hydroxyisopropylphenyl 4-α-hydroxyisopropylbenzoate, 4-α-hydroxyisopropylphenyl 4-α-hydroxyisopropylbenzoate, 3,5-bis(α-hydroxyisopropyl)phenyl benzoate, phenyl 2,4,6-tris(α-hydroxyisopropyl)benzoate, 3-α-hydroxyisopropylphenyl 3,5-bis(α-hydroxyisopropyl)benzoate, 4-α-hydroxyisopropylphenyl 3,5-bis(α-hydroxyisopropyl)benzoate, 3,5-bis(α-hydroxyisopropyl)phenyl 3-α-hydroxyisopropylbenzoate, 3,5-bis(α-hydroxyisopropyl)phenyl 4-α-hydroxyisopropylbenzoate, 2,4,6-tris(α-hydroxyisopropyl)phenyl benzoate, 3-α-hydroxyisopropylphenyl 2,4,6-tris(α-hydroxyisopropyl)benzoate, 4-α-hydroxyisopropylphenyl 2,4,6-tris(α-hydroxyisopropyl)benzoate, 3,5-bis(α-hydroxyisopropyl)phenyl 3,5-bis(α-hydroxyisopropyl)benzoate, 2,4,6-tris(α-hydroxyisopropyl)phenyl 3-α-hydroxyisopropylbenzoate, 2,4,6-tris(α-hydroxyisopropyl)phenyl 4-α-hydroxyisopropylbenzoate, 3,5-bis(α-hydroxyisopropyl)phenyl 2,4,6-tris(α-hydroxyisopropyl)benzoate, 2,4,6-tris(α-hydroxyisopropyl)phenyl 3,5-bis(α-hydroxyisopropyl)benzoate, and 2,4,6-tris(α-hydroxyisopropyl)phenyl 2,4,6-tris(α-hydroxyisopropyl)benzoate.

Examples of the naphthalene compound 50 include 1-(α-hydroxyisopropyl)naphthalene, 2-(α-hydroxyisopropyl)naphthalene, 1,3-bis(α-hydroxyisopropyl)naphthalene, 1,4-bis(α-hydroxyisopropyl)naphthalene, 1,5-bis(α-hydroxyisopropyl)naphthalene, 1,6-bis(α-hydroxyisopropyl)naphthalene, 1,7-bis(α-hydroxyisopropyl)naphthalene, 2,6-bis(α-hydroxyisopropyl)naphthalene, 2,7-bis(α-hydroxyisopropyl)naphthalene, 1,3,5-tris(α-hydroxyisopropyl)naphthalene, 1,3,6-tris(α-hydroxyisopropyl)naphthalene, 1,3,7-bis(α-hydroxyisopropyl)naphthalene, 1,4,6-tris(α-hydroxyisopropyl)naphthalene, 1,4,7-tris(α-hydroxyisopropyl)naphthalene, and 1,3,5,7-tetrakis(α-hydroxyisopropyl)naphthalene.

Examples of the furan compound 51 include 3-α-hydroxyisopropyl)furan, 2-methyl-3-(α-hydroxyisopropyl)furan, 2-methyl-4-α-hydroxyisopropyl)furan, 2-ethyl-4-(α-hydroxyisopropyl)furan, 2-n-propyl-4-(α-hydroxyisopropyl)furan, 2-isopropyl-4-(α-hydroxyisopropyl)furan, 2-n-butyl-4-(α-hydroxyisopropyl)furan, 2-t-butyl-4-(α-hydroxyisopropyl)furan, 2-n-pentyl-4-(α-hydroxyisopropyl)furan, 2,5-dimethyl-3-(α-hydroxyisopropyl)furan, 2,5-diethyl-3-(α-hydroxyisopropyl)furan, 3,4-bis(α-hydroxyisopropyl)furan, 2,5-dimethyl-3,4-bis(α-hydroxyisopropyl)furan, and 2,5-diethyl-3,4-bis(α-hydroxyisopropyl)furan.

The acid crosslinking agent C3 is preferably the compound having two or more free α-hydroxyisopropyl groups, more preferably the benzene compound 48 having two or more α-hydroxyisopropyl groups, the diphenyl compound 49 having two or more α-hydroxyisopropyl groups or the naphthalene compound 50 having two or more α-hydroxyisopropyl groups, and particularly preferably the α-hydroxyisopropyl-biphenyl compound having two or more α-hydroxyisopropyl groups or the naphthalene compound 50 having two or more α-hydroxyisopropyl groups.

The acid crosslinking agent C3 is generally produced by a method in which an acetyl group-containing compound such as 1,3-diacetylbenzene is methylated by a Grignard reagent such as $CH_3MgBr$ and then hydrolyzed, or a method in which an isopropyl group-containing compound such as 1,3-diisopropylbenzene is converted into an peroxide by the oxidation by oxygen, etc. and then the peroxide is reduced.

The blending ratio of the acid crosslinking agent C is from 0.5 to 70 parts by weight, preferably from 0.5 to 40 parts by weight, and still more preferably from 1 to 30 parts by weight, each based on 100 parts by weight of the resist compound A. A blending ratio of 0.5 parts by weight or more is preferred because the effect of controlling the solubility of the resin A in an alkali developer is enhanced, to prevent the reduction of film residue and prevent the patterns from being swelled and made serpentine. If the blending ratio is 70 parts by weight or less, the heat resistance of the resist is preferably prevented from being reduced.

The blending ratio of at least one compound selected from the acid crosslinking agent C1, acid crosslinking agent C2, and acid crosslinking agent C3 in the acid crosslinking agent C is not limited, and suitably determined according to the kind of substrate to be used in the formation of resist patterns.

The content of the alkoxymethylated melamine compound and/or the compounds of the formulas 45 to 47 in the total acid crosslinking agent component is from 50 to 99% by weight, preferably from 60 to 99% by weight, more preferably from 70 to 98% by weight, and still more preferably from 80 to 97% by weight. If 50% by weight or more, the resolution is preferably improved. If 99% by weight or less, the cross section of the patterns is easily made into a rectangular shape.

As an optional component D, the resist composition of the present invention may further contain, if necessary, one or more additives such as an acid-diffusion controller, a solubility controller, a dissolution promotor, a sensitizer, and a surfactant, as far as the object of the present invention is not adversely affected by the addition.

(1) Acid-Diffusion Controller

The resist composition may be included with an acid-diffusion controller having an effect of controlling the undesirable chemical reactions in unexposed areas by preventing the acid, which is generated from the acid generator upon the irradiation of radiation, from being diffused throughout the resist film. Using such an acid-diffusion controller, the storage stability and resolution of the resist composition can be improved. In addition, the change of line width of resist patterns due to the variation of time delay before and after irradiation can be prevented, thereby to make the process stability extremely excellent.

The acid-diffusion controller may be a nitrogen-containing compound or a basic compound which is decomposable upon the exposure to lights. Examples of the nitrogen-containing compound include a compound of the formula 52 (nitrogen-containing compound I):

(52)

a diamino compound having two nitrogen atoms in its molecule (nitrogen-containing compound II), a polyamino compound having three or more nitrogen atoms or its polymer (nitrogen-containing compound III), an amide group-containing compound, an urea compound, and a nitrogen-containing heterocyclic compound. The acid-diffusion controller may be used alone or in combination of two or more.

In the formula 52, $R^{61}$, $R^{62}$ and $R^{63}$ are each independently a hydrogen atom, linear, branched or cyclic alkyl group, aryl group, or aralkyl group. The alkyl group, aryl group, and aralkyl group may be non-substituted or substituted by another functional group such as hydroxyl group. The linear, branched or cyclic alkyl group has from 1 to 15 carbon atoms and preferably from 1 to 10 carbon atoms. Examples thereof include methyl group, ethyl group, n-propyl group, isopropyl group, n-butyl group, isobutyl group, sec-butyl group, t-butyl group, n-pentyl group, neopentyl group, n-hexyl group, thexyl group, n-heptyl group, n-octyl group, n-ethylhexyl group, n-nonyl group, and n-decyl group. The aryl group may include a $C_{6-12}$ group such as phenyl group, tolyl group, xylyl group, cumenyl group, and 1-naphthyl group. The aralkyl group may include a $C_{7-19}$ group, preferably a $C_{7-13}$ group such as benzyl group, α-methylbenzyl group, phenethyl group, and naphthylmethyl group.

Examples of the nitrogen-containing compound I include mono(cyclo)alkylamines such as n-hexylamine, n-heptylamine, n-octylamine, n-nonylamine, n-decylamine, n-dodecylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, methyl-n-dodecylamine, di-n-dodecylmethyl, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, dimethyl-n-dodecylamine, di-n-dodecylmethylamine, dicyclohexylmethylamine, and tricyclohexylamine; alkanolamines such as monoethanolamine, diethanolamine, and triethanolamine; and aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine.

Examples of the nitrogen-containing compound II include ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, and 1,3-bis[1-(4-aminophenyl)-1-methylethyl]benzene.

Examples of the nitrogen-containing compound III include polyethyleneimine, polyarylamine, and polymer of N-(2-dimethylaminoethyl)acrylamide.

Examples of the amide group-containing compound include formamide, N-methylformamide, N,N-dimethylformamide, acetamide, N-methylacetamide, N,N-dimethylacetamide, propionamide, benzamide, pyrrolidone, and N-methylpyrrolidone.

Examples of the urea compound include urea, methylurea, 1,1-dimethylurea, 1,3-dimethylurea, 1,1,3,3-tetramethylurea, 1,3-diphenylurea, and tri-n-butylthiourea.

Examples of the nitrogen-containing heterocyclic compound include imidazoles such as imidazole, benzimidazole, 4-methylimidazole, 4-methyl-2-phenylimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic amide, quinoline, 8-oxyquinoline, and acridine; and pyrazine, pyrazole, pyridazine, quinoxaline, purine, pyrrolidine, piperidine, morpholine, 4-methylmorpholine, piperazine, and 1,4-dimethylpiperazine, 1,4-diazabicyclo[2.2.2]octane.

Examples of the basic compound which is decomposable upon the exposure to lights include the sulfonium compounds represented by the following formula 53:

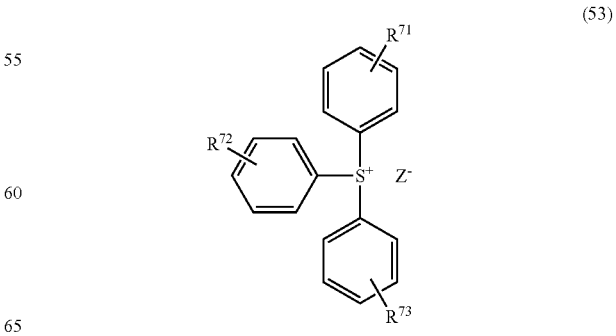

(53)

and the iodonium compounds represented by the following formula 54:

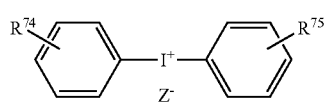

(54)

In the formulas 53 and 54, $R^{71}$, $R^{72}$, $R^{73}$, $R^{74}$, and $R^{75}$ are each independently a hydrogen atom, $C_{1-6}$ alkyl group, $C_{1-6}$ alkoxyl group, hydroxyl group or halogen atom. $Z^-$ is $HO^-$, $R-COO^-$ wherein R is a $C_{1-6}$ alkyl group, $C_{1-6}$ aryl group or $C_{1-6}$ alkaryl group, or anion represented by the following formula 55:

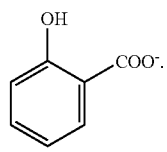

(55)

Specific examples of the basic compound which is decomposable upon the exposure to lights include triphenylsulfonium hydroxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, bis(4-t-butylphenyl)iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl) iodonium salicylate, 4-t-butylphenyl4-hydroxyphenyliodonium hydroxide, 4-t-butylphenyl4-hydroxyphenyliodonium acetate, and 4-t-butylphenyl4-hydroxyphenyliodonium salicylate.

The blending amount of the acid-diffusion controller is preferably from 0.001 to 10 parts by weight, more preferably from 0.005 to 5 parts by weight, and still more preferably from 0.01 to 3 parts by weight, each based on 100 parts by weight of the resist compound A. If 0.001 part by weight or more, the resolution, pattern profiles and dimension accuracy are further improved. In addition, the upper profile of pattern can be made proper even if the time delay between the irradiation of radiation and the post-irradiation heating is prolonged. If 10 parts by weight or less, the reduction of the sensitivity of resist and the developability of unexposed area can be prevented.

(2) Solubility Controller

The solubility controller is a compound for adequately reducing the dissolving speed of the resist compound A in a developing solution such as alkalis by lowering the solubility, if the solubility is excessively high. It is preferred for the solubility controller to cause no chemical change in the steps of baking of resist film, irradiation of radiation and development.

Examples of the solubility controller include aromatic hydrocarbons such as naphthalene, phenanthrene, anthracene and acenaphthene; ketones such as acetophenone, benzophenone and phenyl naphthyl ketone; and sulfones such as methyl phenyl sulfone, diphenyl sulfone and dinaphthyl sulfone. The solubility controllers may be used singly or in combination of two or more.

The blending amount of the solubility controller varies depending upon the kind of the resist compound A to be used, and is preferably 30 parts by weight or less and more preferably 10 parts by weight or less, each based on 100 parts by weight of the resist compound A.

(3) Dissolution Promotor

The dissolution promotor is a compound for adequately increasing the dissolving speed of the resist compound A in a developing solution such as alkalis by increasing the solubility, if the solubility is excessively low. Examples of the dissolution promotor include low-molecular weight phenol compounds having about 2 to 6 benzene rings, such as bisphenols and tris(hydroxyphenyl)methane. The dissolution promotors may be used singly or in combination of two or more.

The blending amount of the dissolution promotor varies depending upon the kind of the resist compound A to be used, and is preferably 30 parts by weight or less and more preferably 10 parts by weight or less, each based on 100 parts by weight of the resist compound A.

(4) Sensitizer

The sensitizer is a compound for increasing the generation of acid by absorbing the energy of irradiated radiation and transferring the absorbed energy to the acid generator B, thereby enhancing the apparent sensitivity of the resist. Examples of the sensitizer include, but not limited to, benzophenones, biacetyls, pyrenes, phenothiazines, and fluorenes.

The sensitizers may be used singly or in combination of two or more. The blending amount of the dissolution promotor is preferably 30 parts by weight or less and more preferably 10 parts by weight or less, each based on 100 parts by weight of the resist compound A.

(5) Surfactant

The surfactant is a compound for improving the coating properties and striation of the resist composition and the developability of the resist, etc. The surfactant may be any of anionic, cationic, nonionic and ampholytic, with nonionic surfactants being preferred because they are more effective due to a good affinity to solvents to be used for the production of the radiation-sensitive composition. Examples of the nonionic surfactant include, but not limited to, polyoxyethylene higher alkyl ethers, polyoxyethylene higher alkyl phenyl ethers, and higher fatty acid diesters of polyethylene glycol, which are commercially available under the tradenames: "EFTOP" of Jemco Inc.; "MEGAFACE" of Dai-Nippon Ink & Chemicals, Inc.; "FLUORAD" of Sumitomo 3M Ltd.; "ASAHIGUARD" and "SURFLON" of Asahi Glass Co., Ltd.; "PEPOL" of Toho Chemical Industry Co., Ltd.; "KP" of Shin-Etsu Chemical Co., Ltd.; and "POLYFLOW" of Kyoeisha Chemical Co., Ltd.

The blending amount of the surfactant is 2 parts by weight or less per 100 parts by weight of the resist compound A when expressed on the basis of the effective component of the surfactant.

(6) Additives Other than Acid-Diffusion Controller, Dissolution Promotor, Solubility Controller, Sensitizer, and Surfactant In addition to the acid-diffusion controller, dissolution promotor, solubility controller, sensitizer, and surfactant, the negative-type, radiation-sensitive composition of the present invention may contain, if necessary, one or more other additives, as far as the object of the present invention is adversely affected. Such additives include, for example, a dye, pigment and adhesive aid. The dye or pigment visualizes the latent images of exposed portions, thereby reducing adverse influence of halation during the exposing operation. The adhesive aid improves the adhesion to substrates. Other additives may include a halation inhibitor, storage stabilizer, defoaming agent, shape modifier, and specifically 4-hydroxy-4'-methyl-chalcone.

The resist composition of the present invention is prepared generally just before its use by dissolving each component in a solvent to form a uniform solution and, if necessary, filtering the solution through a filter with about 0.2 μm pore size. The total concentration of the solid components in the uniform solution is generally 50% by weight or less, preferably from 1 to 50% by weight, more preferably from 1 to 30% by weight, and still more preferably from 1 to 10% by weight.

Examples of the solvent to be used in the preparation of the resist composition include, but not limited to, ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; ethylene glycol monoalkyl ethers such as ethylene glycol monomethyl ether and ethylene glycol monoethyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; propylene glycol monoalkyl ethers such as propylene glycol monomethyl ether and propylene glycol monoethyl ether; lactic esters such as methyl lactate, ethyl lactate, n-propyl lactate, n-butyl lactate, and n-amyl lactate; esters of aliphatic carboxylic acids such as methyl acetate, ethyl acetate, n-propyl acetate, n-butyl acetate, n-amyl acetate, n-hexyl acetate, methyl propionate, and ethyl propionate; other esters such as methyl 3-methoxy propionate, 3-methoxyethyl propionate, methyl 3-ethoxy propionate, 3-ethoxyethyl propionate, methyl 3-methoxy-2-methyl propionate, 3-methoxybutyl acetate, 3-methyl-3-methoxybutyl acetate, butyl 3-methoxy-3-methyl propionate, butyl 3-methoxy-3-methyl lactate, methyl acetacetate, methyl pyruvate, and ethyl pyruvate; aromatic hydrocarbons such as toluene and xylene; ketones such as 2-heptanone, 3-heptanone, 4-heptanone, and cyclohexanone; amides such as N,N-dimethylformamide, N-methylacetamide, N,N-dimethylacetamide, and N-methylpyrrolidone; and lactones such as γ-lactone. These solvents may be used alone or in combination of two or more.

The resist composition of the present invention may contain a compound and/or a resin each being soluble in an aqueous alkali solution, as far as the object of the present invention is not adversely affected. Examples of the compound soluble in an aqueous alkali solution include, but not limited to, polyphenol compounds such as phenol compounds having phenolic hydroxyl groups. Examples of the resin soluble in an aqueous alkali solution include novolak resins, polyvinylphenols, polyacrylic acids, polyvinyl alcohols, styrene-maleic anhydride resins, polymers having the units derived from acrylic acid, vinyl alcohol, or vinylphenol, and derivatives thereof. The blending amount of the compound and/or resin each being soluble in an aqueous alkali solution depends upon the kind of the resist compound to be used, and preferably 30 parts by weight or less, more preferably 10 parts by weight or less, still more preferably 5 parts by weight or less, and particularly preferably zero, each based on 100 parts by weight of the resist compound A.

In addition, the resist composition of the present invention may contain a compound and/or a resin each having a crosslinkable group which causes a crosslinking reaction by the irradiation of visible lights, ultraviolet rays, excimer lasers, electron beams, extreme ultraviolet rays (EUV), X-rays and ion beams or by the reaction induced by such irradiation. Such crosslinkable group may include a vinyl group, aryl group, cinnamoyl group, vinylsilyl group, epoxy group, chloromethyl group, and halogenated phenyl group. Examples of the compound and/or resin each having a crosslinkable group include, but not limited to, a compound and/or polymer and derivatives thereof which can be produced by the reaction between the compound and/or resin each being soluble in an aqueous alkali solution and an agent for introducing the crosslinkable group in the presence of a basic catalyst. The agent for introducing the crosslinkable group may include derivatives of carboxylic acid such as acids, acid chlorides, acid anhydrides and dicarbonates and alkyl halides, each having the crosslinkable group, with acid chlorides being particularly preferred. These compounds and/or resins may be used alone or in combination of two or more.

In the resist composition, the blending ratio of "resist compound A/acid generator B/acid crosslinking agent C/optional component D" is, when expressed by weight percentages based on solid, preferably 3-96.9/0.1-30/3-65/0-93.9, more preferably 65-96.9/0.1-30/0.3-34.9/0-30, still more preferably 65-96.9/0.1-30/0.3-34.9/0-10, particularly preferably 65-96.9/0.1-30/0.6-34.9/0-5, and most preferably 65-96.9/0.1-30/0.6-30/0. With the above ratio, the sensitivity, resolution and alkali developability are good.

If the optional component D is not contained, the proportion of the solid components in the resist composition is preferably 3 to 96.9% by weight for the component A, 0.1 to 30% by weight for the component B, and 0.3 to 96.9% by weight for the component C with the total of the components A, B and C being 100% by weight; more preferably 65 to 96.9% by weight for the component A, 0.1 to 32% by weight for the component B, 0.3 to 34.9% by weight for the component C with the total of the components A, B and C being 100% by weight; still more preferably 70 to 96.9% by weight for the component A, 0.1 to 27% by weight for component the B, 3.0 to 29.9% by weight for the component C with the total of the components A, B and C being 100% by weight; particularly preferably 80 to 96.9% by weight for the component A, 0.1 to 17% by weight for the component B, 3.0 to 19.9% by weight for the component C with the total of the components A, B and C being 100% by weight; and most preferably 90 to 96.9% by weight for the component A, 0.1 to 7% by weight for the component B, 3.0 to 9.9% by weight for the component C with the total of the components A, B and C being 100% by weight. Within the above range, the sensitivity, resolution and alkali developability are good.

In the present invention, the term "resist substrate" means a substrate having on its surface a resist film formed from the resist composition, and the term "patterned substrate" means a substrate having a resist film patterned by the exposure and development. The term "pattern-forming material" is a composition formed on the resist substrate, which can be patterned by the irradiation of lights, electron beams or radiation, i.e., synonymous with "resist film." The term "patterned wiring board" is a substrate having a patterned wiring which is obtained by the etching of the patterned substrate.

In the formation of a resist pattern, the resist composition of the present invention is first applied on a substrate such as a silicon wafer and an aluminum-coated wafer by a coating method such as spin coating, cast coating and roll coating to form a resist film. The substrate may be treated in advance with a surface treating agent such as hexamethylenedisilazane, if necessary.

Then, the coated substrate is heated, if necessary. The heating temperature varies according to the blending ratio of each component in the radiation-sensitive composition, and preferably from 20 to 250° C. and more preferably from 20 to 150° C. The adhesion of the resist to the substrate is preferably improved in some cases by the heating. Then, the resist film is exposed in a desired pattern with a radiation selected from the group consisting of visible lights, ultraviolet rays, excimer lasers, electron beams, extreme ultraviolet rays (EUV), X-rays, and ion beams. The exposing conditions can be suitably selected according to the blending ratio of each component in the radiation-sensitive composition. In the present invention, it is preferred to conduct a heat treatment after the irradiation of radiation to stably form highly accurate fine patterns by the exposure. The heating temperature is preferably from 20 to 250° C. and more preferably from 20 to 150° C., although depending upon the blending ratio of each component in the radiation sensitive composition.

Then, the exposed resist film is developed with an alkali developing solution to form desired resist patterns. As the alkali developing solution, there may be used an aqueous alkaline solution dissolving, for example, at least one alkaline compound selected from mono-, di- or trialkylamines, mono-, di- or trialkanolamines, heterocyclic amines, tetramethylammonium hydroxide (TMAH) and choline in a concentration of preferably from 1 to 10% by mass and more preferably from 1 to 5% by mass. The dissolution of the exposed portion in the developing solution is preferably prevented if the concentration is 10% by mass or less.

The alkali developing solution may contain an appropriate amount of an alcohol such as methanol, ethanol and isopropyl alcohol, or a surfactant mentioned above, with the addition of isopropyl alcohol in 10 to 30% by mass being particularly preferred, because the wetting between the resist and the developing solution is enhanced. After developing with such an aqueous alkaline solution, the developed patterns are generally washed with water.

After forming resist patterns, the substrate is etched to obtain a patterned wiring board. The etching may be performed by known methods such as dry-etching using a plasma gas and wet-etching using an alkali solution, a copper (II) chloride solution, an iron (III) chloride solution, etc.

After forming resist patterns, the substrate may be plated, for example, by copper plating, solder plating, nickel plating or gold plating.

The remaining resist patterns after etching may be stripped off by an organic solvent or an alkaline aqueous solution stronger than the aqueous alkali solution used for the development. Examples of the organic solvent include PGMEA (propylene glycol monomethyl ether acetate), PGME (propylene glycol monomethyl ether) and EL (ethyl lactate). Examples of the strong alkaline aqueous solution include a 1 to 20% by mass aqueous sodium hydroxide solution and 1 to 20% by mass aqueous potassium hydroxide solution. The stripping of the resist patterns may be performed by dipping method, spray method, etc. The wiring board having the resist patterns thereon may be a multi-layered wiring board and may be formed with small through-holes.

The wiring board may be produced by a lift-off method in which a metal is vacuum-deposited after the formation of resist patterns and then the remaining resist patterns are removed by dissolution into a solution.

EXAMPLES

The present invention will be described in more detail with reference to the following examples. However, it should be noted that the following examples are only illustrative and do not limit the scope of the present invention thereto.

In the following synthesis examples, the structure of each compound was identified by elemental analysis and $^1$H-NMR measurement. The results of such analysis are shown in Tables 1 and 2.

Synthesis Example 1

Synthesis of Compound 1-1

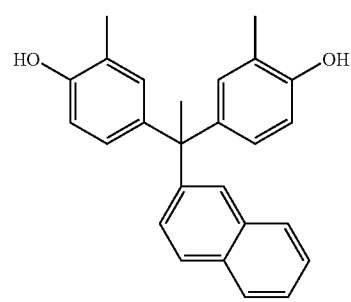
(1-1)

A mixture of 43.2 g/0.4 mol of o-cresol and 17.0 g/0.1 mol of acetonaphthone was heated to about 60° C. to form a solution. After adding 0.1 ml of sulfuric acid, 0.8 ml of 3-mercaptopropionic acid, and 10 ml of toluene to the solution, the reaction was allowed to proceed under stirring. When the conversion of o-cresol reached 100%, the reaction product solution was added with 100 ml of toluene and cooled to precipitate crystals. The crystals were separated by vacuum filtration, washed with a warm water of 60° C. under stirring, and purified by recrystallization, to obtain 3.86 g of the aimed compound

Synthesis Example 2

Synthesis of Compound 1-2

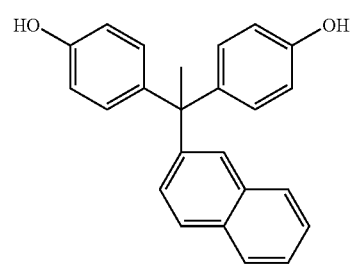
(1-2)

In the same manner as in Synthesis Example 1, 37.6 g/0.4 mol of phenol and 17.0 g/0.1 mol of acetonaphthone were allowed to react, to obtain 3.50 g of the aimed compound.

Synthesis Example 3

Synthesis of Compound 1-3

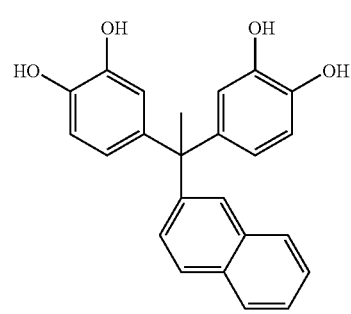
(1-3)

In the same manner as in Synthesis Example 1, 44.0 g/0.4 mol of catechol and 17.0 g/0.1 mol of acetonaphthone were allowed to react, to obtain 3.33 g of the aimed compound.

Synthesis Example 4

Synthesis of Compound 1-4

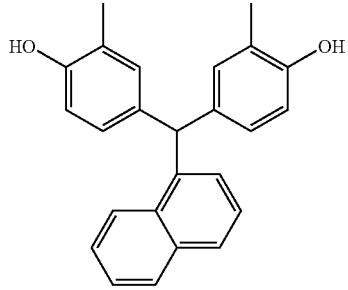

(1-4)

In the same manner as in Synthesis Example 1, 43-2 g/0.4 mol of o-cresol and 15.6 g/0.1 mol of naphthalenealdehyde were allowed to react, to obtain 6.62 g of the aimed compound.

Synthesis Example 5

Synthesis of Compound 1-5

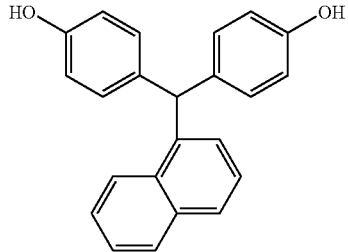

(1-5)

In the same manner as in Synthesis Example 1, 37.6 g/0.4 mol of phenol and 15.6 g/0.1 mol of naphthalenealdehyde were allowed to react, to obtain 6.35 g of the aimed compound.

Synthesis Example 6

Synthesis of Compound 1-6

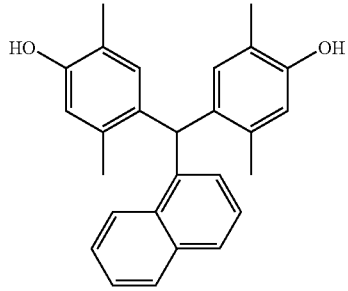

(1-6)

In the same manner as in Synthesis Example 1, 48.8 g/0.4 mol of 2,5-xylenol and 15.6 g/0.1 mol of naphthalenealdehyde were allowed to react, to obtain 6.32 g of the aimed compound.

Synthesis Example 7

Synthesis of Compound 1-7

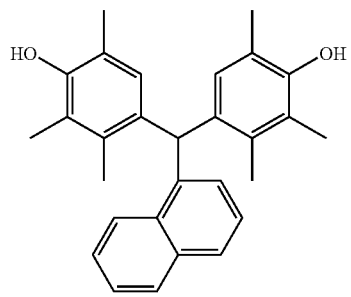

(1-7)

In the same manner as in Synthesis Example 1, 54.4 g/0.4 mol of 2,3,6-trimethylphenol and 15.6 g/0.1 mol of aphthalenealdehyde were allowed to react, to obtain 6.34 g of the aimed compound.

Synthesis Example 8

Synthesis of Compound 2-1

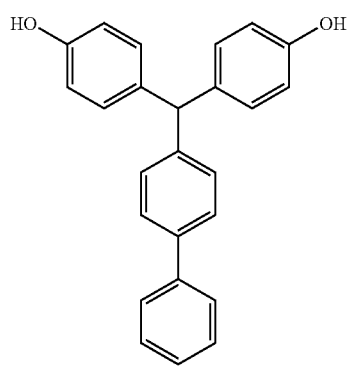

(2-1)

In the same manner as in Synthesis Example 1, 37.6 g/0.4 mol of phenol and 18.2 g/0.1 mol of biphenylaldehyde were allowed to react, to obtain 3.70 g of the aimed compound.

Synthesis Example 9

Synthesis of Compound 2-2

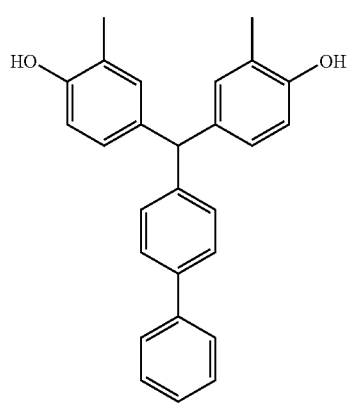

(2-2)

In the same manner as in Synthesis Example 1, 43.2 g/0.4 mol of o-cresol and 18.2 g/0.1 mol of biphenylaldehyde were allowed to react, to obtain 6.56 g of the aimed compound.

Synthesis Example 10
Synthesis of Compound 2-3

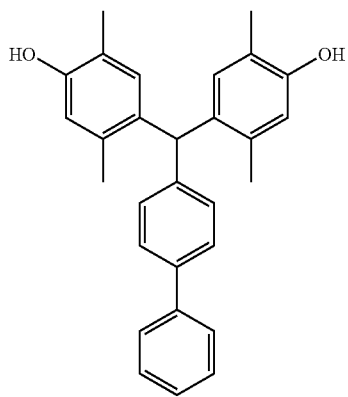

(2-3)

In the same manner as in Synthesis Example 1, 48.8 g/0.4 mol of 2,5-xylenol and 18.2 g/0.1 mol of biphenylaldehyde were allowed to react, to obtain 6.33 g of the aimed compound.

Synthesis Example 11
Synthesis of Compound 2-4

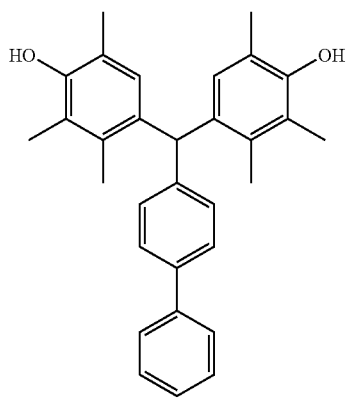

(2-4)

In the same manner as in Synthesis Example 1, 54.4 g/0.4 mol of 2,3,6-trimethylphenol and 18.2 g/0.1 mol of biphenylaldehyde were allowed to react, to obtain 6.64 g of the aimed compound.

Synthesis Example 12
Synthesis of Compound 3-1

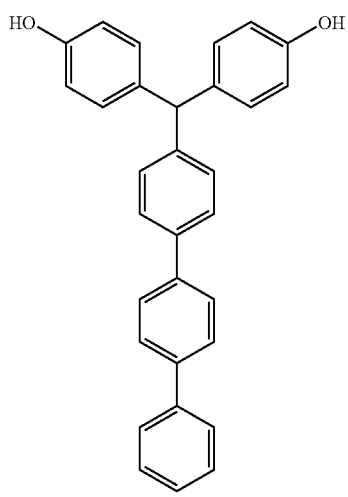

(3-1)

In the same manner as in Synthesis Example 1, 37.6 g/0.4 mol of phenol and 25.8 g/0.1 mol of terphenylaldehyde were allowed to react, to obtain 7.62 g of the aimed compound.

Synthesis Example 13
Synthesis of Compound 3-2

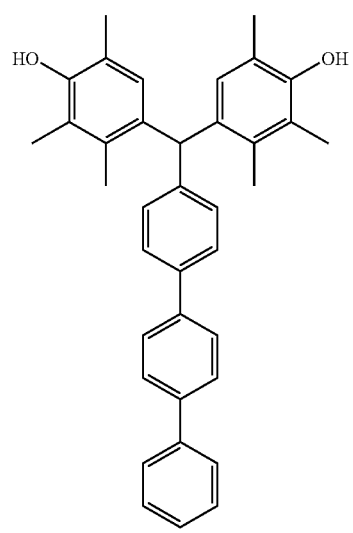

(3-2)

In the same manner as in Synthesis Example 1, 54.4 g/0.4 mol of 2,3,6-trimethylphenol and 25.8 g/0.1 mol of terphenylaldehyde were allowed to react, to obtain 7.42 g of the aimed compound.

Synthesis Example 14
Synthesis of Compound 3-3

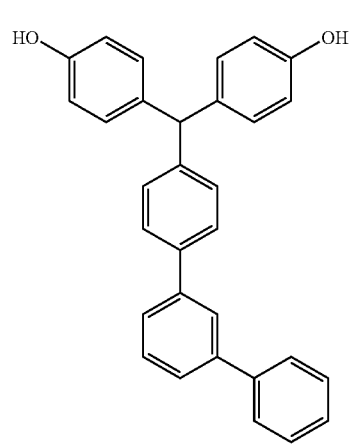

(3-3)

In the same manner as in Synthesis Example 1, 37.6 g/0.4 mol of phenol and 25.8 g/0.1 mol of p-terphenylaldehyde were allowed to react, to obtain 7.62 g of the aimed compound.

Synthesis Example 15

Synthesis of Compound 3-4

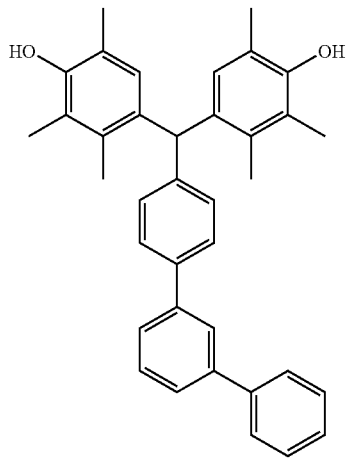
(3-4)

In the same manner as in Synthesis Example 1, 54.4 g/0.4 mol of 2,3,6-trimethylphenol and 25.8 g/0.1 mol of p-terphenylaldehyde were allowed to react, to obtain 7.24 g of the aimed compound.

Synthesis Example 16

Synthesis of Compound 4-1

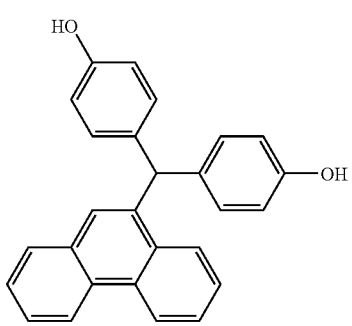
(4-1)

In the same manner as in Synthesis Example 1, 37.6 g/0.4 mol of phenol and 20.6 g/0.1 mol of phenanthrenealdehyde were allowed to react, to obtain 5.21 g of the aimed compound.

Synthesis Example 17

Synthesis of Compound 4-2

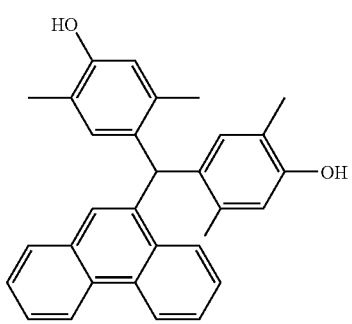
(4-2)

In the same manner as in Synthesis Example 1, 48.8 g/0.4 mol of 2,5-xylenol and 20.6 g/0.1 mol of phenanthrenealdehyde were allowed to react, to obtain 6.32 g of the aimed compound.

Synthesis Example 18

Synthesis of Compound 5-1

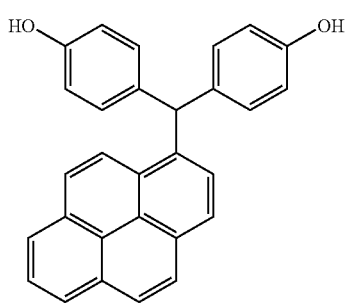
(5-1)

In the same manner as in Synthesis Example 1, 37.6 g/0.4 mol of phenol and 23.0 g/0.1 mol of pyrenealdehyde were allowed to react, to obtain 8.32 g of the aimed compound.

Synthesis Example 19

Synthesis of Compound 5-2

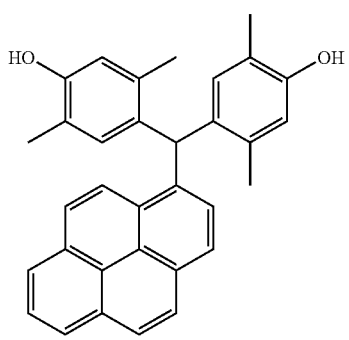
(5-2)

In the same manner as in Synthesis Example 1, 48-8 g/0.4 mol of 2,5-xylenol and 23.0 g/0.1 mol of pyrenealdehyde were allowed to react, to obtain 8.45 g of the aimed compound.

Synthesis Example 20

Synthesis of Compound 6-1

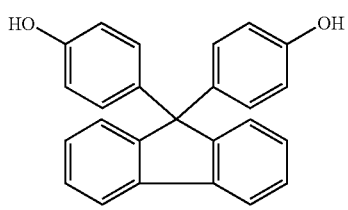
(6-1)

In the same manner as in Synthesis Example 1, 37.6 g/0.4 mol of phenol and 18.0 g/0.1 mol of fluorenone were allowed to react, to obtain 5.75 g of the aimed compound.

Synthesis Example 21

Synthesis of Compound 6-2

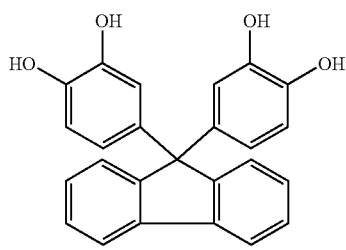
(6-2)

In the same manner as in Synthesis Example 1, 44.0 g/0.4 mol of catechol and 18.0 g/0.1 mol of fluorenone were allowed to react, to obtain 6.32 g of the aimed compound.

Synthesis Example 22

Synthesis of Compound 6-3

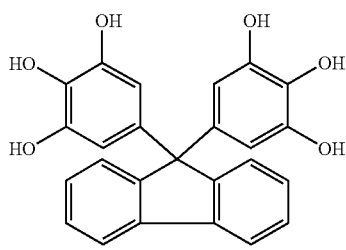
(6-3)

In the same manner as in Synthesis Example 1, 50.44 g/0.4 mol of pyrogallol and 18.0 g/0.1 mol of fluorenone were allowed to react, to obtain 6.30 g of the aimed compound.

Synthesis Example 23

Synthesis of Compound 6-4

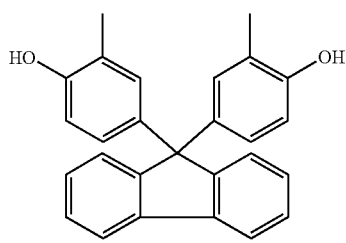
(6-4)

In the same manner as in Synthesis Example 1, 43.2 g/0.4 mol of o-cresol and 18.0 g/0.1 mol of fluorenone were allowed to react, to obtain 6.39 g of the aimed compound.

Synthesis Example 24

Synthesis of Compound 7-1

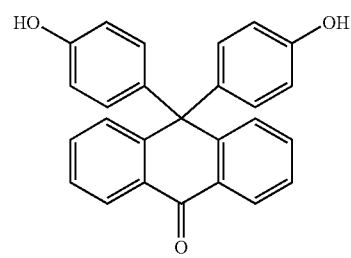
(7-1)

In the same manner as in Synthesis Example 1, 37.6 g/0.4 mol of phenol and 20.8 g/0.1 mol of anthraquinone were allowed to react, to obtain 2.68 g of the aimed compound.

Synthesis Example 25

Synthesis of Compound 8-1

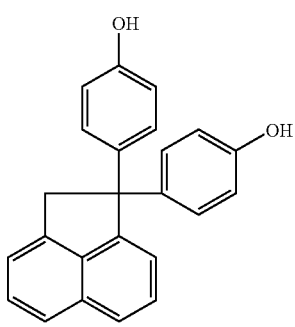
(8-1)

In the same manner as in Synthesis Example 1, 37.6 g/0.4 mol of phenol and 16.8 g/0.1 mol of acenaphthenone were allowed to react, to obtain 7.21 g of the aimed compound.

Synthesis Example 26

Synthesis of Compound 8-2

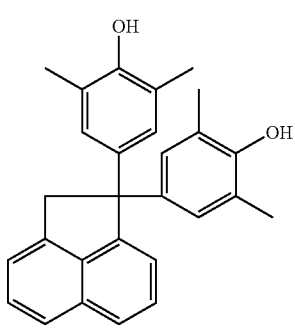
(8-2)

In the same manner as in Synthesis Example 1, 48.8 g/0.4 mol of 2,6-xylenol and 16.8 g/0.1 mol of acenaphthenone were allowed to react, to obtain 6.80 g of the aimed compound.

Synthesis Example 27

Synthesis of Compound 9-1

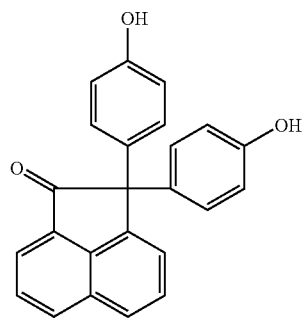
(9-1)

In the same manner as in Synthesis Example 1, 37.6 g/0.4 mol of phenol and 18.2 g/0.1 mol of acenaphthenequinone were allowed to react, to obtain 6.35 g of the aimed compound.

Synthesis Example 28

Synthesis of Compound 9-2

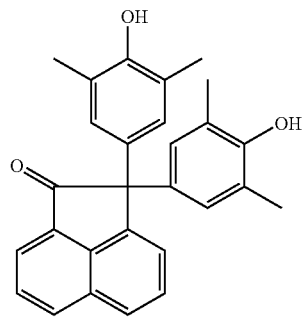
(9-2)

In the same manner as in Synthesis Example 1, 48.8 g/0.4 mol of 2,6-xylenol and 18.2 g/0.1 mol of acenaphthenequinone were allowed to react, to obtain 6.11 g of the aimed compound.

Synthesis Example 29

Synthesis of Compound 10-1

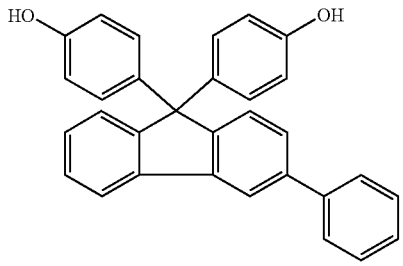
(10-1)

In the same manner as in Synthesis Example 1, 37.6 g/0.4 mol of phenol and 25.6 g/0.1 mol of phenylfluorenone were allowed to react, to obtain 3.65 g of the aimed compound.

Synthesis Example 30

Synthesis of Compound 11-1

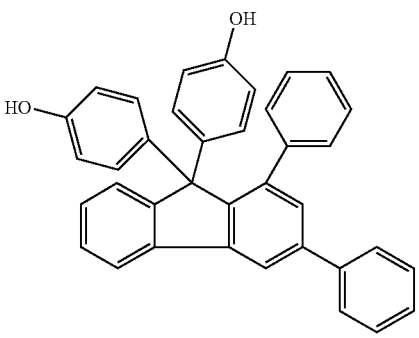
(11-1)

In the same manner as in Synthesis Example 1, 37.6 g/0.4 mol of phenol and 33.2 g/0.1 mol of diphenylfluorenone were allowed to react, to obtain 3.51 g of the aimed compound.

Synthesis Example 31

Synthesis of Compound 12-1

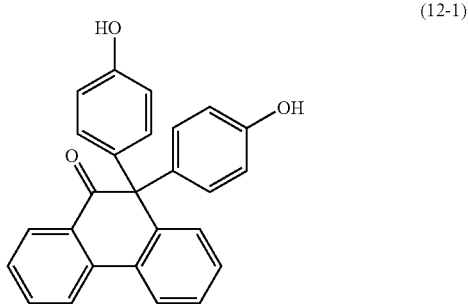
(12-1)

In the same manner as in Synthesis Example 1, 37.6 g/0.4 mol of phenol and 20.8 g/0.1 mol of phenanthrenequinone were allowed to react, to obtain 5.56 g of the aimed compound.

Synthesis Example 32

Synthesis of Compound 12-2

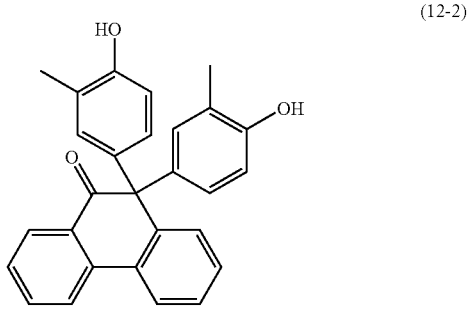
(12-2)

In the same manner as in Synthesis Example 1, 43.2 g/0.4 mol of o-cresol and 20.8 g/0.1 mol of phenanthrenequinone were allowed to react, to obtain 5.89 g of the aimed compound.

Synthesis Example 33

Synthesis of Compound 12-3

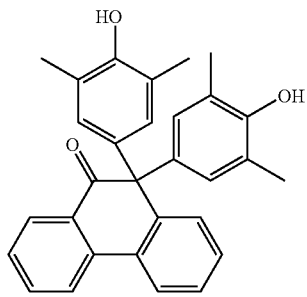
(12-3)

In the same manner as in Synthesis Example 1, 48.8 g/0.4 mol of 2,6-xylenol and 20.8 g/0.1 mol of phenanthrenequinone were allowed to react, to obtain 5.99 g of the aimed compound.

Synthesis Example 34

Synthesis of Compound 13-1

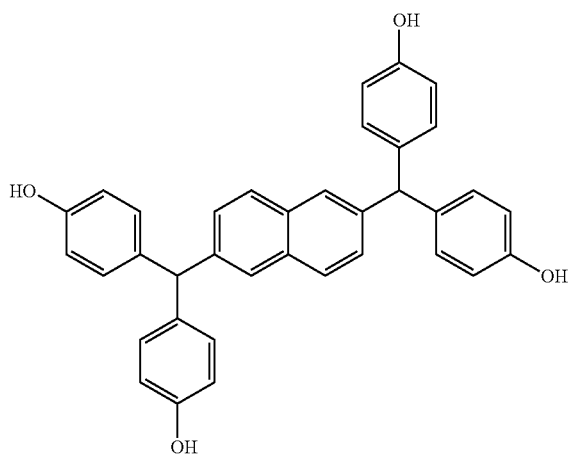
(13-1)

In the same manner as in Synthesis Example 1, 75.2 g/0.8 mol of phenol and 18.4 g/0.1 mol of 2,6-naphthalenedialdehyde were allowed to react, to obtain 8.79 g of the aimed compound.

Synthesis Example 35

Synthesis of Compound 13-2

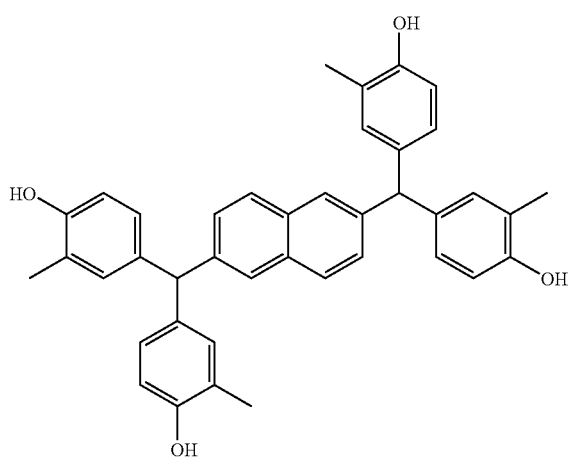
(13-2)

In the same manner as in Synthesis Example 1, 86.4 g/0.8 mol of o-cresol and 18.4 g/0.1 mol of 2,6-naphthalenedialdehyde were allowed to react, to obtain 9.89 g of the aimed compound.

Synthesis Example 36

Synthesis of Compound 13-3

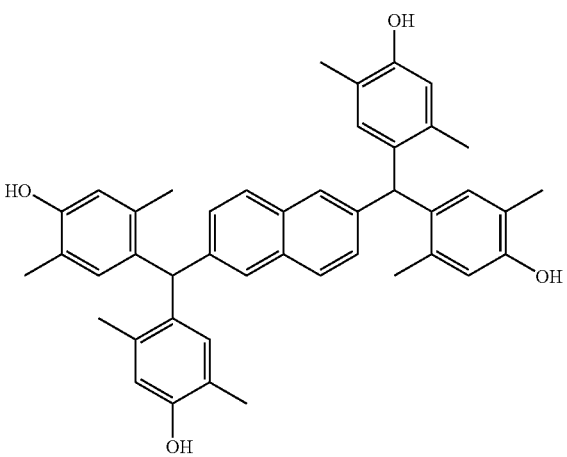
(13-3)

In the same manner as in Synthesis Example 1, 97.6 g/0.8 mol of 2,5-xylenol and 18.4 g/0.1 mol of 2,6-naphthalenedialdehyde were allowed to react, to obtain 9.02 g of the aimed compound.

Synthesis Example 37

Synthesis of Compound 13-4

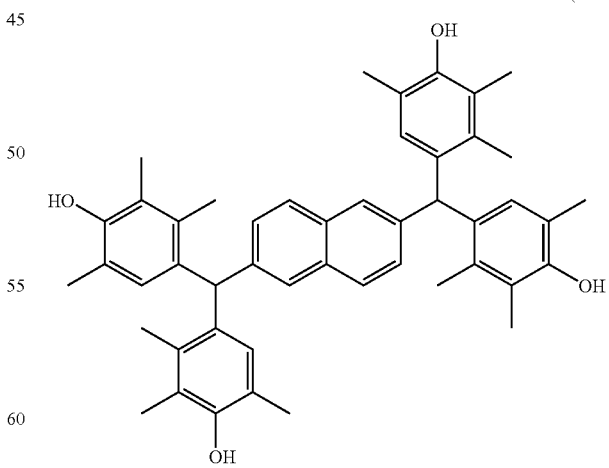
(13-4)

In the same manner as in Synthesis Example 1, 108.8 g/0.8 mol of 2,3,6-trimethylphenol and 18.4 g/0.1 mol of 2,6-naphthalenedialdehyde were allowed to react, to obtain 8.99 g of the aimed compound.

Synthesis Example 38

Synthesis of Compound 14-1

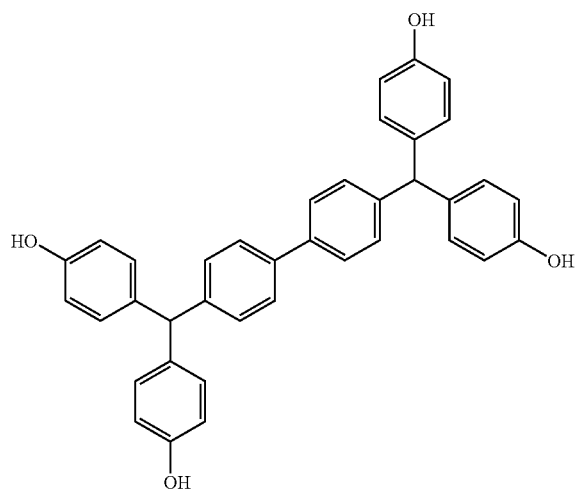

(14-1)

In the same manner as in Synthesis Example 1, 75.2 g/0.8 mol of phenol and 21.0 g/0.1 mol of 4,4'-biphenyldialdehyde were allowed to react, to obtain 9.9 g of the aimed compound.

Synthesis Example 39

Synthesis of Compound 14-2

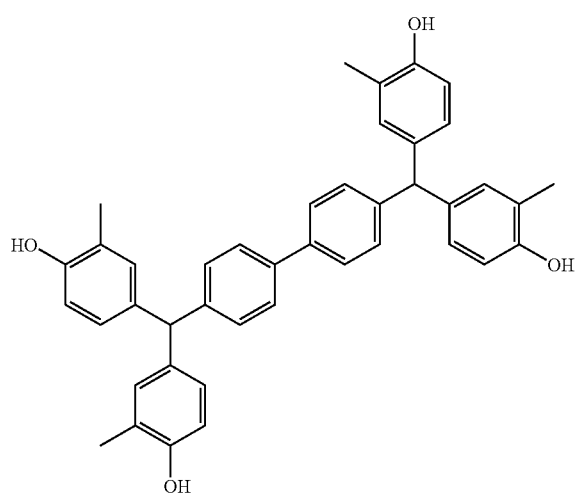

(14-2)

In the same manner as in Synthesis Example 1, 86.4 g/0.8 mol of o-cresol and 21.0 g/0.1 mol of 4,4'-biphenyldialdehyde were allowed to react, to obtain 10.9 g of the aimed compound.

Synthesis Example 40

Synthesis of Compound 14-3

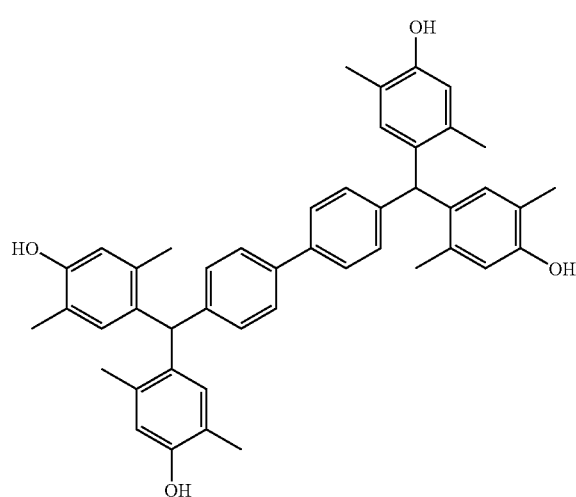

(14-3)

In the same manner as in Synthesis Example 1, 97.6 g/0.8 mol of 2,5-xylenol and 21.0 g/0.1 mol of 4,4'-biphenyldialdehyde were allowed to react, to obtain 11.0 g of the aimed compound.

Synthesis Example 41

Synthesis of Compound 14-4

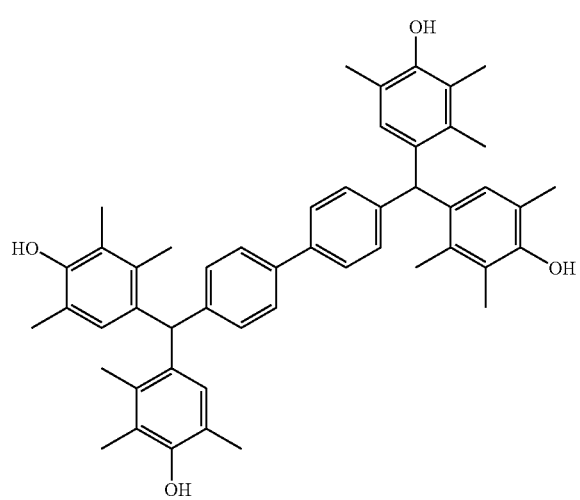

(14-4)

In the same manner as in Synthesis Example 1, 108.8 g/0.8 mol of 2,3,6-trimethylphenol and 21.0 g/0.1 mol of 4,4'-biphenyldialdehyde were allowed to react, to obtain 10.3 g of the aimed compound.

Synthesis Example 42

Synthesis of Compound 15-1

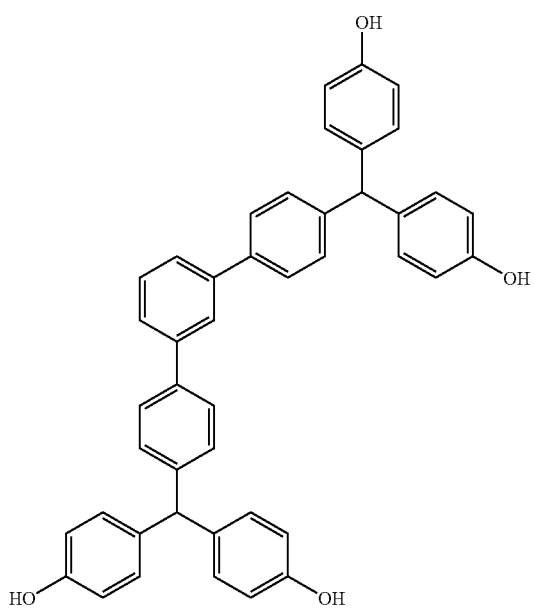

(15-1)

In the same manner as in Synthesis Example 1, 75.2 g/0.8 mol of phenol and 28.6 g/0.1 mol of m-terphenyldialdehyde were allowed to react, to obtain 11.5 g of the aimed compound.

Synthesis Example 43

Synthesis of Compound 16-1

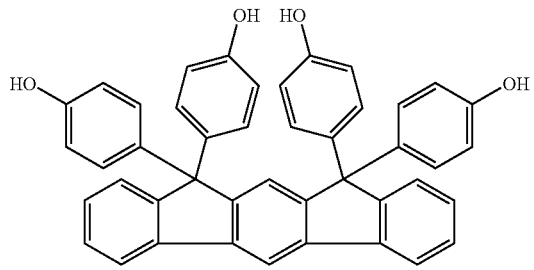

(16-1)

In the same manner as in Synthesis Example 1, 75.2 g/0.8 mol of phenol and 28.2 g/0.1 mol of bifluorenone were allowed to react, to obtain 6.63 g of the aimed compound.

TABLE 1

| Synthesis Example | Compound | Formula C | H | O | Molecular Weight |
|---|---|---|---|---|---|
| 1 | 1-1 | 26 | 24 | 2 | 368.5 |
| 2 | 1-2 | 24 | 20 | 2 | 340.4 |

TABLE 1-continued

| | | | | | |
|---|---|---|---|---|---|
| 3 | 1-3 | 24 | 20 | 4 | 372.4 |
| 4 | 1-4 | 25 | 22 | 2 | 354.4 |
| 5 | 1-5 | 23 | 18 | 2 | 326.4 |
| 6 | 1-6 | 27 | 26 | 2 | 382.5 |
| 7 | 1-7 | 29 | 30 | 2 | 410.6 |
| 8 | 2-1 | 25 | 20 | 2 | 352.4 |
| 9 | 2-2 | 27 | 24 | 2 | 380.5 |
| 10 | 2-3 | 29 | 28 | 2 | 408.5 |
| 11 | 2-4 | 31 | 32 | 2 | 436.6 |
| 12 | 3-1 | 31 | 24 | 2 | 428.5 |
| 13 | 3-2 | 37 | 36 | 2 | 512.7 |
| 14 | 3-3 | 31 | 24 | 2 | 428.5 |
| 15 | 3-4 | 37 | 36 | 2 | 512.7 |
| 16 | 4-1 | 27 | 20 | 2 | 376.5 |
| 17 | 4-2 | 31 | 28 | 2 | 432.6 |
| 18 | 5-1 | 29 | 20 | 2 | 400.5 |
| 19 | 5-2 | 33 | 28 | 2 | 456.6 |
| 20 | 6-1 | 25 | 18 | 2 | 350.4 |
| 21 | 6-2 | 25 | 18 | 4 | 382.4 |
| 22 | 6-3 | 25 | 18 | 6 | 414.4 |
| 23 | 6-4 | 27 | 22 | 2 | 378.5 |
| 24 | 7-1 | 26 | 18 | 3 | 378.4 |
| 25 | 8-1 | 24 | 18 | 2 | 338.4 |
| 26 | 8-2 | 28 | 26 | 2 | 394.5 |
| 27 | 9-1 | 24 | 16 | 3 | 352.4 |
| 28 | 9-2 | 28 | 24 | 3 | 408.5 |
| 29 | 10-1 | 31 | 22 | 2 | 426.5 |
| 30 | 11-1 | 37 | 26 | 2 | 502.6 |
| 31 | 12-1 | 26 | 18 | 3 | 378.4 |
| 32 | 12-2 | 28 | 22 | 3 | 406.5 |
| 33 | 12-3 | 30 | 26 | 3 | 434.5 |
| 34 | 13-1 | 36 | 28 | 4 | 524.6 |
| 35 | 13-2 | 40 | 36 | 4 | 580.7 |
| 36 | 13-3 | 44 | 44 | 4 | 636.8 |
| 37 | 13-4 | 48 | 52 | 4 | 692.9 |
| 38 | 14-1 | 38 | 30 | 4 | 550.6 |
| 39 | 14-2 | 42 | 38 | 4 | 606.8 |
| 40 | 14-3 | 46 | 46 | 4 | 662.9 |
| 41 | 14-4 | 50 | 54 | 4 | 719 |
| 42 | 15-1 | 44 | 34 | 4 | 626.7 |
| 43 | 16-1 | 44 | 30 | 4 | 622.7 |

| Synthesis Example | Calculated | | | Found | | |
|---|---|---|---|---|---|---|
| | C | H | O | C | H | F |
| 1 | 84.75 | 6.57 | 8.68 | 84.71 | 6.55 | 2.17 |
| 2 | 84.68 | 5.92 | 9.40 | 84.62 | 5.90 | 2.09 |
| 3 | 77.40 | 5.41 | 17.18 | 77.50 | 5.45 | 2.40 |
| 4 | 84.72 | 6.26 | 9.03 | 84.70 | 6.25 | 2.13 |
| 5 | 84.64 | 5.56 | 9.80 | 84.60 | 5.57 | 2.05 |
| 6 | 84.78 | 6.85 | 8.37 | 84.75 | 6.83 | 2.20 |
| 7 | 84.84 | 7.37 | 7.79 | 84.86 | 7.35 | 2.26 |
| 8 | 85.20 | 5.72 | 9.08 | 85.22 | 5.70 | 2.04 |
| 9 | 85.23 | 6.36 | 8.41 | 85.20 | 6.34 | 2.12 |
| 10 | 85.26 | 6.91 | 7.83 | 85.24 | 6.90 | 2.19 |
| 11 | 85.28 | 7.39 | 7.33 | 85.26 | 7.35 | 2.24 |
| 12 | 86.89 | 5.65 | 7.47 | 86.88 | 5.67 | 1.97 |
| 13 | 86.68 | 7.08 | 6.24 | 86.70 | 7.10 | 2.14 |
| 14 | 86.89 | 5.65 | 7.47 | 86.94 | 5.63 | 1.97 |
| 15 | 86.68 | 7.08 | 6.24 | 86.66 | 7.07 | 2.14 |
| 16 | 86.14 | 5.36 | 8.50 | 86.14 | 5.38 | 1.96 |
| 17 | 86.08 | 6.52 | 7.40 | 86.09 | 6.54 | 2.10 |
| 18 | 86.98 | 5.03 | 7.99 | 86.99 | 5.05 | 1.89 |
| 19 | 86.81 | 6.18 | 7.01 | 86.82 | 6.20 | 2.03 |
| 20 | 85.69 | 5.18 | 9.13 | 85.69 | 5.20 | 1.96 |
| 21 | 78.52 | 4.74 | 16.74 | 78.52 | 4.77 | 2.24 |
| 22 | 72.46 | 4.38 | 23.16 | 72.44 | 4.39 | 2.58 |
| 23 | 85.69 | 5.86 | 8.45 | 85.66 | 5.87 | 2.04 |
| 24 | 82.52 | 4.79 | 12.68 | 82.50 | 4.77 | 2.04 |
| 25 | 85.18 | 5.36 | 9.46 | 85.17 | 5.39 | 2.00 |
| 26 | 85.25 | 6.64 | 8.11 | 85.24 | 6.66 | 2.15 |
| 27 | 81.80 | 4.58 | 13.62 | 81.83 | 4.55 | 2.05 |
| 28 | 82.33 | 5.92 | 11.75 | 82.34 | 5.90 | 2.20 |
| 29 | 87.30 | 5.20 | 7.50 | 87.35 | 5.18 | 1.90 |
| 30 | 88.42 | 5.21 | 6.37 | 88.40 | 5.20 | 1.86 |
| 31 | 82.52 | 4.79 | 12.68 | 82.50 | 4.75 | 2.04 |
| 32 | 82.74 | 5.46 | 11.81 | 82.76 | 5.44 | 2.12 |
| 33 | 82.92 | 6.03 | 11.05 | 82.90 | 6.00 | 2.19 |

TABLE 1-continued

| | | | | | | |
|---|---|---|---|---|---|---|
| 34 | 82.42 | 5.38 | 12.20 | 82.45 | 5.35 | 2.13 |
| 35 | 82.73 | 6.25 | 11.02 | 82.74 | 6.24 | 2.22 |
| 36 | 82.99 | 6.96 | 10.05 | 82.94 | 6.95 | 2.30 |
| 37 | 83.20 | 7.56 | 9.24 | 83.24 | 7.55 | 2.36 |
| 38 | 82.89 | 5.49 | 11.62 | 82.88 | 5.46 | 2.12 |
| 39 | 83.14 | 6.31 | 10.55 | 83.15 | 6.30 | 2.21 |
| 40 | 83.35 | 6.99 | 9.65 | 83.36 | 6.95 | 2.29 |
| 41 | 83.53 | 7.57 | 8.90 | 83.57 | 7.55 | 2.35 |
| 42 | 84.32 | 5.47 | 10.21 | 84.31 | 5.44 | 2.05 |
| 43 | 84.87 | 4.86 | 10.28 | 84.89 | 4.83 | 1.95 |

TABLE 2

| Synthesis Example | Compound | $^1$H-NMR |
|---|---|---|
| 1 | 1-1 | 9.1(2H, br), 7.8-6.8(13H, m), 2.1(9H, d) |
| 2 | 1-2 | 9.1(2H, br), 7.9-6.8(15H, m), 2.1(3H, s) |
| 3 | 1-3 | 9.1(4H, br), 7.8-6.7(13H, m), 2.1(3H, s) |
| 4 | 1-4 | 9.1(2H, br), 7.9-6.8(13H, m), 5.4(1H, s), 2.1(6H, s) |
| 5 | 1-5 | 9.1(2H, br), 7.8-6.8(15H, m), 5.3(1H, s) |
| 6 | 1-6 | 9.1(2H, br), 7.9-6.8(11H, m), 5.4(1H, s), |
| 7 | 1-7 | 9.1(2H, br), 7.8-6.9(9H, m), 5.3(1H, s), 2.1(18H, d) |
| 8 | 2-1 | 9.1(2H, br), 7.6-7.0(17H, m), 5.4(1H, s) |
| 9 | 2-2 | 9.1(2H, br), 7.6-7.1(15H, m), 5.4(1H, s), 2.1(6H, s) |
| 10 | 2-3 | 9.1(2H, br), 7.6-7.0(13H, m), 5.4(1H, s), |
| 11 | 2-4 | 9.1(2H, br), 7.7-7.0(11H, m), 5.4(1H, s), |
| 12 | 3-1 | 9.1(2H, br), 7.6-7.0(21H, m), 5.3(1H, s) |
| 13 | 3-2 | 9.0(2H, br), 7.6-6.9(15H, m), 5.4(1H, s), |
| 14 | 3-3 | 9.1(2H, br), 7.6-7.0(21H, m), 5.3(1H, s) |
| 15 | 3-4 | 9.0(2H, br), 7.6-7.0(15H, m), 5.4(1H, s), |
| 16 | 4-1 | 9.0(2H, br), 7.6-7.0(17H, m), 5.4(1H, s) |
| 17 | 4-2 | 9.1(2H, br), 7.6-7.0(13H, m), 5.4(1H, s), |
| 18 | 5-1 | 9.1(2H, br), 7.6-7.0(17H, m), 5.3(1H, s) |
| 19 | 5-2 | 9.2(2H, br), 7.7-7.1(13H, m), 5.4(1H, s), |
| 20 | 6-1 | 9.1(2H, br), 8.0-7.0(14H, m) |
| 21 | 6-2 | 9.1(4H, br), 7.9-7.0(12H, m) |
| 22 | 6-3 | 9.1(6H, br), 8.0-6.9(10H, m) |
| 23 | 6-4 | 9.1(2H, br), 8.0-7.0(12H, m), 2.1(6H, s) |
| 24 | 7-1 | 9.1(2H, br), 7.9-7.0(14H, m) |
| 25 | 8-1 | 9.0(2H, br), 8.0-7.0(14H, m), 4.0(2H, s) |
| 26 | 8-2 | 9.1(2H, br), 7.9-7.0(10H, m), 4.0(2H, s), |
| 27 | 9-1 | 9.1(2H, br), 8.0-6.9(14H, m) |
| 28 | 9-2 | 9.0(2H, br), 8.0-7.0(10H, m), 2.0(12H, d) |
| 29 | 10-1 | 9.1(2H, br), 8.0-6.9(20H, m) |
| 30 | 11-1 | 9.1(2H, br), 7.9-7.0(24H, m) |
| 31 | 12-1 | 9.0(2H, br), 8.01-7.0(16H, m) |
| 32 | 12-2 | 9.1(2H, br), 8.0-7.0(14H, m), 2.1(6H, d) |
| 33 | 12-3 | 9.1(2H, br), 8.0-6.9(12H, m), 2.1(12H, d) |
| 34 | 13-1 | 9.0(4H, br), 7.8-6.6(18H, m), 5.6(2H, s) |
| 35 | 13-2 | 9.0(4H, br), 7.7-6.5(16H, m), 5.6(2H, s), |
| 36 | 13-3 | 9.0(4H, br), 7.8-6.5(14H, m), 5.6(2H, s), |
| 37 | 13-4 | 9.0(4H, br), 7.7-6.5(12H, m), 5.6(2H, s), |
| 38 | 14-1 | 9.0(4H, br), 7.7-6.4(20H, m), 5.6(2H, s) |
| 39 | 14-2 | 9.1(4H, br), 7.7-6.5(18H, m), 5.6(2H, s), |
| 40 | 14-3 | 9.0(4H, br), 7.7-6.5(16H, m), 5.6(2H, s), |
| 41 | 14-4 | 9.1(4H, br), 7.7-6.5(14H, m), 5.6(2H, s), |
| 42 | 15-1 | 9.0(4H, br), 7.7-6.5(28H, m), 5.5(2H, s) |
| 43 | 16-1 | 9.1(4H, br), 7.7-6.5(26H, m) |

Examples 1-60 and Comparative Examples 1-6

A homogeneous solution of the resist compound A, acid generator B, acid crosslinking agent C, and solvent each shown in Tables 3-1 and 3-2 was filtered through a Teflon membrane filter having a pore size of 0.2 μm to prepare each resist composition. The resist composition was applied to a silicon wafer by a spin coating method to form a resist film. The film-forming properties of each resist film thus formed are shown in Tables 5-1 and 5-2.

After applying the resist onto a clean silicon wafer by a spin coating method, the applied resist was subjected to pre-exposure baking (PB) in an oven to form a resist film having a thickness of 0.2 μm. The resist film was exposed to i-rays with a wavelength of 365 nm and then subjected to post-exposure baking in an oven (Tables 4-1 and 4-2). The development was performed for 5 s at 23° C. by a standing method using a 2.38% aqueous solution of tetramethylammonium hydroxide. Thereafter, the developed resist film was washed with water for 30 s and dried to form negative resist patterns. Each of the formed resist patterns was evaluated by the following methods. The results are shown in Tables 5-1 and 5-2.

(1) Solubility of Compound in Safety Solvent

Each resist compound A was tested for its solubility in safety solvent at 23° C. The maximum dissolved amount in the solvent selected from propylene glycol monomethyl ether acetate, propylene glycol monomethyl ether, 2-heptanone, anisole, butyl acetate, ethyl propionate, and ethyl lactate was measured, and the solubility was evaluated by the following criteria.

A: dissolved in 1 wt % or more.

B: dissolved in 0.1 wt % or more and less than 1 wt %.

C: not dissolved.

(2) Film-Forming Properties of Resist Composition

Each resist composition was spin-coated on a silicon wafer by using a spin coater to form a resist film, which was heated on a hot plate for 3 min at about 110° C. The appearance of the 10×10 mm square resist film was evaluated by the following criteria.

A: good surface appearance.

C: partially whitened or roughened.

(3) 5 μm L & S of Resist Patterns

The developed resist patterns were observed under an optical microscope to examine whether 5 μm line-and-space patterns were formed. The evaluation was made by the following criteria.

A: formed.

C: not formed.

(4) Etching Resistance

A 5 μm line-and-space pattern was dry-etched with tetrafluoromethane (etching gas) under the conditions of 70 sccm, 50 W, and 20 Pa in an RIE etching machine, to determine the etching rate of the resist pattern. The measured etching rate was compared with the reference etching rate obtained by using polyhydroxystyrene (PHS) as the resist compound.

A: 1/1.3 or less of PHS.

B: 1/1.1 to 1/1.2 of PHS.

C: equal to PHS.

(5) Surface Roughness

A resist film applied on a silicon wafer was immersed in a 2.38% aqueous solution of tetramethylammonium hydroxide at 23° C. by a standing method until the thickness was reduced to half. The resist film was then washed with water for 30 s and dried. The surface of the resist film was observed under a scanning probe microscope. The surface roughness was evaluated by the gravity-mean surface roughness (Rms).

A: Rms<0.5 nm

B: 0.5 nm≦Rms<1.0 nm

C: Rms≧1.0 nm

TABLE 3-1

| Examples | Resist compound A kind | Resist compound A amount (g) | Acid generator B kind | Acid generator B amount (g) | Crosslinking agent C kind | Crosslinking agent C amount (g) |
|---|---|---|---|---|---|---|
| 1 | 1-1 | 0.67 | PAG-1 | 0.01 | C-1 | 0.33 |
| 2 | 1-2 | 0.67 | PAG-1 | 0.01 | C-1 | 0.33 |
| 3 | 1-3 | 0.67 | PAG-1 | 0.01 | C-1 | 0.33 |
| 4 | 1-4 | 0.67 | PAG-1 | 0.01 | C-1 | 0.33 |
| 5 | 1-5 | 0.67 | PAG-1 | 0.01 | C-1 | 0.33 |
| 6 | 1-6 | 0.67 | PAG-1 | 0.01 | C-1 | 0.33 |
| 7 | 1-7 | 0.67 | PAG-1 | 0.01 | C-1 | 0.33 |
| 8 | 2-1 | 0.67 | PAG-1 | 0.01 | C-1 | 0.33 |
| 9 | 2-2 | 0.67 | PAG-1 | 0.01 | C-1 | 0.33 |
| 10 | 2-3 | 0.67 | PAG-1 | 0.01 | C-1 | 0.33 |
| 11 | 2-4 | 0.67 | PAG-1 | 0.01 | C-1 | 0.33 |
| 12 | 3-1 | 0.67 | PAG-1 | 0.01 | C-1 | 0.33 |
| 13 | 3-2 | 0.67 | PAG-1 | 0.01 | C-1 | 0.33 |
| 14 | 3-3 | 0.67 | PAG-1 | 0.01 | C-1 | 0.33 |
| 15 | 3-4 | 0.67 | PAG-1 | 0.01 | C-1 | 0.33 |
| 16 | 4-1 | 0.67 | PAG-1 | 0.01 | C-1 | 0.33 |
| 17 | 4-2 | 0.67 | PAG-1 | 0.01 | C-1 | 0.33 |
| 18 | 5-1 | 0.67 | PAG-1 | 0.01 | C-1 | 0.33 |
| 19 | 5-2 | 0.67 | PAG-1 | 0.01 | C-1 | 0.33 |
| 20 | 6-1 | 0.67 | PAG-1 | 0.01 | C-1 | 0.33 |
| 21 | 6-2 | 0.67 | PAG-1 | 0.01 | C-1 | 0.33 |
| 22 | 6-3 | 0.67 | PAG-1 | 0.01 | C-1 | 0.33 |
| 23 | 6-4 | 0.67 | PAG-1 | 0.01 | C-1 | 0.33 |
| 24 | 7-1 | 0.67 | PAG-1 | 0.01 | C-1 | 0.33 |
| 25 | 8-1 | 0.67 | PAG-1 | 0.01 | C-1 | 0.33 |
| 26 | 8-2 | 0.67 | PAG-1 | 0.01 | C-1 | 0.33 |
| 27 | 9-1 | 0.67 | PAG-1 | 0.01 | C-1 | 0.33 |
| 28 | 9-2 | 0.67 | PAG-1 | 0.01 | C-1 | 0.33 |
| 29 | 10-1 | 0.67 | PAG-1 | 0.01 | C-1 | 0.33 |
| 30 | 11-1 | 0.67 | PAG-1 | 0.01 | C-1 | 0.33 |
| 31 | 12-1 | 0.67 | PAG-1 | 0.01 | C-1 | 0.33 |
| 32 | 12-2 | 0.67 | PAG-1 | 0.01 | C-1 | 0.33 |
| 33 | 12-3 | 0.67 | PAG-1 | 0.01 | C-1 | 0.33 |
| 34 | 13-1 | 0.67 | PAG-1 | 0.01 | C-1 | 0.33 |
| 35 | 13-2 | 0.67 | PAG-1 | 0.01 | C-1 | 0.33 |
| 36 | 13-3 | 0.67 | PAG-1 | 0.01 | C-1 | 0.33 |
| 37 | 13-4 | 0.67 | PAG-1 | 0.01 | C-1 | 0.33 |
| 38 | 14-1 | 0.67 | PAG-1 | 0.01 | C-1 | 0.33 |
| 39 | 14-2 | 0.67 | PAG-1 | 0.01 | C-1 | 0.33 |
| 40 | 14-3 | 0.67 | PAG-1 | 0.01 | C-1 | 0.33 |
| 41 | 14-4 | 0.67 | PAG-1 | 0.01 | C-1 | 0.33 |
| 42 | 15-1 | 0.67 | PAG-1 | 0.01 | C-1 | 0.33 |
| 43 | 16-1 | 0.67 | PAG-1 | 0.01 | C-1 | 0.33 |
| 44 | 9-2 | 0.67 | PAG-2 | 0.01 | C-1 | 0.33 |
| 45 | 9-2/12-3 | 0.34/0.34 | PAG-1 | 0.01 | C-1 | 0.33 |
| 46 | 12-3/13-4 | 0.18/0.49 | PAG-1 | 0.01 | C-1 | 0.33 |
| 47 | 5-2 | 0.67 | PAG-1 | 0.01 | C-1 | 0.33 |
| 48 | 13-4 | 0.67 | PAG-1 | 0.01 | C-1 | 0.33 |
| 49 | 12-3 | 0.67 | PAG-1 | 0.01 | C-1 | 0.33 |
| 50 | 13-3 | 0.67 | PAG-1 | 0.01 | C-1 | 0.33 |
| 51 | 1-2 | 0.67 | PAG-1 | 0.01 | C-2 | 0.33 |
| 52 | 1-6 | 0.67 | PAG-1 | 0.01 | C-3 | 0.33 |
| 53 | 2-1 | 0.67 | PAG-1 | 0.01 | C-1/C-2 | 0.17/0.17 |
| 54 | 4-2 | 0.67 | PAG-1 | 0.01 | C-1 | 0.33 |
| 55 | 5-2 | 0.67 | PAG-1 | 0.01 | C-1 | 0.33 |
| 56 | 4-1 | 0.67 | PAG-1 | 0.01 | C-2 | 0.33 |
| 57 | 8-2 | 0.67 | PAG-1 | 0.01 | C-2 | 0.33 |
| 58 | 9-2 | 0.67 | PAG-1 | 0.01 | C-2 | 0.33 |
| 59 | 10-1 | 0.67 | PAG-1 | 0.01 | C-2 | 0.33 |
| 60 | 12-3 | 0.67 | PAG-3 | 0.01 | C-2 | 0.33 |

| Examples | Additive D kind | Additive D amount (g) | Solvent kind | Solvent amount (g) |
|---|---|---|---|---|
| 1 | — | 0 | S-1 | 1.89 |
| 2 | — | 0 | S-1 | 1.89 |
| 3 | — | 0 | S-1 | 1.89 |
| 4 | — | 0 | S-1 | 1.89 |
| 5 | — | 0 | S-1 | 1.89 |
| 6 | — | 0 | S-1 | 1.89 |
| 7 | — | 0 | S-1 | 1.89 |
| 8 | — | 0 | S-1 | 1.89 |
| 9 | — | 0 | S-1 | 1.89 |
| 10 | — | 0 | S-1 | 1.89 |
| 11 | — | 0 | S-1 | 1.89 |
| 12 | — | 0 | S-1 | 1.89 |
| 13 | — | 0 | S-1 | 1.89 |
| 14 | — | 0 | S-1 | 1.89 |
| 15 | — | 0 | S-1 | 1.89 |
| 16 | — | 0 | S-1 | 1.89 |
| 17 | — | 0 | S-1 | 1.89 |
| 18 | — | 0 | S-1 | 1.89 |
| 19 | — | 0 | S-1 | 1.89 |
| 20 | — | 0 | S-1 | 1.89 |
| 21 | — | 0 | S-1 | 1.89 |
| 22 | — | 0 | S-1 | 1.89 |
| 23 | — | 0 | S-1 | 1.89 |
| 24 | — | 0 | S-1 | 1.89 |
| 25 | — | 0 | S-1 | 1.89 |
| 26 | — | 0 | S-1 | 1.89 |
| 27 | — | 0 | S-1 | 1.89 |
| 28 | — | 0 | S-1 | 1.89 |
| 29 | — | 0 | S-1 | 1.89 |
| 30 | — | 0 | S-1 | 1.89 |
| 31 | — | 0 | S-1 | 1.89 |
| 32 | — | 0 | S-1 | 1.89 |
| 33 | — | 0 | S-1 | 1.89 |
| 34 | — | 0 | S-1 | 1.89 |
| 35 | — | 0 | S-1 | 1.89 |
| 36 | — | 0 | S-1 | 1.89 |
| 37 | — | 0 | S-1 | 1.89 |
| 38 | — | 0 | S-1 | 1.89 |
| 39 | — | 0 | S-1 | 1.89 |
| 40 | — | 0 | S-1 | 1.89 |
| 41 | — | 0 | S-1 | 1.89 |
| 42 | — | 0 | S-1 | 1.89 |
| 43 | — | 0 | S-1 | 1.89 |
| 44 | — | 0 | S-1 | 1.89 |
| 45 | — | 0 | S-1 | 1.89 |
| 46 | — | 0 | S-1 | 1.89 |
| 47 | — | 0 | S-2 | 1.89 |
| 48 | — | 0 | S-4 | 1.89 |
| 49 | — | 0 | S-1/S-5 | 0.54/1.35 |
| 50 | — | 0 | S-2/S-4 | 0.63/1.26 |
| 51 | — | 0 | S-2/S-4 | 0.63/1.26 |
| 52 | — | 0 | S-2 | 1.89 |
| 53 | — | 0 | S-4 | 1.89 |
| 54 | — | 0 | S-4 | 3.89 |
| 55 | — | 0 | S-4 | 0.89 |
| 56 | PHS-1 | 0.18 | S-2/S-4 | 0.63/1.26 |
| 57 | PHS-2 | 0.18 | S-2/S-4 | 0.63/1.26 |
| 58 | PHS-2 | 0.09 | S-2/S-4 | 0.63/1.26 |
| 59 | PHS-2 | 0.05 | S-2/S-4 | 0.63/1.26 |
| 60 | PHS-2 | 0.05 | S-2/S-4 | 0.63/1.26 |

TABLE 3-2

| Comparative examples | Resist compound A kind | Resist compound A amount (g) | Acid generator B kind | Acid generator B amount (g) | Crosslinking agent C kind | Crosslinking agent C amount (g) |
|---|---|---|---|---|---|---|
| 1 | 21-1 | 0.67 | PAG-1 | 0.01 | C-2 | 0.33 |
| 2 | 21-2 | 0.67 | PAG-1 | 0.01 | C-2 | 0.33 |
| 3 | 21-3 | 0.67 | PAG-1 | 0.01 | C-2 | 0.33 |
| 4 | 21-4 | 0.67 | PAG-1 | 0.01 | C-2 | 0.33 |
| 5 | 21-5 | 0.67 | PAG-1 | 0.01 | C-2 | 0.33 |
| 6 | 21-6 | 0.67 | PAG-1 | 0.01 | C-2 | 0.33 |

| Comparative examples | Additive D kind | Additive D amount (g) | Solvent kind | Solvent amount (g) |
|---|---|---|---|---|
| 1 | — | 0 | S-1 | 1.89 |
| 2 | — | 0 | S-1/S-5 | 0.54/1.35 |
| 3 | — | 0 | S-1 | 1.89 |
| 4 | — | 0 | S-1 | 1.89 |

TABLE 3-2-continued
| | | | | |
|---|---|---|---|---|
| 5 | — | 0 | S-1 | 1.89 |
| 6 | — | 0 | S-1 | 1.89 |
Resist Compound A
21-1: Polyhydroxystyrene (Mw=8000) (Kanto Chemical Co., Inc.)
21-2: Polyhydroxystyrene (Mw=12000) (Kanto Chemical Co., Inc.)
21-3: Calix[4]resorcinarene (synthesized by the method described in JP 2002-328473A)
21-4: PH-1 (TPPA 1100-3C, Honshu Chemical Industry Co., Ltd.)
21-5: PH-2 (TPHAP940-P, Honshu Chemical Industry Co., Ltd.)
21-6: PH-3 (synthesized by the method described in JP 2004-334106A)
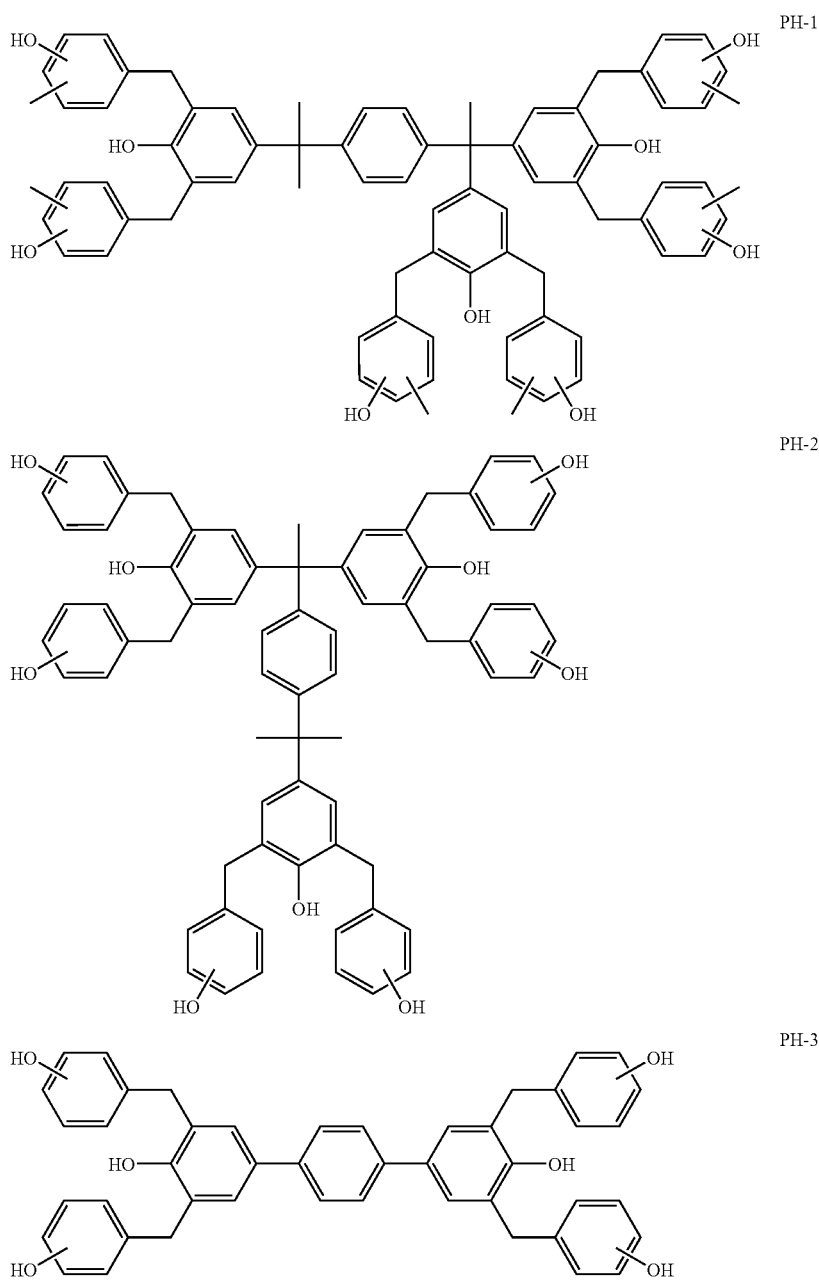

Acid Generator B

PAG-1: Sodium 1,2-naphthoquinone-2-diazide-5-sulfonate (Tokyo Kasei Kogyo Co., Ltd.)

PAG-2: Diphenyliodonium trifluorosulfonate (Midori Kagaku Co., Ltd.)

PAG-3: Diphenylxanthone-2-ylsulfonium hexafluorophosphonate

Crosslinking Agent C

C-1: Nikalac MW-100LM (Sanwa Chemical Co., Ltd.)

C-2: Nikalac N-2702 (Sanwa Chemical Co., Ltd.)

C-3: 2,6-bis(hydroxymethyl)-p-cresol (Tokyo Kasei Kogyo Co., Ltd.)

Additive D

PHS-1: Polyhydroxystyrene (Mw=8000) (Kanto Chemical Co., Inc.)

PHS-2: Polyhydroxystyrene (Mw=12000) (Kanto Chemical Co., Inc.)

Solvent

S-1: Propylene glycol monomethyl ether monoacetate (Tokyo Kasei Kogyo Co., Ltd.)

S-2: Propylene glycol monomethyl ether (Tokyo Kasei Kogyo Co., Ltd.)

S-3: Butyl acetate (Kanto Chemical Co., Inc.)

S-4: Ethyl propionate (Tokyo Kasei Kogyo Co., Ltd.)

S-5: Ethyl lactate (Kanto Chemical Co., Inc.)

TABLE 4-1

| Comparative Examples | Pre-exposure baking (PB) Temperature (°C.) | Time (s) | Exposure (mJ/cm$^2$) | Post-exposure baking Temperature (°C.) | Time (s) |
|---|---|---|---|---|---|
| 1 | 100 | 600 | 4.4 | 120 | 600 |
| 2 | 100 | 600 | 4.4 | 120 | 600 |
| 3 | 100 | 600 | 8.8 | 120 | 600 |
| 4 | 100 | 600 | 4.4 | 120 | 600 |
| 5 | 100 | 600 | 4.4 | 120 | 600 |
| 6 | 100 | 600 | 4.4 | 120 | 600 |
| 7 | 100 | 600 | 4.4 | 120 | 600 |
| 8 | 100 | 600 | 44 | 145 | 600 |
| 9 | 100 | 600 | 44 | 145 | 600 |
| 10 | 100 | 600 | 44 | 145 | 600 |
| 11 | 100 | 600 | 44 | 145 | 600 |
| 12 | 100 | 600 | 22 | 145 | 600 |
| 13 | 100 | 600 | 22 | 145 | 600 |
| 14 | 100 | 600 | 22 | 145 | 600 |
| 15 | 100 | 600 | 22 | 145 | 600 |
| 16 | 100 | 600 | 3.3 | 120 | 600 |
| 17 | 100 | 600 | 3.3 | 120 | 600 |
| 18 | 100 | 600 | 2.2 | 120 | 600 |
| 19 | 100 | 600 | 2.2 | 120 | 600 |
| 20 | 100 | 600 | 44 | 160 | 600 |
| 21 | 100 | 600 | 220 | 160 | 600 |
| 22 | 100 | 600 | 220 | 160 | 600 |
| 23 | 100 | 600 | 44 | 160 | 600 |
| 24 | 100 | 600 | 33 | 160 | 600 |
| 25 | 100 | 600 | 8.8 | 120 | 600 |
| 26 | 100 | 600 | 8.8 | 120 | 600 |
| 27 | 100 | 600 | 8.8 | 120 | 600 |
| 28 | 100 | 600 | 8.8 | 120 | 600 |
| 29 | 100 | 600 | 8.8 | 120 | 600 |
| 30 | 100 | 600 | 8.8 | 120 | 600 |
| 31 | 100 | 600 | 11 | 160 | 600 |
| 32 | 100 | 600 | 11 | 160 | 600 |
| 33 | 100 | 600 | 11 | 160 | 600 |
| 34 | 120 | 600 | 4.4 | 140 | 600 |
| 35 | 120 | 600 | 4.4 | 140 | 600 |
| 36 | 120 | 600 | 4.4 | 140 | 600 |
| 37 | 120 | 600 | 4.4 | 140 | 600 |
| 38 | 120 | 600 | 60 | 165 | 300 |
| 39 | 120 | 600 | 50 | 165 | 300 |
| 40 | 120 | 600 | 50 | 165 | 300 |
| 41 | 120 | 600 | 50 | 165 | 300 |
| 42 | 120 | 600 | 50 | 165 | 300 |
| 43 | 120 | 600 | 50 | 180 | 300 |
| 44 | 100 | 600 | 50 | 160 | 600 |
| 45 | 100 | 600 | 11 | 160 | 600 |
| 46 | 100 | 600 | 7.7 | 120 | 600 |
| 47 | 100 | 600 | 2.2 | 120 | 600 |
| 48 | 120 | 600 | 4.4 | 140 | 600 |
| 49 | 100 | 600 | 11 | 160 | 600 |
| 50 | 120 | 600 | 4.4 | 140 | 600 |
| 51 | 100 | 600 | 4.4 | 120 | 600 |
| 52 | 100 | 600 | 4.4 | 120 | 600 |
| 53 | 100 | 600 | 44 | 145 | 600 |
| 54 | 100 | 600 | 3.3 | 120 | 600 |
| 55 | 100 | 600 | 2.2 | 120 | 600 |
| 56 | 100 | 600 | 3.3 | 120 | 600 |
| 57 | 100 | 600 | 11 | 160 | 600 |
| 58 | 100 | 600 | 11 | 160 | 600 |
| 59 | 100 | 600 | 11 | 160 | 600 |
| 60 | 100 | 600 | 11 | 160 | 600 |

TABLE 4-2

| Comparative Examples | Pre-exposure baking (PB) Temperature (°C.) | Time (s) | Exposure (mJ/cm$^2$) | Post-exposure baking Temperature (°C.) | Time (s) |
|---|---|---|---|---|---|
| 1 | 100 | 600 | 220 | 160 | 600 |
| 2 | 100 | 600 | 220 | 160 | 600 |
| 3 | 100 | 600 | 220 | 160 | 600 |
| 4 | 100 | 600 | 220 | 160 | 600 |
| 5 | 100 | 600 | 220 | 160 | 600 |
| 6 | 100 | 600 | 220 | 160 | 600 |

TABLE 5-1

| Examples | Solubility | Film-forming properties | 5 μm L & S | Etching resistance | Surface roughness |
|---|---|---|---|---|---|
| 1 | A | A | A | A | A |
| 2 | A | A | A | A | A |
| 3 | A | A | A | A | A |
| 4 | A | A | A | A | A |
| 5 | A | A | A | A | A |
| 6 | A | A | A | A | A |
| 7 | A | A | A | A | A |
| 8 | A | A | A | A | A |
| 9 | A | A | A | A | A |
| 10 | A | A | A | A | A |
| 11 | A | A | A | A | A |
| 12 | A | A | A | A | A |
| 13 | A | A | A | A | A |
| 14 | A | A | A | A | A |
| 15 | A | A | A | A | A |
| 16 | A | A | A | A | A |
| 17 | A | A | A | A | A |
| 18 | A | A | A | A | A |

TABLE 5-1-continued

| Examples | Solubility | Film-forming properties | 5 µm L & S | Etching resistance | Surface roughness |
|---|---|---|---|---|---|
| 19 | A | A | A | A | A |
| 20 | A | A | A | A | A |
| 21 | A | A | A | A | A |
| 22 | A | A | A | A | A |
| 23 | A | A | A | A | A |
| 24 | A | A | A | A | A |
| 25 | A | A | A | A | A |
| 26 | A | A | A | A | A |
| 27 | A | A | A | A | A |
| 28 | A | A | A | A | A |
| 29 | A | A | A | A | A |
| 30 | A | A | A | A | A |
| 31 | A | A | A | A | A |
| 32 | A | A | A | A | A |
| 33 | A | A | A | A | A |
| 34 | A | A | A | A | A |
| 35 | A | A | A | A | A |
| 36 | A | A | A | A | A |
| 37 | A | A | A | A | A |
| 38 | A | A | A | A | A |
| 39 | A | A | A | A | A |
| 40 | A | A | A | A | A |
| 41 | A | A | A | A | A |
| 42 | A | A | A | A | A |
| 43 | A | A | A | A | A |
| 44 | A | A | A | A | A |
| 45 | A | A | A | A | A |
| 46 | A | A | A | A | A |
| 47 | A | A | A | A | A |
| 48 | A | A | A | A | A |
| 49 | A | A | A | A | A |
| 50 | A | A | A | A | A |
| 51 | A | A | A | A | A |
| 52 | A | A | A | A | A |
| 53 | A | A | A | A | A |
| 54 | A | A | A | A | A |
| 55 | A | A | A | A | A |
| 56 | A | A | A | A | A |
| 57 | A | A | A | A | A |
| 58 | A | A | A | A | A |
| 59 | A | A | A | A | A |
| 60 | A | A | A | A | A |

TABLE 5-2

| Examples | Solubility | Film-forming properties | 5 µm L & S | Etching resistance | Surface roughness |
|---|---|---|---|---|---|
| 1 | A | A | A | C | C |
| 2 | A | A | A | C | C |
| 3 | A | A | A | C | A |
| 4 | A | A | A | C | A |
| 5 | A | A | A | C | A |
| 6 | A | A | A | B | A |

INDUSTRIAL APPLICABILITY

Since the radiation-sensitive composition of the present invention is highly sensitive, resist patterns with a high resolution can be obtained, to enable the production of highly integrated semiconductor devices with a high productivity.

The invention claimed is:

1. A radiation-sensitive composition containing a resist compound A, an acid generator B, and an acid crosslinking agent C, wherein:

the resist compound A is a polyphenol compound which is produced by the condensation of (i) a $C_{5-45}$ aromatic ketone or aromatic aldehyde, having a conjugated structure which is formed by at least two benzene rings and/or a nonbonding electron pair of hetero atom, with (ii) a $C_{6-15}$ compound having from 1 to 3 phenolic hydroxyl groups but not having the conjugated structure, and has a molecular weight of from 300 to 5000; and the acid generator B directly or indirectly generates an acid upon the irradiation of a radiation selected from the group consisting of visible lights, ultraviolet rays, excimer lasers, electron beams, extreme ultraviolet rays (EUV), X-rays and ion beams.

2. The radiation-sensitive composition according to claim 1, wherein the conjugated structure is at least one structure selected from the group consisting of biphenyl structure, terphenyl structure, naphthalene structure, anthracene structure, phenanthrene structure, pyrene structure, fluorene structure, phenylfluorene structure, diphenylfluorene structure, acenaphthene structure, 1-ketoacenaphthene structure, 9-keto-9,10-dihydrophenanthrene structure, benzophenone structure, xanthene structure, and thioxanthene structure.

3. The radiation-sensitive composition according to claim 1, wherein the conjugated structure is a fused ring.

4. The radiation-sensitive composition according to claim 1, wherein the resist compound A is represented by the following formula 1:

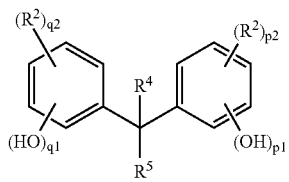

(1)

wherein:

R$^2$ groups may be the same or different and are each independently a group selected from the group consisting of halogen atom, alkyl group, cycloalkyl group, aryl group, aralkyl group, alkoxy group, alkyenyl group, acyl group, alkoxycarbonyloxy group, alkylcarbonyloxy group, arylcarbonyloxy group, cyano group and nitro group;

R$^4$ is a hydrogen atom or $C_{1-6}$ alkyl group, R$^5$ is a $C_{10-18}$ monovalent group having a biphenyl structure, terphenyl structure, naphthalene structure, phenanthrene structure, or pyrene structure; or R$^4$ together with R$^5$ forms a $C_{10-18}$ bivalent group having a fluorene structure, phenylfluorene structure, diphenylfluorene structure, acenaphthene structure, 1-ketoacenaphthene structure, 9-keto-9,10-dihydrophenanthrene structure, or benzophenone structure;

each of p1 and q1 is an integer of from 0 to 3, and each of p2 and q2 is an integer of from 0 to 4, satisfying $1 \leq p1+p2 \leq 5$, $1 \leq q1+q2 \leq 5$, and $1 \leq p1+q1 \leq 6$.

5. The radiation-sensitive composition according to claim 4, wherein R$^5$ in the formula 1 is represented by the following formula:

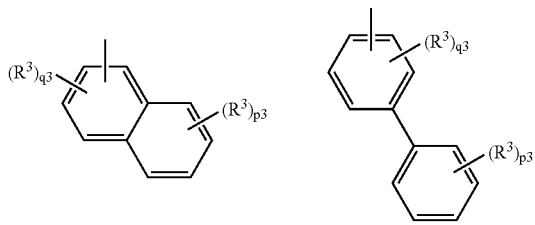

-continued

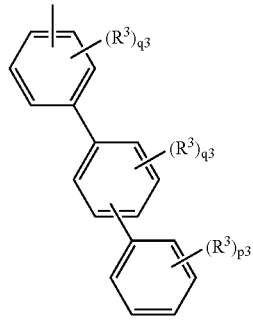

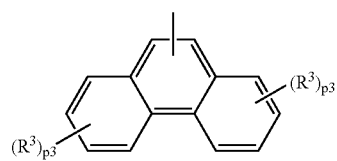

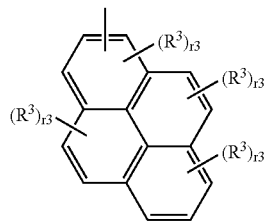

wherein:
$R^3$ is a $C_{1-6}$ alkyl group or $C_{3-12}$ cycloalkyl group;
p3 is an integer of from 0 to 4, q3 is an integer of from 0 to 3, and r3 is an integer of from 0 to 2, satisfying $0 \leq p3+q3 \leq 7$; and
two or more $R^3$, p3, q3, or r3 may be the same or different.

6. The radiation-sensitive composition according to claim 5, wherein the resist compound A is represented by the following formula 5:

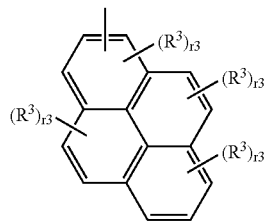

wherein $R^2$ to $R^4$, p1 to p3, q1 to q3, p1+p2, q1+q2, p1+q1, and p3+q3 are the same as defined above.

7. The radiation-sensitive composition according to claim 5, wherein the resist compound A is represented by the following formula 6:

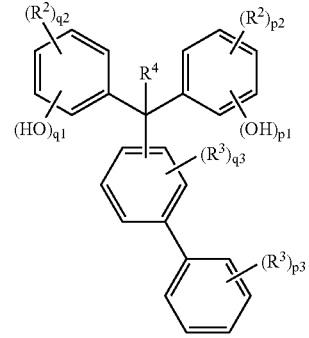

wherein $R^2$ to $R^4$, p1 to p3, q1 to q3, p1+p2, q1+q2, p1+q1, and p3+q3 are the same as defined above.

8. The radiation-sensitive composition according to claim 5, wherein the resist compound A is represented by the following formula 7:

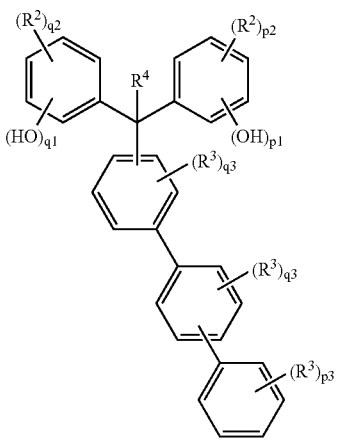

wherein $R^2$ to $R^4$, p1 to p3, q2 to q3, p1+p2, q1+q2, p1+q1, and p3+q3 are the same as defined above.

9. The radiation-sensitive composition according to claim 5, wherein the resist compound A is represented by the following formula 8:

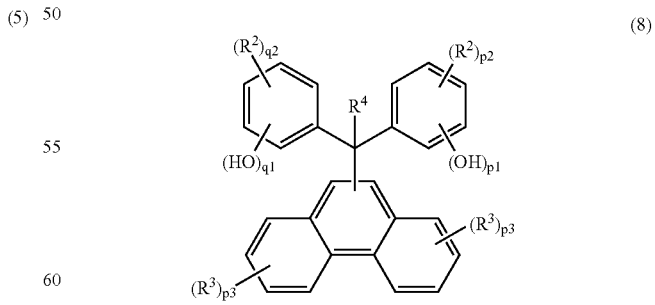

wherein $R^2$ to $R^4$, p1 to p3, q1 to q2, p1+p2, q1+q2, and p1+q1 are the same as defined above.

10. The radiation-sensitive composition according to claim 5, wherein the resist compound A is represented by the following formula 9:

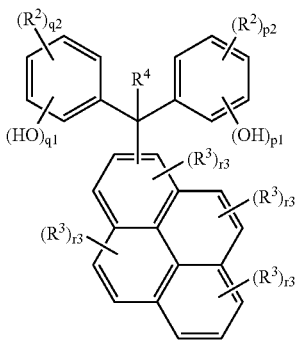
(9)

wherein $R^2$ to $R^4$, p1 to p2, q1 to q2, p1+p2, q1+q2, p1+q1, and r3 are the same as defined above.

11. The radiation-sensitive composition according to claim 4, wherein $R^4$ and $R^5$ are bonded to each other to form a divalent group represented by the following formula:

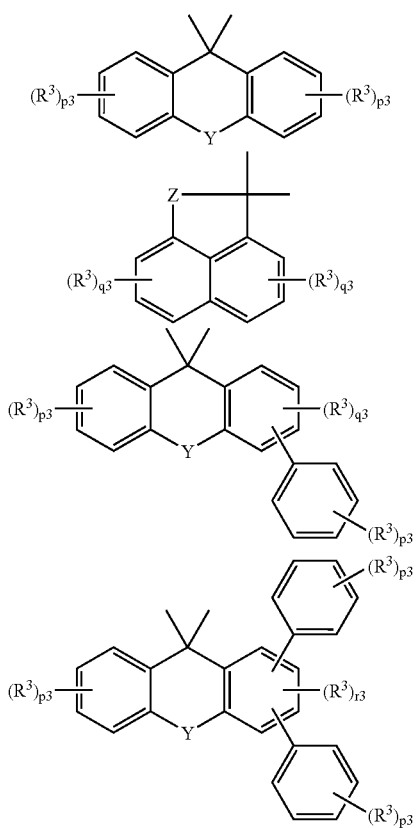

wherein:
R³ is a $C_{1-6}$ alkyl group or $C_{3-12}$ cycloalkyl group;
Y is a single bond or carbonyl group;
Z is a methylene group or carbonyl group;
p3 is an integer of from 0 to 4, q3 is an integer of from 0 to 3, and r3 is an integer of from 0 to 2, satisfying $0 \leqq p3+q3 \leqq 7$; and
two or more R³, p3, or q3 may be the same or different.

12. The radiation-sensitive composition according to claim 11, wherein the resist compound A is represented by the following formula 10:

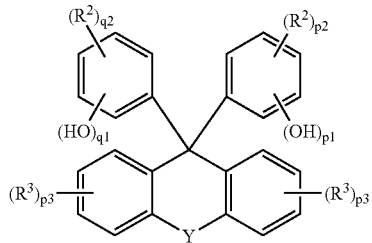
(10)

wherein $R^2$, $R^3$, Y, p1 to p3, q1 to q2, p1+p2, q1l+q2, and p1+q1 are the same as defined above.

13. The radiation-sensitive composition according to claim 11, wherein the resist compound A is represented by the following formula 11:

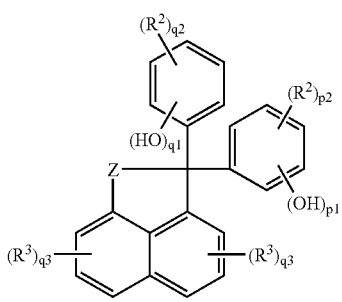
(11)

wherein $R^3$, Z, p1 to p2, q1 to q3, p1+p2, q1+q2, and p1+q1 are the same as defined above.

14. The radiation-sensitive composition according to claim 11, wherein the resist compound A is represented by the following formula 12:

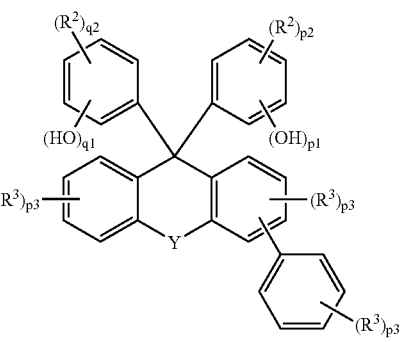
(12)

wherein $R^2$, $R^3$, Y, p1 to p3, q1 to q3, p1+p2, q1+q2, p1+q1, and p3+q3 are the same as defined above.

15. The radiation-sensitive composition according to claim 11, wherein the resist compound A is represented by the following formula 13:

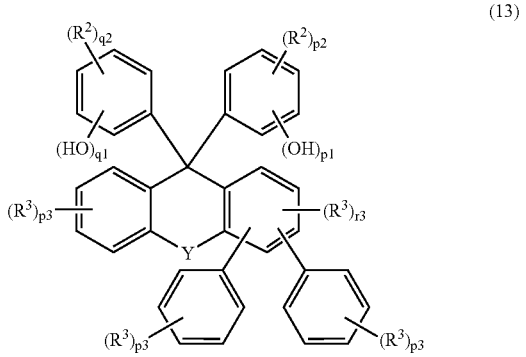

(13)

wherein $R^2$, $R^3$, Y, p1 to p3, q1 to q2, p1+p3, q1+q2, p1+q1, and r3 are the same as defined above.

16. The radiation-sensitive composition according to claim 11, wherein the resist compound A is represented by the following formula 14:

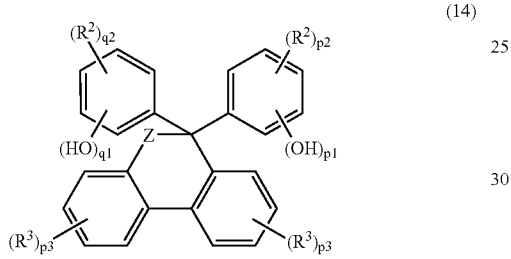

(14)

wherein $R^2$, $R^3$, Z, p1 to p3, q1 to q2, p1+p2, q1+q2, and p1+q1 are the same as defined above.

17. The radiation-sensitive composition according to claim 4, wherein $R^2$ in the resist compound A is a methyl group.

18. The radiation-sensitive composition according to claim 1, wherein the $C_{5-45}$ aromatic ketone or aromatic aldehyde is a diketone or dialdehyde.

19. The radiation-sensitive composition according to claim 1, wherein the resist compound A is represented by the following formula 3:

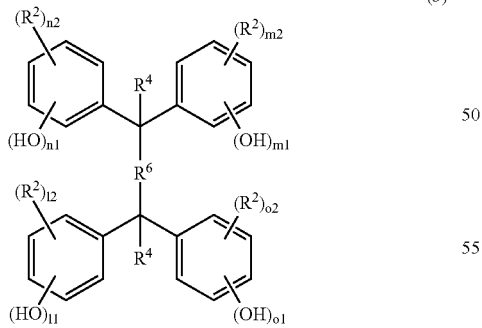

(3)

wherein:
$R^2$ is a group selected from the group consisting of halogen atom, alkyl group, cycloalkyl group, aryl group, aralkyl group, alkoxy group, alkyenyl group, acyl group, alkoxycarbonyloxy group, alkylcarbonyloxy group, arylcarbonyloxy group, cyano group, and nitro group;
$R^4$ is a hydrogen atom or $C_{1-6}$ alkyl group;
$R^6$ is a $C_{10-18}$ monovalent group having a biphenyl structure, terphenyl structure, naphthalene structure, phenanthrene structure, or pyrene structure; or $R^6$ together with two $R^4$ forms a $C_{10-18}$ tetravalent group having a fluorene structure, phenylfluorene structure, diphenylfluorene structure, acenaphthene structure, 1-ketoacenaphthene structure, 9-keto-9,10-dihydrophenanthrene, or benzophenone structure;
each of m1, n1, o1, and l1 is an integer of from 0 to 3, and each of m2, n2, o2, and l2 is an integer of from 0 to 4, satisfying $1 \leq m1+m2 \leq 5$, $1 \leq n1+n2 \leq 5$, $1 \leq o1+o2 \leq 5$, $1 \leq l1+l2 \leq 5$, $1 \leq m1+n1+o1+l1 \leq 6$; and
two or more $R^2$ may be the same or different.

20. The radiation-sensitive composition according to claim 19, wherein $R^6$ in the formula 3 is represented by the following formula:

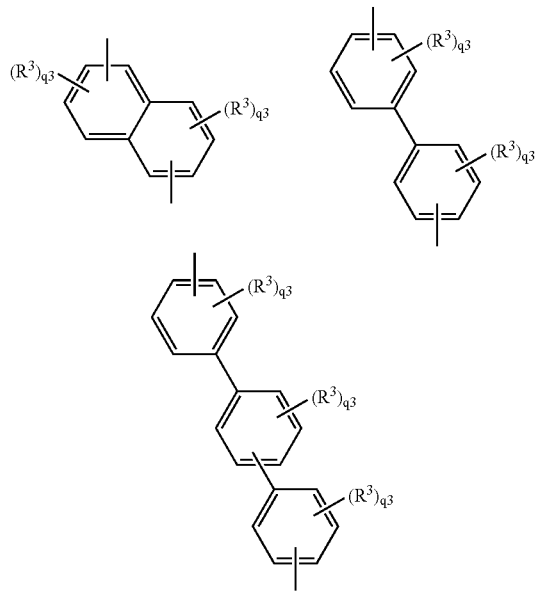

wherein:
$R^3$ is a $C_{1-6}$ alkyl group or $C_{3-12}$ cycloalkyl group;
q3 is an integer of from 0 to 3; and
two or more $R^3$ or q3 may be the same or different.

21. The radiation-sensitive composition according to claim 20, wherein the resist compound A is represented by the following formula 25:

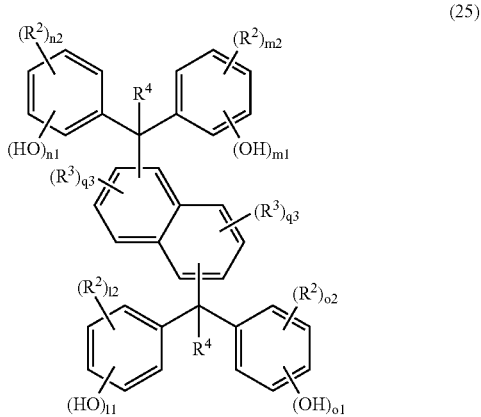

(25)

wherein R² to R⁴, m1, n1, o1, l1, m2, n2, o2, l2, m1+m2, n1+n2, o1+o2, l1+l2, m1+n1+o1+l1, and q3 are the same as defined above.

22. The radiation-sensitive composition according to claim 20, wherein the resist compound A is represented by the following formula 26:

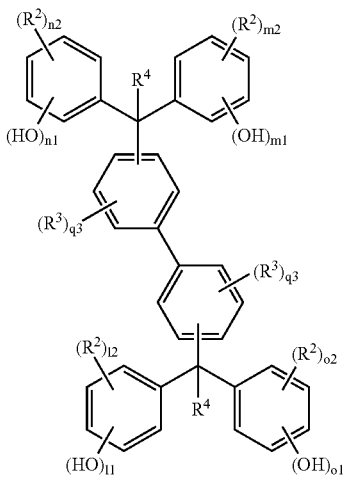
(26)

wherein R² to R⁴, m1, n1, o1, l1, m2, n2, o2, l2, m1+m2, n1+n2, o1+o2, l1+l2, m1+n1+o1+l1, and q3 are the same as defined above.

23. The radiation-sensitive composition according to claim 20, wherein the resist compound A is represented by the following formula 27:

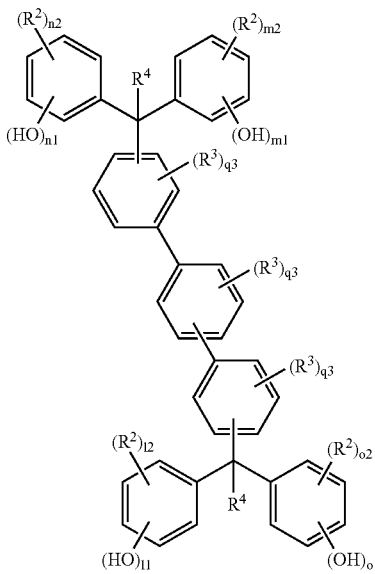
(27)

wherein R² to R⁴, m1, n1, o1, l1, m2, n2, o2, l2, m1+m2, n1+n2, o1+o2, l1+l2, m1+n1+o1+l1, and q3 are the same as defined above.

24. The radiation-sensitive composition according to claim 19, wherein R⁶ in the formula 3, together with two R⁴, forms a tetravalent group represented by the following formula:

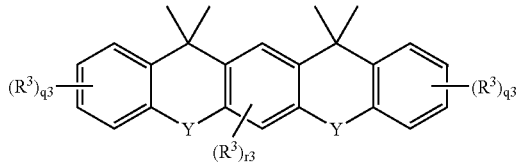

wherein:
R³ is a $C_{1-6}$ alkyl group or $C_{3-12}$ cycloalkyl group;
Y is a single bond or carbonyl group;
q3 is an integer of from 0 to 3, r3 is an integer of from 0 to 2, satisfying $0 \leq q3+r3 \leq 7$; and
two or more R³ or q3 may be the same of different.

25. The radiation-sensitive composition according to claim 24, wherein the resist compound A is represented by the following formula 28:

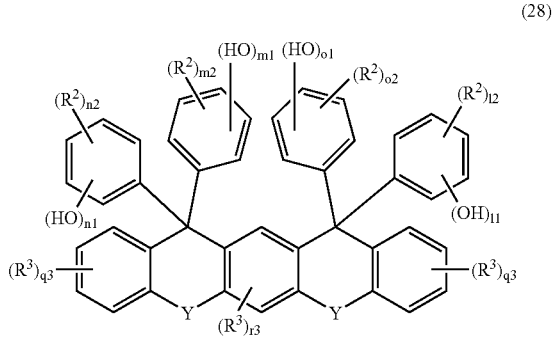
(28)

wherein R², R³, Y, m1, n1, o1, l1, m2, n2, o2, l2, m1+m2, n1+n2, o1+o2, l1+l2, m1+n1+o1+l1, and q3, r3 are the same as defined above.

26. The radiation-sensitive composition according to claim 19, wherein R² in the resist compound A is a methyl group.

27. The radiation-sensitive composition according to claim 1, comprising two or more resist compound A.

28. The radiation-sensitive composition according to claim 1, wherein the acid crosslinking agent C is at least one compound selected from the group consisting of compounds represented by the following formulas 45 to 47:

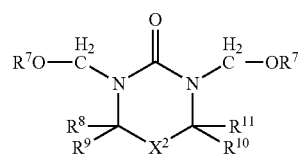
(45)

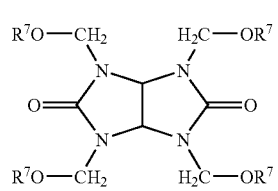
(46)

-continued

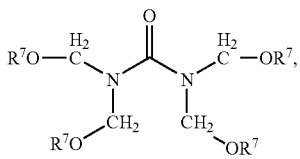
(47)

wherein $R^7$ groups are each independently a hydrogen atom, alkyl group, or acyl group; $R^8$ to $R^{11}$ are each independently a hydrogen atom, hydroxyl group, alkyl group, or alkoxyl group; and $X^2$ is a single bond, methylene group, or oxygen atom, and alkoxymethylated melamine compounds.

29. The radiation-sensitive composition according to claim 1, comprising 1 to 80% by weight of a solid component and 20 to 99% by weight of a solvent component.

30. The radiation-sensitive composition according to claim 29, wherein the solid component comprises 3 to 96.9% by weight of the resist compound A, 0.1 to 30% by weight of the acid generator B, 3 to 65% by weight of the acid crosslinking agent C, and 0 to 93.9% by weight of an optional component D.

31. The radiation-sensitive composition according to claim 29, wherein the solid component comprises 65 to 96.9% by weight of the resist compound A, 0.1 to 30% by weight of the acid generator B, 0.3 to 34.9% by weight of the acid crosslinking agent C, and 0 to 30% by weight of an optional component D.

32. The radiation-sensitive composition according to claim 29, wherein the solid component comprises 65 to 96.9% by weight of the resist compound A, 0.1 to 30% by weight of the acid generator B, and 0.6 to 30% by weight of the acid crosslinking agent C.

33. The radiation-sensitive composition according to claim 1, wherein the resist compound A satisfies:

$$F<3.0$$

wherein F is a ratio of (total number of atoms)/(total number of carbon atoms−total number of oxygen atoms).

34. The radiation-sensitive composition according to claim 1, wherein the resist compound A dissolves in propylene glycol monomethyl ether acetate, propylene glycol monomethyl ether, 2-heptanone, anisole, butyl acetate, ethyl propionate, or ethyl lactate in a concentration of 1% by weight or more at 23° C.

* * * * *